US010211409B2

(12) United States Patent
Molaire

(10) Patent No.: US 10,211,409 B2
(45) Date of Patent: Feb. 19, 2019

(54) NONCRYSTALLIZABLE SENSITIZED LAYERS FOR OLED AND OEDS

(71) Applicant: MOLECULAR GLASSES, INC., Rochester, NY (US)

(72) Inventor: Michel Frantz Molaire, Rochester, NY (US)

(73) Assignee: Molecular Glasses, Inc., Rochester, NY (US)

(*) Notice: Subject to any disclaimer, the term of this patent is extended or adjusted under 35 U.S.C. 154(b) by 0 days.

(21) Appl. No.: 15/115,778

(22) PCT Filed: Feb. 2, 2015

(86) PCT No.: PCT/US2015/014143
§ 371 (c)(1),
(2) Date: Aug. 1, 2016

(87) PCT Pub. No.: WO2015/117100
PCT Pub. Date: Aug. 6, 2015

(65) Prior Publication Data
US 2017/0162795 A1 Jun. 8, 2017

Related U.S. Application Data

(60) Provisional application No. 61/934,805, filed on Feb. 2, 2014.

(51) Int. Cl.
H01L 51/00 (2006.01)
H01L 51/50 (2006.01)
(Continued)

(52) U.S. Cl.
CPC ........ *H01L 51/0072* (2013.01); *C09K 11/025* (2013.01); *C09K 11/06* (2013.01);
(Continued)

(58) Field of Classification Search
CPC ............. H01L 51/0035; H01L 51/0039; H01L 51/0043; H01L 51/0097; H01L 51/0037;
(Continued)

(56) References Cited

U.S. PATENT DOCUMENTS 3,725,070 A 1/1973 Hamb
3,803,096 A 4/1974 Wilson
(Continued)

FOREIGN PATENT DOCUMENTS

| GB | 1507704 | 4/1978 | |
|---|---|---|---|
| WO | 2013156130 | 10/2013 | |
| WO | WO 2013156130 A1 * | 10/2013 | ............. C08G 61/12 |

OTHER PUBLICATIONS

International Search Report and Written Opinion for International Application No. PCT/US2015/014143, dated Feb. 2, 2015.
(Continued)

*Primary Examiner* — Ermias Woldegeorgis
(74) *Attorney, Agent, or Firm* — Dinsmore & Shohl LLP

(57) ABSTRACT

Various embodiments of the present invention provide for a light emitting devices comprising a light emitting layer comprising an electroluminescent organic material dispersed in a matrix, wherein the electroluminescent organic material has a molecular weight less than about 2000 amu, the matrix comprises a nonelectroluminescent-nonpolymeric amorphous glass mixture, and each of the nonelectroluminescent-nonpolymeric organic molecular glass mixture and the electroluminescent organic material constitutes at least 20 percent by weight of the light emitting layer; and electrodes in electrical communication with the light emitting layer and configured to conduct an electric charge through the light emitting layer such that the light emitting layer emits light.

18 Claims, 9 Drawing Sheets

(51) Int. Cl.
   *C09K 11/02* (2006.01)
   *C09K 11/06* (2006.01)
   *H01L 51/56* (2006.01)

(52) U.S. Cl.
   CPC .......... *H01L 51/005* (2013.01); *H01L 51/006* (2013.01); *H01L 51/007* (2013.01); *H01L 51/0052* (2013.01); *H01L 51/0053* (2013.01); *H01L 51/0071* (2013.01); *H01L 51/0073* (2013.01); *H01L 51/5012* (2013.01); *C09K 2211/1007* (2013.01); *C09K 2211/1011* (2013.01); *C09K 2211/1014* (2013.01); *C09K 2211/1037* (2013.01); *C09K 2211/1048* (2013.01); *C09K 2211/1088* (2013.01); *H01L 51/0003* (2013.01); *H01L 51/0005* (2013.01); *H01L 51/0058* (2013.01); *H01L 51/5016* (2013.01); *H01L 51/56* (2013.01); *H01L 2051/0063* (2013.01)

(58) Field of Classification Search
   CPC ............ H01L 51/0073; H01L 51/5012; H01L 51/5056; H01L 51/5072; H01L 51/5088; H01L 51/56; H01L 51/007; H01L 51/0053
   See application file for complete search history.

(56) References Cited

U.S. PATENT DOCUMENTS

| | | | |
|---|---|---|---|
| 3,856,751 A | 12/1974 | Wilson | |
| 3,859,097 A | 1/1975 | Hamb | |
| 3,859,254 A | 1/1975 | Hamb | |
| 3,859,364 A | 1/1975 | Wilson | |
| 3,886,124 A | 5/1975 | Wilson | |
| 3,897,253 A | 7/1975 | Wilson | |
| 3,902,904 A | 9/1975 | Hamb | |
| 3,915,939 A | 10/1975 | Wilson | |
| 4,289,844 A | 9/1981 | Specht | |
| 4,499,165 A | 2/1985 | Molaire | |
| 4,769,292 A | 9/1988 | Tang | |
| 5,116,939 A * | 5/1992 | Fletcher | C08G 73/1067 525/420 |
| 5,121,029 A | 6/1992 | Chishio | |
| 5,247,190 A | 9/1993 | Friend | |
| 5,376,456 A | 12/1994 | Cumming | |
| 5,414,069 A | 5/1995 | Cumming | |
| 5,416,213 A | 5/1995 | Hasegawa | |
| 5,503,910 A | 4/1996 | Matsuura | |
| 5,609,970 A | 3/1997 | Kolb | |
| 5,663,573 A | 9/1997 | Epstein | |
| 5,821,003 A | 10/1998 | Uemura | |
| 5,876,864 A | 3/1999 | Kim | |
| 5,900,327 A | 5/1999 | Pei | |
| 5,928,802 A | 7/1999 | Shi | |
| 5,935,721 A | 8/1999 | Shi | |
| 5,952,778 A | 9/1999 | Haskal | |
| 6,030,550 A | 2/2000 | Angelopoulos | |
| 6,067,186 A | 5/2000 | Dalton | |
| 6,103,446 A | 8/2000 | Devlin | |
| 6,214,481 B1 | 4/2001 | Sakai | |
| 6,255,449 B1 | 7/2001 | Woo | |
| 6,268,695 B1 | 7/2001 | Affinito | |
| 6,277,504 B1 | 8/2001 | Koch | |
| 6,294,273 B1 | 9/2001 | Heuer | |
| 6,303,239 B1 | 10/2001 | Arai | |
| 6,329,082 B1 | 12/2001 | Krreuder | |
| 6,329,086 B1 | 12/2001 | Shi | |
| 6,406,803 B1 | 6/2002 | Abe | |
| 6,818,919 B2 | 11/2004 | Robeson | |
| 7,115,430 B2 | 10/2006 | Robeson | |
| 7,776,500 B2 * | 8/2010 | Molaire | G03G 5/142 430/56 |
| 8,350,470 B2 | 1/2013 | Farquhar | |
| 8,378,293 B1 | 2/2013 | Quimby | |
| 9,815,940 B2 * | 11/2017 | Eckes | C08G 61/10 |
| 2001/0026879 A1 | 10/2001 | Chen | |
| 2004/0056255 A1 * | 3/2004 | Robeson | H01L 51/0035 257/79 |
| 2005/0142380 A1 | 6/2005 | Chin | |
| 2012/0241732 A1 * | 9/2012 | Endo | C09B 57/00 257/40 |
| 2013/0207086 A1 | 8/2013 | Roberts | |
| 2014/0138669 A1 | 5/2014 | Nakagawa | |
| 2014/0145149 A1 | 5/2014 | Lin | |
| 2014/0145151 A1 | 5/2014 | Xia | |

OTHER PUBLICATIONS

Andersson et al., Substituted polythiophenes designed for optoelectronic device and conductors:, J. Mater. Chem., vol. 9, 1933-1940 (1999).
Kocher et al., "Patterning of Oriented Photofunctional Polymer Systems Through Selective Photobleaching", Advanced Functional Materials, vol. 11, No. 1, Feb. 2001, pp. 31-35.
Takeshi Sano et al., "Design of conjugated molecular materials for optoelectronics", J. Mater. Chem., 2000, vol. 10, pp. 157-161.
Nishimoto et al., "A six-carbazole-decorated cyclophosphazene as a host with triplet energy to realize efficient delayed-fluorescence OLEDs", Material Horizons, 2014, vol. 1, pp. 264-269.

* cited by examiner

FIG. 1. Fourth DSC Heat for Mixture N,N'-Di(1-naphthyl)-N,N'-diphenyl-(1,1'-biphenyl)-4,4'-diamine NPB (20 wt%), Coumarin 6 (20 wt%) and Molecular Glass Mixture Example 2 (60%)

FIG. 2. Third DSC Heat for Neat N,N'-Di(1-naphthyl)-N,N'-diphenyl-(1,1'-biphenyl)-4,4'-diamine NPB FIG. 4 Second DSC Heat for Neat 2-(4-tert-Butylphenyl)-5-(4-biphenylyl)-1,3,4-oxadiazole ButylPBD FIG. 6 Third DSC Heat for 50/50 Wt/Wt TAPC and Molecular Glass Mixture Example 1

FIG 7. First DSC Heat for Neat Coumarin 6

NONCRYSTALLIZABLE SENSITIZED LAYERS FOR OLED AND OEDS

This application is the National Stage Filing of International Application No. PCT/US2015/01413, filed Feb. 2, 2015, which is related to and claims benefit if the U.S. Provisional Application No. 61/934,805, filed Feb. 2, 2014, the entirety of each application is incorporated herein by reference for all purposes

TECHNICAL FIELD

This invention relates to organic electroluminescent devices and more specifically to noncrystallizable light-emitting layer compositions.

BACKGROUND ART

Organic Light emitting diode (OLED) and other organic electronic technologies such as organic photovoltaics (OPV) and organic field effect transistors are expected to be a major opportunity for advanced materials development impacting a large number of future technology based applications. These include flat panel displays which offer significant advantages over liquid crystal displays (LCDs) including much lower power requirements, improved definition, broader viewing angles, and faster response times. The technology for OLEDs offers the potential for lower cost lighting sources compared to incandescent lighting as well as fluorescent lighting applications. Inorganic based LEDs are already replacing some of these conventional applications including traffic lighting as well as flashlights offering equal or improved lighting at much lower power requirements.

Small molecule organic light emitting diodes (SMOLEDs) are being commercialized to replace LCD displays based on lower power requirements, faster response times, better definition, and also easier fabrication. Such SMOLEDs are expected to revolutionize the flat panel display technology. Another area receiving considerable interest involves polymeric light emitting diodes (POLEDs) where polymeric light emitting materials can be utilized for flexible organic light emitting diodes (FOLEDs). A significant advantage of polymeric materials involves the fabrication possibilities. FOLEDs offer the potential for ink-jet printing of flat panel displays on flexible substrates such as indium-tin oxide coated polymeric films (i.e. poly(ethylene terephthalate)(PET), oriented polypropylene or polycarbonate). Roll to roll printing processes could also be utilized for FOLEDs. The potential for FOLEDs is considered to be quite large offering unique flat or contoured display panels. These FOLEDs may be of interest for unique lighting applications and large screen displays. These displays would be low cost, easy to install, very thin, and power efficient. An example could be a battery operated TV screen, which would be the thickness of several sheets of paper and capable of folding, at a cost commensurate with the fabrication simplicity. Of course many problems have to be solved before these possibilities become reality.

Development of POLEDs has focused on polymeric materials which exhibit electroluminescence. These materials are generally conjugated polymers, such as poly (phenylene vinylene), polyfluorenes, polyphenylenes, polythiophenes, and combinations of such structures. Conjugated polymers for use in POLEDs are disclosed by a number of references including U.S. Pat. No. 5,247,190 to Friend et al., U.S. Pat. No. 5,900,327 to Pei et al. and Anderson et al., J. Mater Chem., 9, 1933-1940 (1999) which are hereby incorporated by reference in this specification in their entirely.

Variations of conjugated polymers useful for POLEDs include polymers comprised of oligomeric units of conjugated structures coupled into a high molecular weight polymer which are disclosed in U.S. Pat. No. 5,376,456 to Cumming et al., U.S. Pat. No. 5,609,970 to Kolb et al., Pinto et al., Polymer, 41, 2603-2611 (2000) and U.S. Pat. No. 6,030,550 to Angelopoulos et al and the like. The entire disclosure of each of these United States patents is hereby incorporated by reference into this specification.

A large number of low molecular weight compounds are available which exhibit fluorescence and electroluminescence. Some of these materials are commonly referred to as laser dyes. Many of these compounds offer very high fluorescence and thus electroluminescence. However, the properties desired for OLED applications are generally only observed in solution or at low levels of doping in electro-optical or electroactive polymers. In the solid state, these materials can crystallize and lack the mechanical integrity to be utilized in POLEDs or SMOLEDs. Additionally (and more importantly), the excellent fluorescence and electroluminescence is lost with crystallization. These problems have been well documented in various reviews on the subjects of materials for OLEDs. See, e.g., Kelly, "Flat Panel Displays. Advanced Organic Materials." (Royal Society of Chemistry, 2000) at pp. 155 and 177. Consequently, a number of attempts have been made to solve these problems.

For example, U.S. Pat. No. 6,329,082 to Kreuder et al. discloses hetero-spiro compounds suitable for use in OLED devices. The compounds purportedly overcome "the unsatisfactory film-forming properties and . . . pronounced tendency to crystallize" of conventional low molecular weight fluorescent materials.

U.S. Pat. No. 6,214,481 to Sakai et al. purports to address problems with low emission intensity in solution and thermal instability of OLEDs by providing an organic host compound (e.g., distyrylarylene derivatives) for a fluorescent substance, wherein the host compound has a fluorescent quantum efficiency of at least 0.3 in a solid state and a glass transition temperature ($T_g$) of at least 75 degrees Celsius (° C.).

Examples exist where fluorescent dopants are included in electroactive components of OLEDs. See, e.g., Shoustikov et al., IEEE Journal of Selected Topics in Quantum Electronics, Vol. 4, No. 1 (1998), Djurovich et al., Polymer Preprints, 41(1), 770 (2000), Chen et al., Polymer Preprints 41(1), 835 (2000), U.S. Pat. No. 6,303,239 to Arai, U.S. Pat. No. 4,769,292 to Tang et al., U.S. Pat. No. 6,329,086 to Shi et al., U.S. Pat. No. 5,928,802 to Shi et al., and Hu et al., J. Appl. Phys., 83(11) 6002 (1998).

Examples also exist in the literature where fluorescent dyes have been added to non-active polymers for various applications. See, e.g., Quaranta et al., Synthetic Metals, 124, 75-77 (2001), Muller et al., Polymer Preprints, 41(1), 810 (2000), Sisk et al., Chemical Innovation, May 2000, U.S. Pat. No. 6,067,186 to Dalton et al., Kocher et al., Advanced Functional Materials, 11(1), 31 (2001) and U.S. Pat. No. 5,952,778 to Haskal et al.

There are a number of examples in the literature where non-active polymers have been modified by side chain or main chain incorporation of optically active species. See, e.g., Hwang et al., Polymer, 41, 6581-6587 (2000), U.S. Pat. No. 5,414,069 to Cumming et al., U.S. Pat. No. 6,103,446 to Devlin et al., and United States patent application Publication United States 2001/0026879 A1 to Chen et al.

U.S. Pat. No. 6,277,504 to Koch et al. discusses an electroluminescent assembly comprising a component which is a substituted or Unsubstituted 1,3,5-tris (aminophenyl) benzene and a luminescent compound based on substituted metal complexed hydroxyquinoline compounds. The electroluminescent assembly can further comprise a polymeric binder. Similarly, U.S. Pat. No. 6,294,273 to Heuer et al. discloses a polymeric binder for the electroluminescent compound of a metal complex of N-alkyl-2,2'-imino-bis (8-hydroxy-quinoline).

Various references note blends of active electroluminescent polymers for utility in OLED devices offering in many cases improved performance over the individual constituents. See, e.g., Hu et al., J. Appl. Phys., 76(4), 2419 (1994), and Yang et al., Macromol. Symp., 124, 83-87 (1997).

Blends of fluorene-based alternating polymer with nonactive polymers (e.g. PMMA, epoxy resin, polystyrene) are disclosed in U.S. Pat. No. 5,876,864 to Kim et al. U.S. Pat. No. 6,255,449 to Woo et al. notes the utility of blends of specific fluorene containing polymers and a litany of other polymers, including conjugated polymers.

Frederiksen et al., J. Mater. Chem., 4(5), 675-678 (1994) teaches the addition of laser dyes to a polystyrene matrix for use in an OLED device.

U.S. Pat. No. 5,821,003 to Uemura et al. notes the use of polymeric binders for low molecular weight hole transport materials for the hole transport layer of OLED devices. Examples include polysulfone and aromatic tertiary amines. The inclusion of minor amounts of fluorescent compounds in the polymer bound hole transport layer is noted to improve the luminance of blue and white.

U.S. Pat. No. 5,663,573 discloses the use of a variety of organic light emitting materials for preparing a bipolar electroluminescent device, including polypyridines, polypyridylvinylenes, polythiophenes, polyphenylenes, polyphenylenevinylenes, polyphenylenebenzobisthiazoles, polybenzimidazobenzophenanthrolines, polyfluorenes, polyvinylcarbazoles, polynaphthalenevinylenes, polythienylenevinylenes, polyphenyleneacetylenes, polyphenylenediacetylenes and polycyanoterephthalylidenes.

U.S. Pat. Nos. 6,818,919 and 7,115,430 attempt to address this problem by providing a light emitting device comprising:

a light emitting layer comprising an electroluminescent organic material dispersed in a matrix, wherein the electroluminescent organic material has a molecular weight less than about 2000 amu, the matrix comprises a non-electroluminescent organic polymer having a $T_g$ of at least 170° C., and each of the non-electroluminescent organic polymer and the electroluminescent organic material constitutes at least 20 percent by weight of the light emitting layer; and electrodes in electrical communication with the light emitting layer and configured to conduct an electric charge through the light emitting layer such that the light emitting layer emits light.

Further provided is a method for manufacturing a light emitting device, comprising providing the light emitting layer; and providing electrodes in electrical communication with the light emitting layer, wherein the electrodes are configured to conduct an electric charge through the light emitting layer such that the light emitting layer emits light. U.S. Pat. Nos. 6,818,919 and 7,115,430 disclose that in the case of laser dyes one class of low molecular weight electroluminescent materials, the rate of crystallization of the laser dyes ((which characteristically exhibit crystallinity) is dependent upon the $T_g$ of the polymer/electroluminescent material mixture. If the $T_g$ of the polymer/laser dye is exceed, crystallization of the laser dye could occur thus limiting the electroluminescent efficiency of the device. Thus U.S. Pat. Nos. 6,818,919 and 7,115,430 to Robeson et al, claim that high Tg polymers can be utilized to prevent the crystallization of laser dyes even when the laser dye concentration is in excess of 50 wt. % based on the weight of the light emitting film. However, example 20 of U.S. Pat. Nos. 6,818,919 and 7,115,430 (polysulfone/Coumarin 6, 2/1 blend) clearly shows crystallization of the Coumarin 6 on the first and second heating of the differential scanning calorimetry (DSC) results, even in the presence of residual tetrahydrofuran (THF) coating solvent. These results suggest that the amorphous mixture below the $T_9$ of the blend is a "kinetic glass". It is well known by those versed in the art that such glass will eventually crystallize thermodynamically, resulting in performance degradation of the device.

All references cited herein are incorporated herein by reference in their entireties.

There is still a need for a light emitting layer, incorporating the excellent properties of low molecular weight electroluminescent materials such as laser dyes, that is truly noncrystallizable, for use in SMOLED devices, POLED devices, combination SMOLED POLED devices, and FOLED devices.

There is further need for a noncrystallizable light emitting layer that can be coated by spin coating, roll to roll coating, or inkjet and other deposition methods, without much restriction in the coating conditions required to provide solvent-free film required for long-lived and stable devices.

The present invention provides a solution for the above problems.

It is an object of this invention to provide light emitting layers with the many of the advantages illustrated herein.

It is also an object of this invention to provide truly noncrystallizable light emitting layers, containing both low molecular-weight electroluminescent materials such as laser dyes, and low molecular-weight charge transport materials.

It is yet another object of this invention to provide truly noncrystallizable light emitting layers that can be easily coated by fabrication technique selected from the group consisting of spin coating, screen printing, ink jet printing and roll-to-roll printing It is also an object of this invention to provide noncrystallizable sensitized layers for other organic electronic applications such as OPV, OTFT, photochromic devices based on nonpolymeric amorphous glass mixture compositions.

DISCLOSURE OF THE INVENTION

Accordingly, the invention provides a light emitting device comprising: a light emitting layer comprising an electroluminescent organic material dispersed in a matrix, wherein the electroluminescent organic material has molecular weight less than about 2000 atomic mass units (amu), the matrix comprises a non-electroluminescent non-crytstallizable molecular glass mixture, and each of the non-electroluminescent non-crytstallizable molecular glass mixture and the electroluminescent organic material constitutes at least about 20 percent by weight of the light emitting layer; and electrodes in electrical communication with the light emitting layer and configured to conduct an electric charge through the light emitting layer such that the light emitting layer emits light.

Further provided is a method for manufacturing a light emitting device, comprising providing the light emitting layer; and providing electrodes in electrical communication with the light emitting layer, wherein the electrodes are configured to conduct an electric charge through the light emitting layer such that the light emitting layer emits light.

In one embodiment of the present invention the non-electroluminescent non-crystallizable molecular glass mixtures useful as the binders of the emitting layer compositions of this invention are homogeneous mixtures of at least two nonpolymeric, thermoplastic compounds, each compound in the mixture independently conforming to the structure:

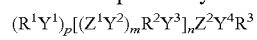

wherein m is zero or one;

n is the number of recurring units in the compound, and is zero up to, but not including, an integer at which said compound starts to become a polymer;

p is an integer of from one to eight;

each $R^1$ and $R^3$ is independently a monovalent aliphatic or cycloaliphatic hydrocarbon group having 1 to 20 carbon atoms, an aromatic group or a multicyclic aromatic nucleus;

$R^2$, $Z^1$ and $Z^2$ each independently represent multivalent aliphatic or cycloaliphatic hydrocarbon groups having 1 to 20 carbon atoms or an aromatic group; and $Y^1$, $Y^2$, $Y^3$ and $Y^4$ each independently represents one or more linking groups such as esters (—COO—), amides (—CONH—), urethanes (—NHCOO—), imides

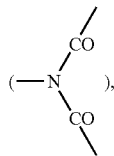

and nitrilomethyleneoxys

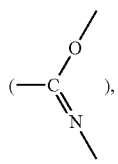

nitritomethyleneiminos

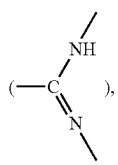

nitrilomethylenethios

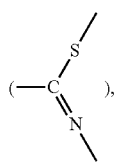

1,3,4-triazol-2,5-ylenes

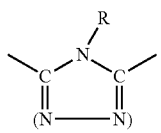

wherein R represents alkyl of 1-6 carbon atoms, hydroxyl, amino or aryl such as phenyl and 1,3,4-oxadiazol-2,5-ylenes

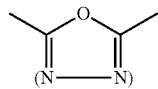

provided that at least one of $R^1$, $Z^1$, $R^2$, $R^3$ and $Z^2$ is an aromatic group and the glass transition temperature (Tg) of the mixture is above 50° C.

In a second embodiment of the invention, the non-electroluminescent non-crystallizable molecular glass mixtures useful as the binders of the emitting layer compositions of this invention are homogeneous mixtures of at least two nonpolymeric, thermoplastic compounds, each compound in the mixture independently conforming to the structure:

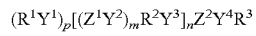

wherein m is zero or one;

n is the number of recurring units in the compound, and is zero up to, but not including, an integer at which said compound starts to become a polymer;

p is an integer of from one to eight;

each $R^1$ and $R^3$ is independently a monovalent aliphatic or cycloaliphatic hydrocarbon group having 1 to 20 carbon atoms, an aromatic group or a multicyclic aromatic nucleus;

$R^2$, $Z^1$ and $Z^2$ each independently represent multivalent aliphatic or cycloaliphatic hydrocarbon groups having 1 to 20 carbon atoms or an aromatic group; and $Y^1$, $Y^2$, $Y^3$ and $Y^4$ each independently represents a triple bond, a double bond, or a single bond link; provided that the glass transition temperature ($T_g$) of the mixture is above 20° C. These non-electroluminescent molecular glass mixtures are made via coupling reactions as described in application U.S. 61/919,252 filed Mar. 25, 2014 by Molaire incorporated by reference in its entirety.

BRIEF DESCRIPTION OF THE DRAWINGS

The invention will be described in more details by reference to the drawings, of which

BEST MODE FOR CARRYING OUT THE INVENTION

Figure 1:
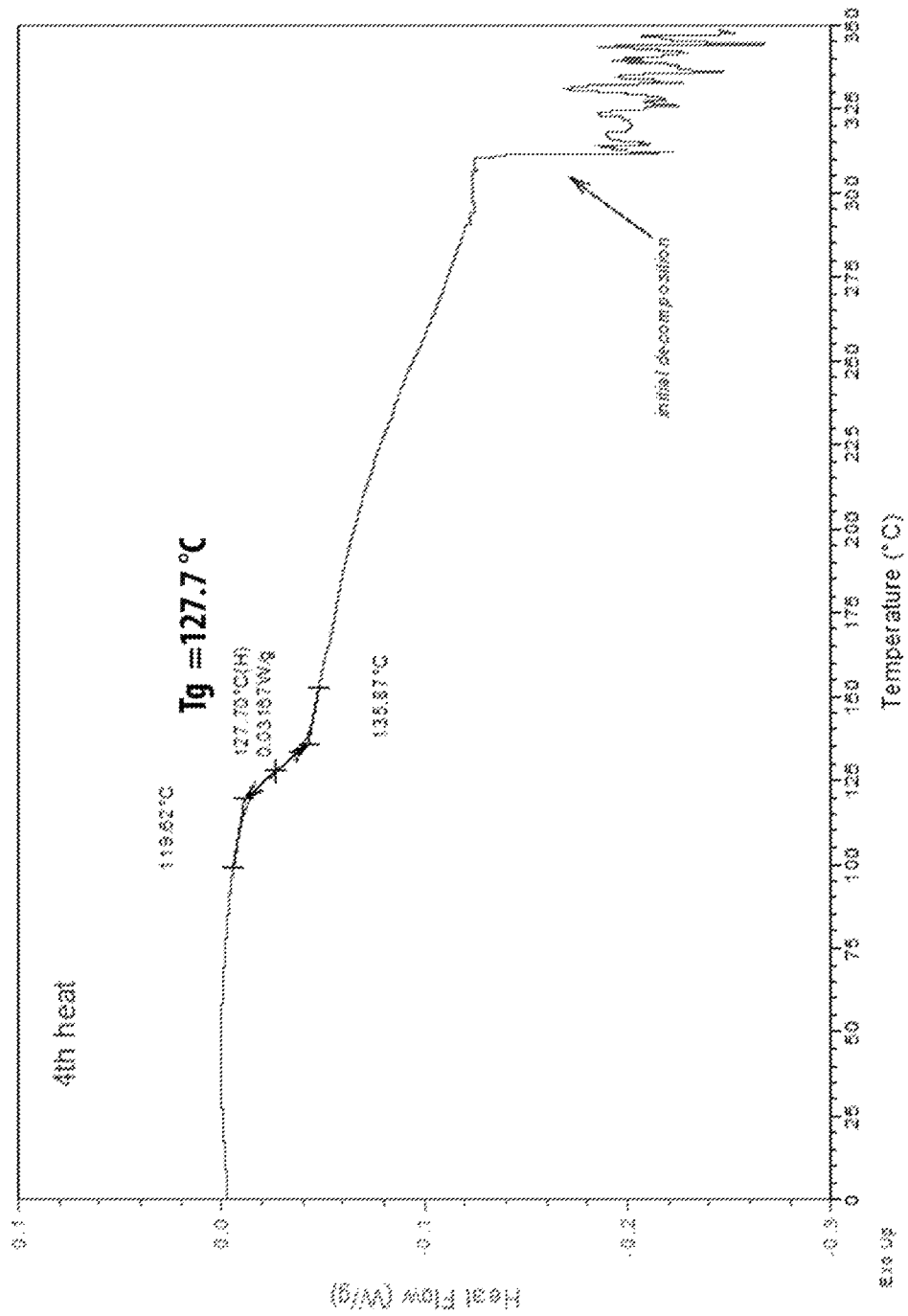
FIG. 1 is to illustrate the fourth DSC heat for a mixture of Molecular Glass Mixture Example 2 (60 wt %), Coumarin 6 (20 wt %) and N,N'-Di(1-naphthyl)-N,N'-diphenyl-(1,1'-biphenyl)-4,4'-diamine (NPB) (20 wt %)

Various embodiments of the present invention provide for a light emitting device. The various embodiments used to describe the principles of the present invention are by way of illustration only and should not be construed in any way to limit the scope of the invention. Those skilled in the art will understand that the principles of the present invention may be implemented in any suitably arranged device.

DEFINITIONS OF TERMS USED IN THIS APPLICATION

Throughout this document, the following terms will have the following meanings.

The term "amorphous" means that the mixture is non-crystalline. That is, the mixture has no molecular lattice structure.

A "non-equilibrium molecular glass" is a glass forming material that is crystallizable under certain conditions, for example above their glass transition temperature, or in contact with certain solvents.

A "non-crystallizable molecular glass" will never crystallize under any circumstances and is always amorphous.

An "asymmetric glass mixture" is a glass mixture where all the components are asymmetric, i.e. have all distinct substituents.

A "multicyclic aromatic nucleus" is a nucleus comprising at least two cyclic groups one of which is aromatic, including aromatic heterocyclic ring groups. The cyclic groups may be substituted with substituents such as aliphatic hydrocarbons, including cycloaliphatic hydrocarbons, other aromatic ring groups such as aryl, and heterocyclic ring groups such as substituted or fused thiazole, oxazole, imide, pyrazole, triazole, oxadiazole, pyridine, pyrimidine, pyrazine, triazine, tetrazine, quinoline groups, and the like. The substituents are fused or non-fused and mono or polycyclic. Examples of multicyclic aromatic nuclei include 9,9-bis(4-hydroxy-3,5-dichlorophenyl)fluorene, 4,4'-hexahydro-4,7-methanoindan-5-ylidenebis(2,6-dichlorophenol); 9,9-bis(4-hydroxy-3,5-dibromophenyl(fluorene, 4,4'-hexahydro-4,7-methanoindan-5-ylidenebis(2,6-dibromophenol); 3',3",5', 5"-tetrabromophenolphthalein, 9,9-bis(4-aminophenyl) fluorene, phenylindandiols; 1,1'-spirobiindandiols, 1,1'-spirobiindandiamines, 2,2'-spirobichromans; 7,7-dimethyl-7H-dibenzo[c,h]xanthenediol; xanthylium salt diols; 9,9-dimethylxanthene-3,6-bis(oxyacetic acids); 4,4'(3-phenyl-1-indanylidene)diphenol and other bisphenols; 3',3"-dibromo-5',5"-dinitro-2',2"-oxaphenolphthalein; 9-phenyl-3-oxo-2,6,7-trihydroxyxanthene; and the like.

"Aliphatic hydrocarbon group" refers to monovalent or divalent, alkanes, alkenes, alkadienes and alkynes having from 1 to 20 carbon atoms. The groups are straight or branched chain and include carbohydrate, carboxylic acid, alcohol, ether aldehyde, and ketone functions.

"Cycloaliphatic" refers to cyclic aliphatic hydrocarbon groups. The groups may be substituted with halogen, alkoxy, amide, nitro, esters, and aromatic groups.

Exemplary aliphatic groups include methyl, ethyl, propyl, isopropyl, butyl, hexyl, 2-ethylhexyl, methoxyethyl, ethoxycarbonylpropyl, 3-oxobutyl, 3-thiapentyl, furfuryl, 2-thiazolylmethyl, cyclohexylmethyl, benzyl, phenethyl, phenoxyethyl, vinyl (—CH.CH—), 2-methylvinyl, allyl, allylidene, butadienyl, butenylidene, propargyl, and the like.

"Aromatic" and "aromatic heterocyclic" group refers to organic groups which undergo the same type of substitution reaction as benzene. In benzene, substitution reactions are preferred over addition reactions. Such groups preferably have from 6 to about 40 nuclear atoms and are mono- and polycyclic.

Exemplary aromatic groups include quinolinyl, pyrimidinyl, pyridyl, phenyl, tolyl, xylyl, naphthyl, anthryl, triptycenyl, p-chlorophenyl, p-nitrophenyl, p-bromophenyl, 2,4-dichlorophenyl, 2-chlorophenyl, 3,5-dinitrophenyl, p-(tetrabromophthalimido)phenyl, p-(tetrachlorophthalimido)phenyl, p-tetraphenylphthalimido)phenyl, p-naphthalimidophenyl, p-(4-nitrophthalimido)phenyl, p-phthalimidophenyl, 1-hydroxy-2-naphthyl, 3,5-dibromo-4-(4-bromobenzoyloxy)phenyl, 3,5-dibromo-4-(3,5-dinitrobenzoyloxy)phenyl, 3,5-dibromo-4-(1-naphthoyloxy) phenyl, thiazolyl, oxazolyl, imidazolyl, pyrazolyl, triazolyl, oxadiazolyl, pyrazinyl, etc and their corresponding multivalent and fused ring configurations.

"Green solvents" are non-toxic and benign to environment. A good guide of green solvents can be found in "Green chemistry tools to influence a medicinal chemistry and research chemistry based organization by K. Alfonsi, et al, Green Chem., 2008, 10, 31-36, DOI: 10.1039/b711717e. A list of "preferred", "usable", and "undesirable" solvents are shown in Table 1. The preferred solvents are considered "greener". The undesirable solvents are to be avoided.

TABLE 1

| Preferred | Usable | Unudesirable |
| --- | --- | --- |
| Water | cyclohexane | pentane |
| acetone | methylcyclohexane | hexane |
| ethanol | toluene | di-isopropyl ether |
| 2-propanol | heptane | diethyl ether |
| 1-propanol | acetonitrile | dichloromethane |
| ethyl acetate | 2-methyltetrahydrofuran | dichloroethane |
| isopropyl acetate | tetrahydrofuran | dimethyl formamide |
| methanol | xylenes | N-methylpyrrolidone |
| 1-butanol | dimethylsulfoxide | pyridine |
| t-butanol | acetic acis | dimetyl acetamide |
|  | ethylene glycol | diaxane |
|  |  | dimetoxyethane |
|  |  | benzene |
|  |  | carbon tetrachloride |

An "electronic device" is any device that uses electrons in its function, input, or output. A photonic device is any device that uses photons in its function, input or output.

The present invention provides for a light emitting device comprising a light emitting layer comprising an electroluminescent organic material dispersed in a matrix, wherein the electroluminescent organic material has a molecular weight less than about 2000 amu, the matrix comprises a nonelectroluminescent-nonpolymeric amorphous glass mixture, and each of the nonelectroluminescent-nonpolymeric organic molecular glass mixture and the electroluminescent organic material constitutes at least 20 percent by weight of the light emitting layer; and electrodes in electrical communication with the light emitting layer and configured to conduct an electric charge through the light emitting layer such that the light emitting layer emits light.

The noncrystallizable light emitting layer of the present invention employs as the binder certain mixtures of compounds disclosed in U.S. Pat. No. 4,499,165 to Molaire, although that reference discloses the use of the mixtures in optical recording layers and elements. No suggestion is made of the amenability of the mixtures to light emitting applications.

Specifically, the nonpolymeric, amorphous mixtures of compounds useful as the binders of the emitting layer compositions of this invention are homogeneous mixtures of at least two nonpolymeric, thermoplastic compounds, each compound in the mixture independently conforming to the structure: $(R^1Y^1)_p[(Z^1Y^2)_m R^2Y^3]_n Z^2Y^4R^3$ wherein m is zero or one;

n is the number of recurring units in the compound, and is zero up to, but not including, an integer at which said compound starts to become a polymer;

p is an integer of from one to eight;

each $R^1$ and $R^3$ is independently a monovalent aliphatic or cycloaliphatic hydrocarbon group having 1 to 20 carbon atoms, an aromatic group or a multicyclic aromatic nucleus;

$R^2$, $Z^1$ and $Z^2$ each independently represent multivalent aliphatic or cycloaliphatic hydrocarbon groups having 1 to 20 carbon atoms or an aromatic group; and $Y^1$, $Y^2$, $Y^3$ and $Y^4$ each independently represents one or more linking groups such as esters (—COO—), amides (—CONH—), urethanes (—NHCOO—), imides

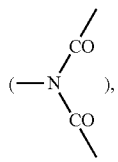

nitrilomethyleneoxys

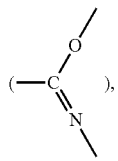

nitrilomethyleneiminos

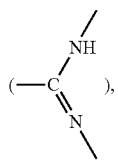

nitritomethytenethios

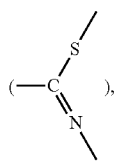

1,3,4-triazol-2,5-ylenes

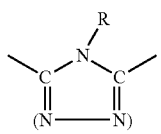

wherein R represents alkyl of 1-6 carbon atoms, hydroxyl, amino or aryl such as phenyl and 1,3,4-oxadiazol-2,5-ylenes

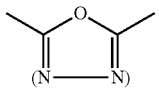

provided that at least one of $R^1$, $R^2$, $R^3$ and $Z^2$ is an aromatic group and the glass transition temperature (Tg) of the mixture is above 50° C.

In the structural formula, the expression "$[(Z^1Y^2)_m R^2Y^3]_n$" describes nonpolymeric compounds which are oligomers. Oligomers are usually formed when either $Z^1$ or $R^2$ are at least bivalent. The $(Z^1Y^2)_m$ moiety describes oligomers in which $Z^1$ repeats itself such as when $Z^1$ is derived from p-hydroxybenzoic acid. When n is one or more, p in the structural formula is preferably one to avoid significant crosslinking of the compound due to the multivalent nature of $Z^1$. However, some crosslinking can be tolerated in binder-mixtures for light emitting diode applications.

In general, the higher the $T_g$ of the molecular glass the better, but it should be high enough to provide a light emitting layer with suitable storage stability.

"Aliphatic hydrocarbon group" for $R^1$, $R^2$, $R^3$, $Z^1$ and $Z^2$ refers to monovalent or divalent, alkanes, alkenes, alkadienes and alkynes having from 1 to 20 carbon atoms. The groups are straight or branched chain and include carbohydrate, carboxylic acid, alcohol, ether, aldehyde and ketone functions. "Cycloaliphatic" refers to cyclic aliphatic hydrocarbon groups. The groups may be substituted with halogen, alkoxy, amide, nitro, ester and aromatic groups.

Although the compounds in the mixture are non-polymeric, compounds which are oligomers are included in the mixtures. The nonpolymeric compounds in the mixtures of the invention are distinguished from polymers according to the following relationship.

The qualitative relationship between a plot of the logarithmic viscosity (log q) to the logarithmic molecular weight (log MW) of a compound is linear. At a critical molecular weight (MWc) or critical viscosity ($\mu_c$) the slope of a curve illustrating that relationship changes sharply, for example, from about 1 to about 3.4. Above MWc or $\eta_c$ the compound is polymeric. Below MWc or $\eta_c$, the compound is a monomer or an oligomer and is within the scope of this invention. MWc and $\eta_c$ is not fixed, and varies with the structure of the particular compound. See Fundamental Principles of Polymeric Materials for Practicing Engineers by Stephen L. Rosen, Barnes and Noble, Inc., N.Y., N.Y., (1971), pages 176 and 177. In general, it is believed that compounds having a molecular weight up to about 5000 or up to about 10 recurring units are useful in the mixtures of this invention, although it is expected that compounds having a molecular weight greater than 5000 or more than 10 recurring units will in some circumstances be operable.

In another embodiment of the present invention, the nonpolymeric, amorphous mixtures of compounds useful as the binders of the electroluminescent layer of this invention are homogenous mixtures of at least two nonpolymeric, thermoplastic compounds, each compound in the mixture independently conforming to the structure:

$Z(Y—R)_n$ wherein n is two to eight;

Z is a straight or branched chain, substituted or unsubstituted aliphatic group optionally having hetero atom groups in or appended thereto, or a substituted or unsubstituted homo- or heterocyclic, mono- or polycyclic group;

each R group independently from the other R groups, is a straight or branched chain, substituted or unsubstituted aliphatic group optionally having hetero atom groups in or appended thereto, or a substituted or unsubstituted homo- or heterocyclic, mono- or polycyclic group;

each Y, which may be the same or different from the other Y groups, is an ester, amide, imide or urethane linkage joining the nucleus Z to an appended group R;

provided that at least one Z or R group is an aromatic group, the mixture comprises at least two different R groups and the Tg of the mixture ranges from 50° to 120° C.

For the nucleus Z, "aliphatic group" refers to divalent or multivalent alkanes, alkenes, alkadienes and alkynes having from 1 to 20 carbons. The groups are straight or branched chain and include carbohydrate, carboxylic acid, alcohol, ether, aldehyde and ketone functions. The groups may be substituted with halogen, alkoxy, amide, nitro, ester and aromatic groups. Monovalent versions of the same types of aliphatic groups are suitable R groups.

Exemplary aliphatic groups include methyl, ethyl, propyl, isopropyl, butyl, hexyl, 2-ethylhexyl, methoxyethyl, ethoxycarbonylpropyl, 3-oxobutyl, 3-thiapentyl, furfuryl, 2-thiazolylmethyl, cyclohexylmethyl, benzyl, phenethyl, phenoxyethyl, vinyl (—CH☐CH—), 2-methylvinyl, allyl, allylidene, butadienyl, butenylidene, propargyl, and the like. "Aromatic" and "aromatic heterocyclic" group refer to organic groups which undergo the same type of substitution reaction as benzene. In benzene, substitution reactions are preferred over addition reactions. Such groups preferably have from 6 to about 40 nuclear atoms and are mono- and polycyclic.

Exemplary aromatic groups include quinolinyl, pyrimidinyl, pyridyl, phenyl, tolyl, xylyl, naphthyl, anthryl, triptycenyl, p-chlorophenyl, p-nitrophenyl, p-bromophenyl, 2,4-dichlorophenyl, 2-chlorophenyl, 3,5-dinitrophenyl, p-(tetrabromophthalimido)phenyl, p-(tetrachlorophthalimido)phenyl, p-tetraphenylphthalimido)phenyl, p-naphthalimidophenyl, p-(4-nitrophthalimido)phenyl, p-phthalimidophenyl, 1-hydroxy-2-naphthyl, 3,5-dibromo-4-(4-bromobenzoyloxy)phenyl, 3,5-dibromo-4-(3,5-dinitrobenzoyloxy)phenyl, 3,5-dibromo-4(1-naphthoyloxy) phenyl, thiazolyl, oxazolyl, imidazolyl, pyrazolyl, triazolyl, oxadiazolyl, pryazinyl, etc. and their corresponding multivalent and fused ring configurations.

The mixtures of the present invention are made by the method disclosed in U.S. Pat. No. 4,499,165 to Molaire, which is incorporated herein by reference in its entirety.

Representative starting materials having a multicyclic aromatic nucleus and at least two functional (reactive) groups are selected from the following materials:

A. The phenylindan diols of J. C. Wilson, Research Disclosure 11833, February 1974, and J. C. Wilson, U.S. Pat. Nos. 3,803,096, 3,859,364 and 3,886,124 and the phenylindan diamines of J. C. Wilson, U.S. Pat. Nos. 3,897,253 and 3,915,939 having the structures:

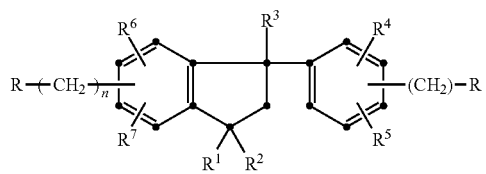

and

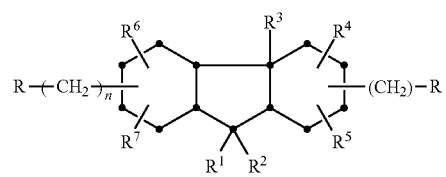

wherein $R^1$ and $R^3$ are independently selected from the group consisting of hydrogen and alkyl radicals of from 1 to 6 carbon atoms; $R^2$ is an alkyl radical of from 1 to 6 carbon atoms; $R^4$, $R^5$, $R^6$, and $R^7$ are independently selected from the group consisting of hydrogen, aryl radicals, halogen atoms, nitro radicals, cyano radicals, amino radicals, and alkoxy radicals; $R^8$ is hydroxy or amino; and n is 0 or 1.

B. The 1,1'-spirobiindan diols and diamines of F. L. Hamb and J. C. Wilson, U.S. Pat. No. 3,725,070; and the 1-1'-spirobiindan (dicarboxylic acids) of Research Disclosure 9830, June, 1972 (anonymous), of the structure:

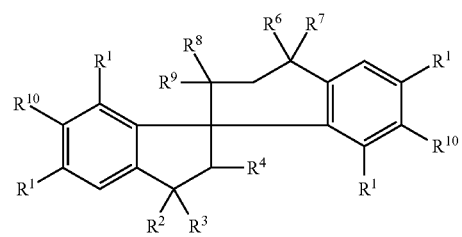

wherein each $R^1$ independently is selected from the group consisting of hydrogen atoms, or alkyl radicals having 1 to 12 carbon atoms; $R^2$, $R^3$, $R^4$, $R^5$, $R^6$, $R^7$, $R^8$, and $R^9$ are independently selected from the group consisting of hydrogen atoms and alkyl radicals of from 1 to 5 carbon atoms; and $R^{10}$ is —OH, —NH$_2$, or —OCH$_2$COOH.

C. The 1,1'-spirobiindan-5,5'-diamines of J. C. Wilson, Research Disclosure 13117, March, 1975, with the structure:

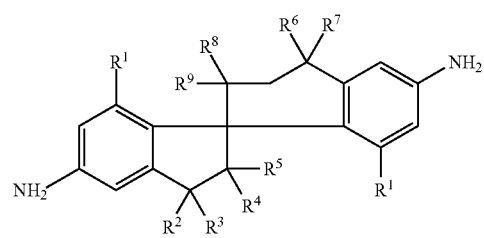

wherein each $R^1$ is independently selected from hydrogen atoms and alkyl radicals of 1 to 12 carbon atoms; and $R^2$, $R^3$, $R^4$, $R^5$, $R^6$, $R^7$, $R^8$, and $R^9$ are independently selected from the group consisting of hydrogen atoms and alkyl radicals of from 1 to 5 carbon atoms.

D. The 2,2'-spirobichromans of F. L. Hamb and J. C. Wilson, U.S. Pat. No. 3,859,097 of the structure:

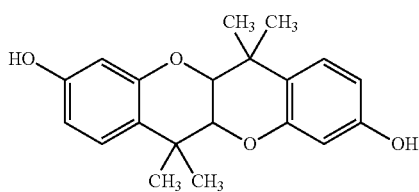 [SMILES: CC1(C)c2ccc(O)cc2OC2C1Oc1cc(O)ccc1C2(C)C]

E. The 7,7-dimethyl-7H-dibenzo[c,h]xanthene diols of F. L. Hamb and J. C. Wilson, U.S. Pat. Nos. 3,859,254 and 3,902,904 of the structure:

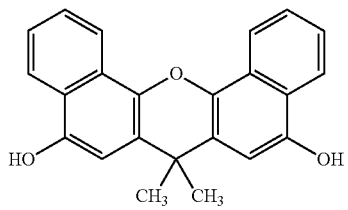

F. The 9,9-dimethylxanthene-3,6-bis(oxyacetic acids) of Research Disclosure 9830, June, 1972 (Anonymous) with the structure:

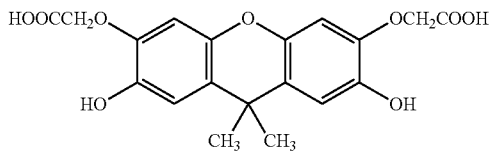

G. The xanthylium salts of J. C. Wilson, U.S. Pat. No. 3,856,751, with the structure:

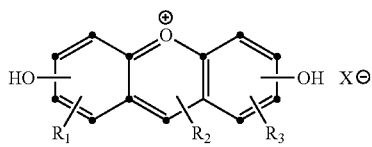

wherein $R^1$, $R^2$ and $R^3$ are hydrogen, alkyl, aryl, halogen, alkoxy, or cyano; and $X^\ominus$ is an acid anion.

H. The 4,4-(3-phenyl-1-indanylidene)diphenols of J. C. Wilson, Research Disclosure 13101, March, 1975, with the structure:

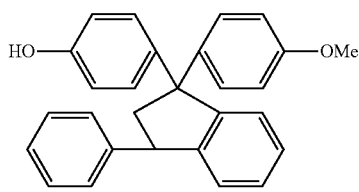 [SMILES: COc1ccc(C2(c3ccc(O)cc3)CC(c3ccccc3)c3ccccc32)cc1]

I. The 4,4-(hexahydro-4,7-methanoindan-5-ylidene)diphenols of M. A. Sandhu, Research Disclosure 13568, July, 1975, with the structure:

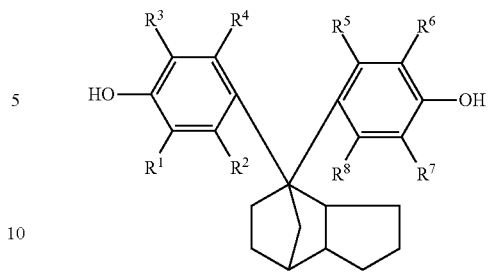

wherein $R^1$, $R^2$, $R^3$, $R^4$, $R^5$, $R^6$, $R^7$, and $R^8$ are independently hydrogen, halogen, cyano, alkyl of 1 to 8 carbon atoms, or alkoxy of 1 to 8 carbon atoms.

J. The bisphenols of T. L. Conklin and F. L. Hamb, Research Disclosure 12012, April, 1974, and the halogenated bisphenols of M. A. Sandhu, Research Disclosure 13569, July, 1975, with the structure:

wherein each $R^1$ is hydrogen, halogen, preferably chloro or bromo, alkyl of 1 to 8 carbon atoms, or alkoxy of 1 to 8 carbons; each $R^2$ is hydrogen, alkyl of 1 to 8 carbon atoms or alkoxy of 1 to 8 carbon atoms; and W and $R^4$ are alkyl of about 1 to 6 carbon atoms.

K. The sulfonyldibenzoic acids of M. A. Sandhu, Research Disclosure 14016, December, 1975, with the structure:

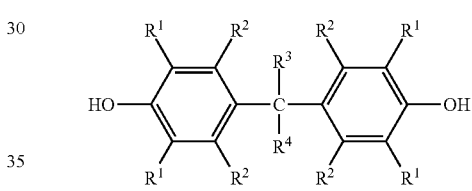

wherein each of $R^1$ through $R^8$ is independently from hydrogen, halogen, preferably chloro or bromo, and alkyl of about 1 to 4 carbon atoms.

L. The polycyclic norbornanes of Research Disclosure 9207, December, 1971 (Anonymous), with the structure:

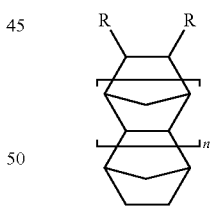

wherein n is 0 to 3 and R is —COOH or —CH$_2$OH.

M. The 1,2,3,4-tetrahydronaphthalenes of M. A. Sandhu, Research Disclosure 13570, July, 1975, with the structure:

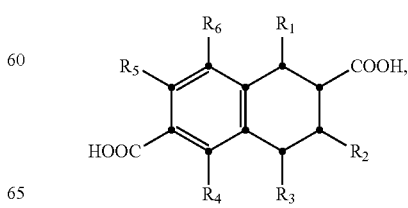

wherein each of R¹ through R⁶ is independently selected from hydrogen, halogen or lower alkyl at 1 to 4 atoms.

Other useful polyfunctional compounds include commercially available bisphenols such as tetrabromophenolphthalein, tetrachlorophenolphthalein, tetrabromophenol blue, Eosin B, tetrabromocresol blue, hematoxylin, 4',5'-diiodofluorescein, the polyhydroxy aromatic condensation product of pyrogallol and acetone, quercetin and derivatives thereof, the 9,9-bis(4-amino-3-benzoylphenyl)fluorene, 9,9-bis(4-aminophenyl)-10-anthrone and derivatives thereof reported in Macromolecules 14, p. 486-493 (1981), and other multifunctional molecules susceptible to quantitative condensation reaction to yield mixed esters, or mixed amides, or mixed imides, or mixed urethanes, or any other mixtures of organic materials that are noncrystallizable, and have glass-transition temperatures well above room temperature, i.e., above 50° C., preferably above 55° C.

Examples of monofunctional compounds that can be incorporated into the nonelectroluminescent-nonpolymeric molecular glass mixtures of this invention include:

A. Substituted benzene functionalized compounds of the structure:

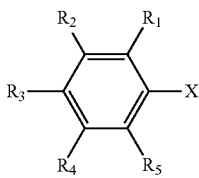

wherein $R_1$, $R_2$, $R_3$, $R_4$ and $R_5$ are independently selected from the group consisting of hydrogen, aryl radicals, halogen atoms, nitro radicals, cyano radicals, amino radicals and alkoxy radicals, and X is selected from the group consisting of primary or secondary amino radicals, hydroxy radicals, acid radicals, isocyanate radicals, etc.

B. Substituted phthalic anhydride compounds of the structure:

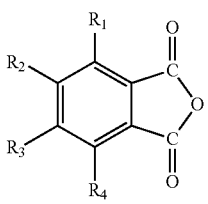

wherein $R_1$, $R_2$, $R_3$, $R_4$ are independently selected from the group consisting of hydrogen, aryl radicals, halogen atoms, nitro radicals, cyano radicals, and alkoxy radicals.

C. Aliphatic acids, alcohols, isocyanates, amines, and derivatives thereof. Aliphatic monofunctional compounds are particularly useful in controlling the glass transition temperature of the mixture within the range useful for toner applications.

D. Compounds having unsaturated polymerizable or crosslinkable groups such as acrylic acid, methacrylic acid and derivatives thereof, allyl alcohol, and the like.

E. Any other monofunctional compounds susceptible to quantitative reactions amenable to the nonelectroluminescent-nonpolymeric molecular glass mixtures of this invention.

Some commercially available nonpolymeric glasses useful in the practice of this invention are the various derivatives of rosin available under many trade names. Examples are given in Table 2

TABLE 2

| Commercially Available Nonpolymeric Glasses Tradename* Type Softening Point, ° C. |
|---|
| "Ester Gum 8 BG" |
| glycerol ester of wood 90 rosin |
| "Pexalyn/A500" |
| glycerol ester of wood 86 rosin |

The above products are available from Hercules, Inc., Hercules Plaza, Wilmington, Del. 19894. For these amorphous materials, the softening point approximates the glass transition temperature. In any case, the glass transition temperatures for these materials are within the 50° to 120° C. range.

Additionally, the nonelectroluminescent-nonpolymeric molecular glass mixture of this invention can be crosslinkable, polymerizable, or crosslinkable and polymerizable.

Specific examples of nonelectroluminescent-nonpolymeric glass mixture include

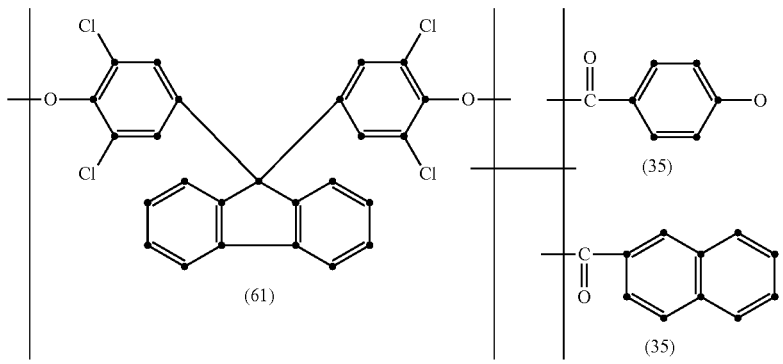

-continued
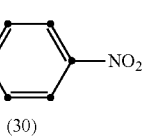
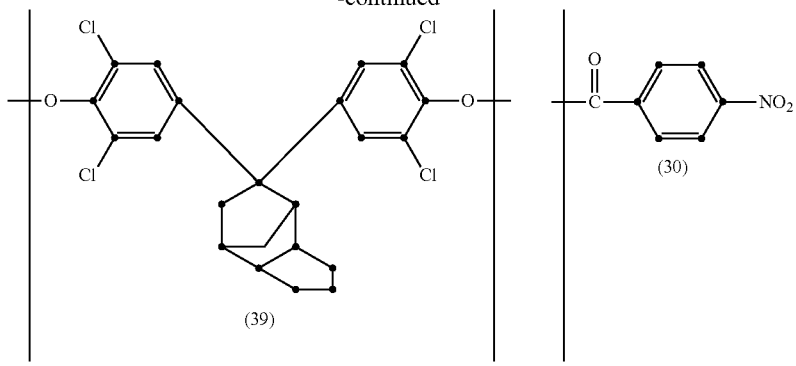
$T_g$, 101° C. (20°/min by DSC)
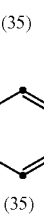
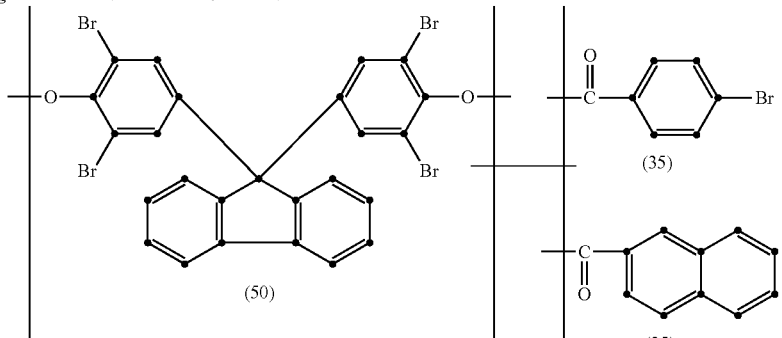
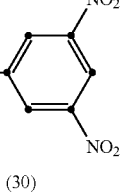
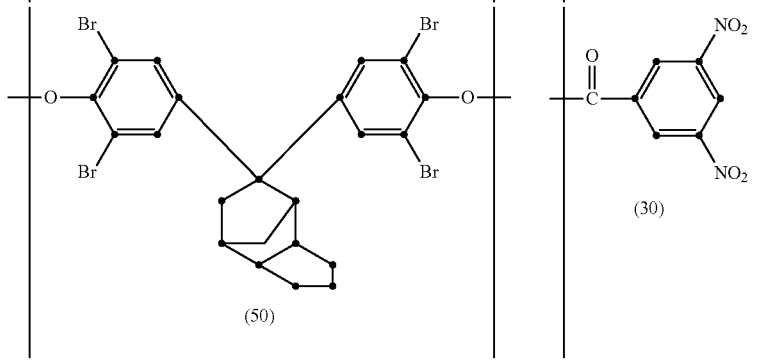
$T_g$, 128° C. (20°/min by DSC)
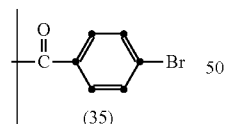
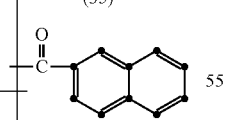
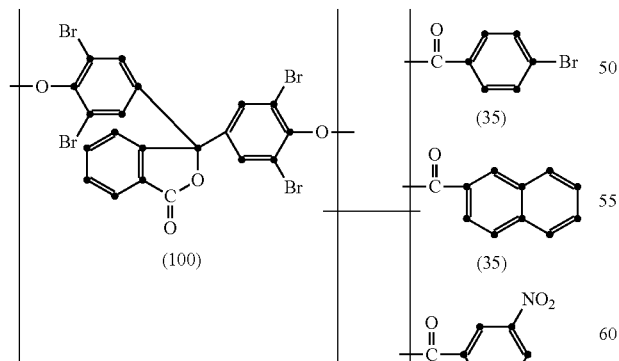
$T_g$, 138° C. (20°/min by DSC)

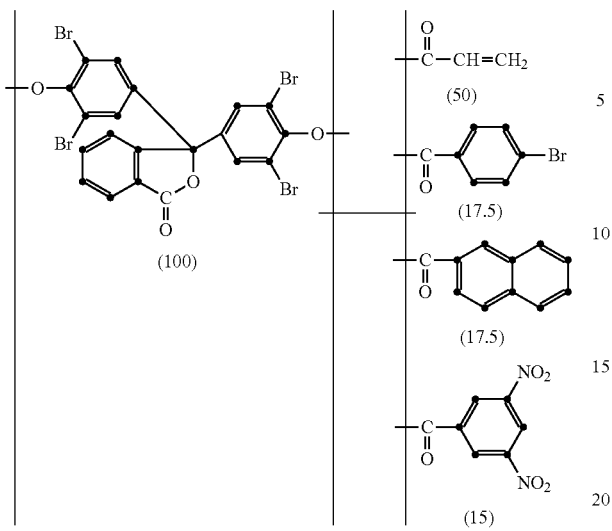
$T_g$, 115° C. (20°/min by DSC
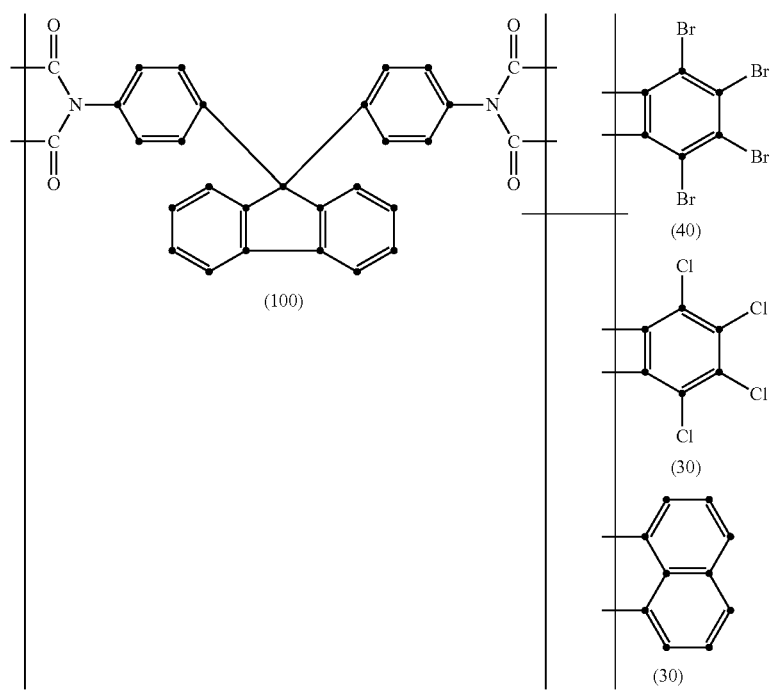
$T_g$, 190° C. (20°/min by DSC

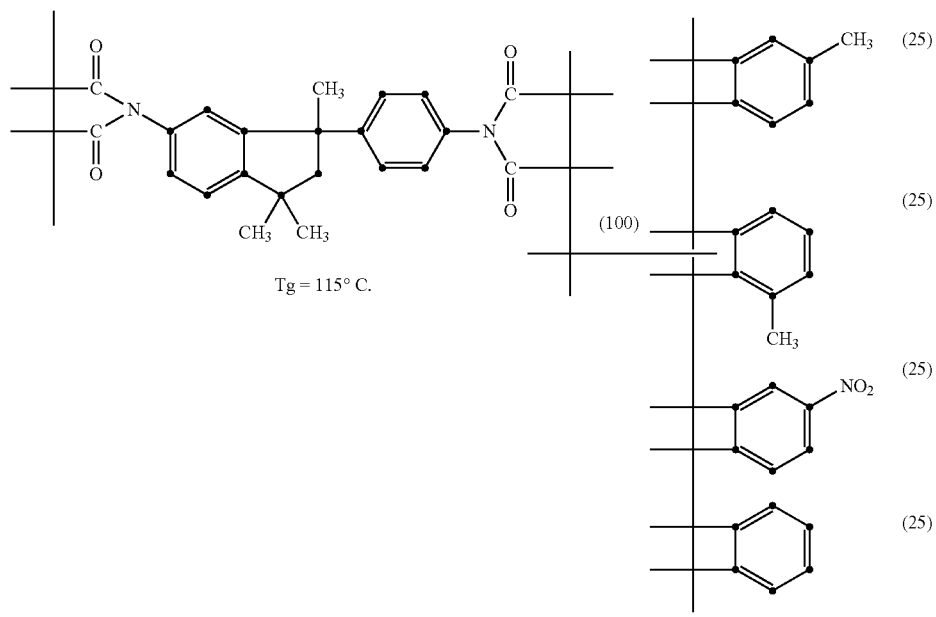
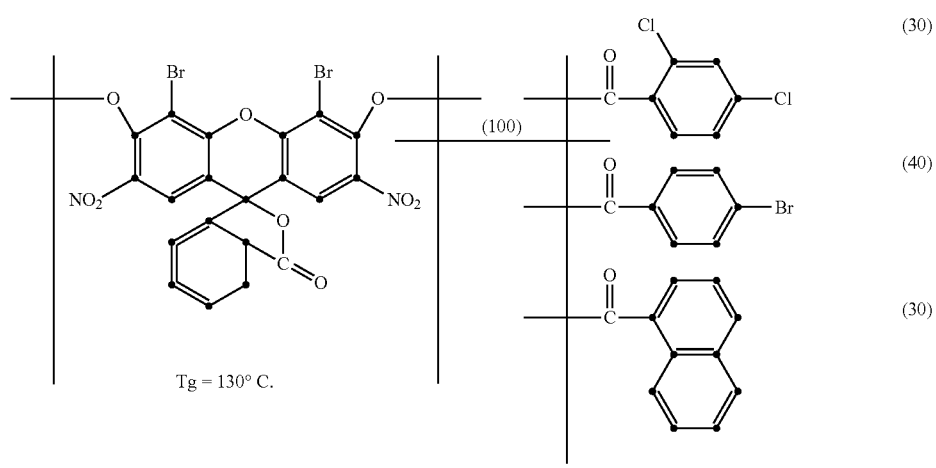
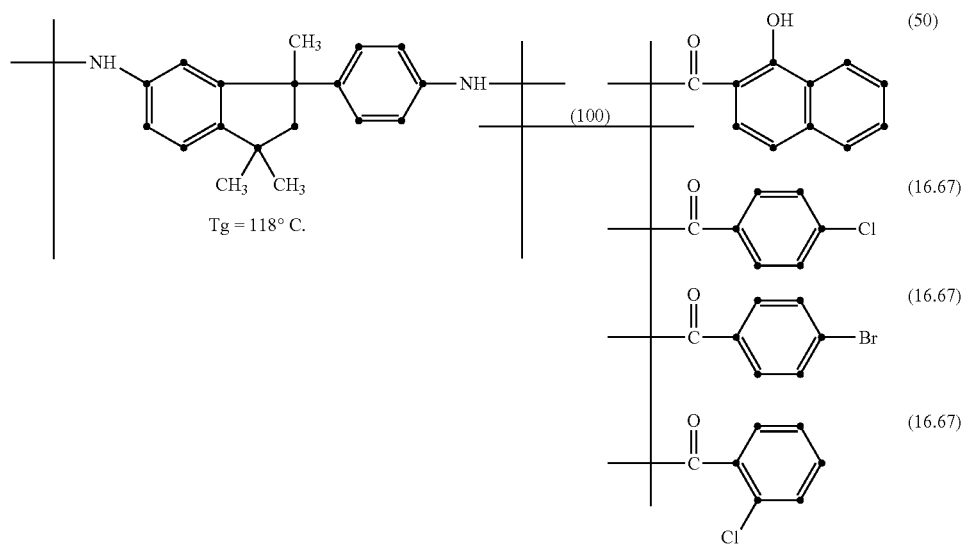

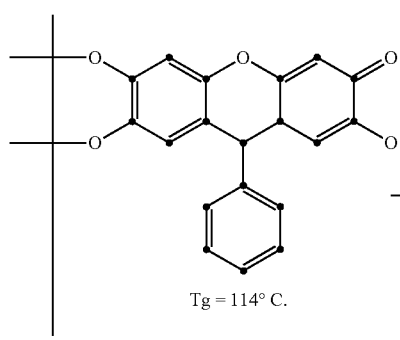
Tg = 114° C.
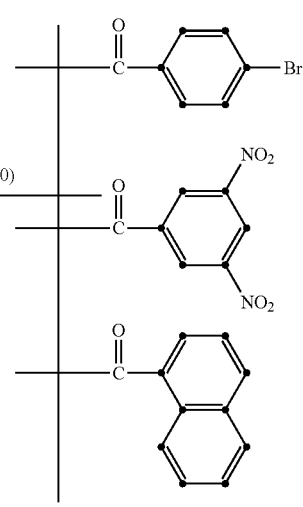
(35)
(30)
(35)
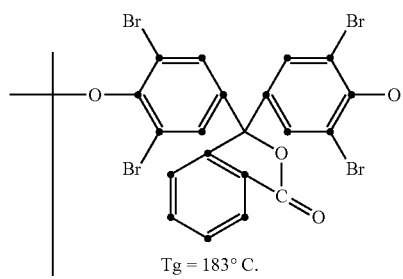
Tg = 183° C.
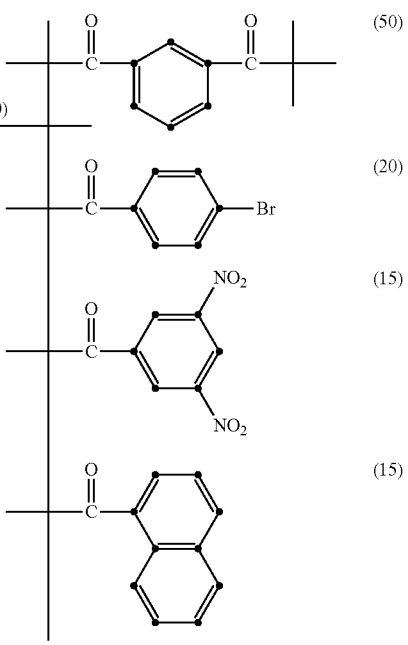
(50)
(20)
(15)
(15)

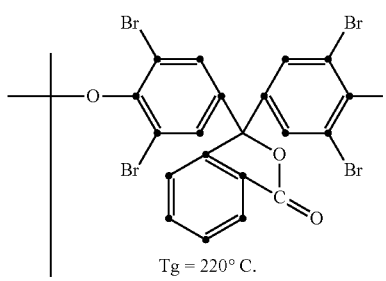
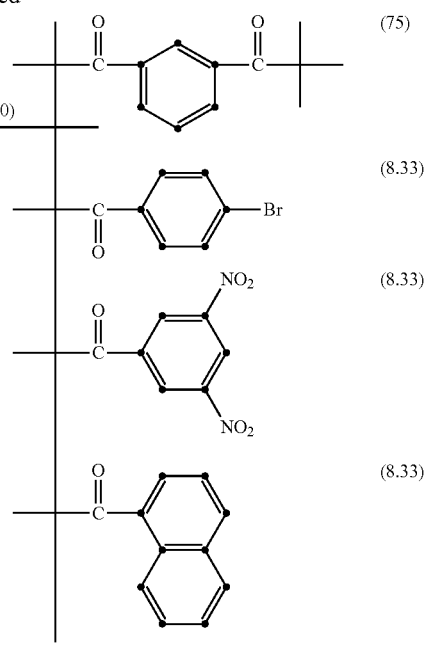
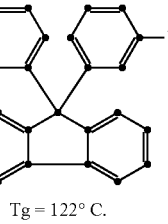
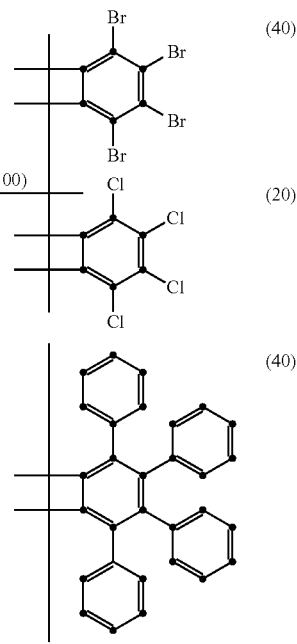

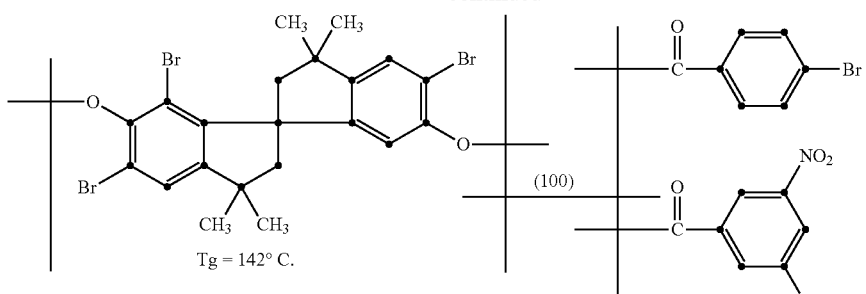
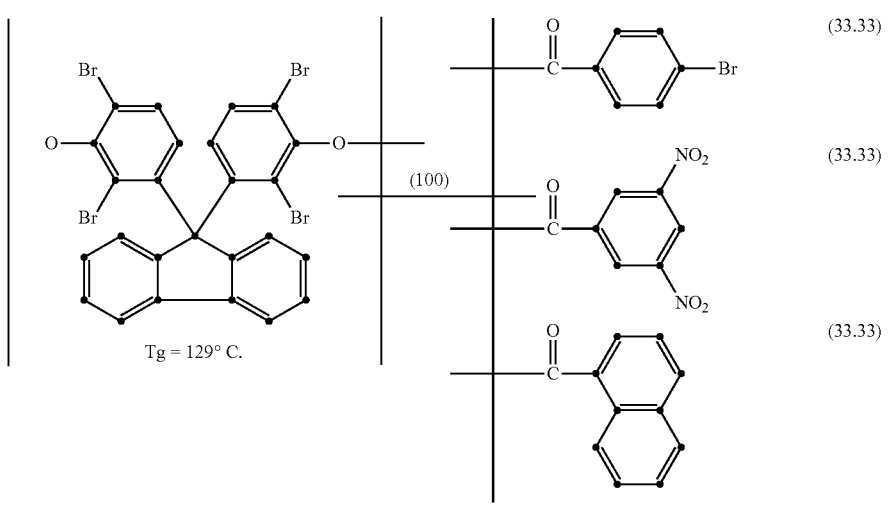
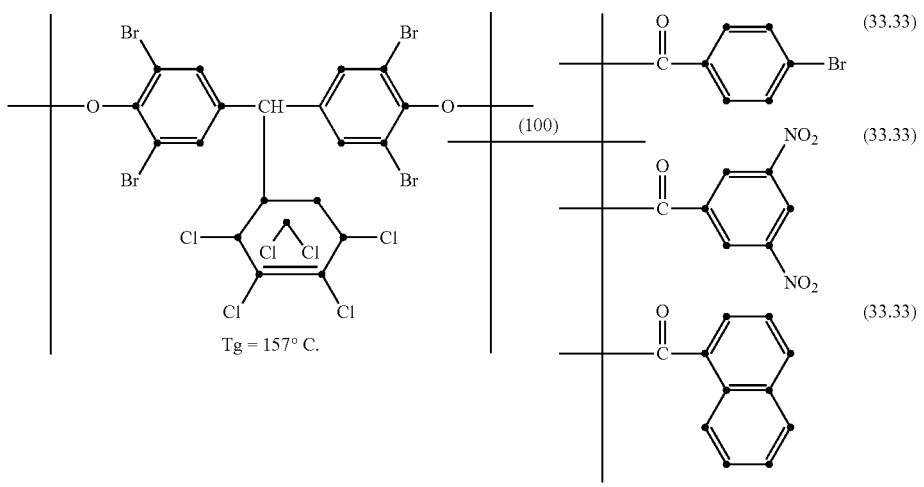

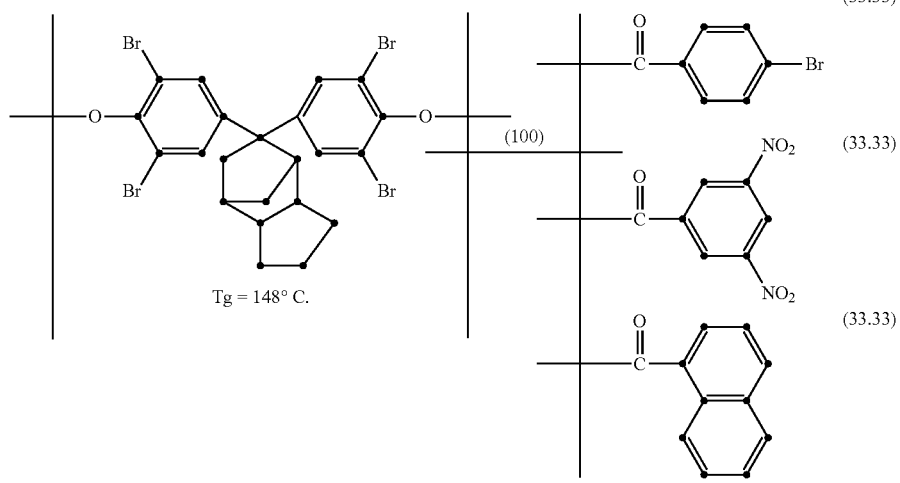
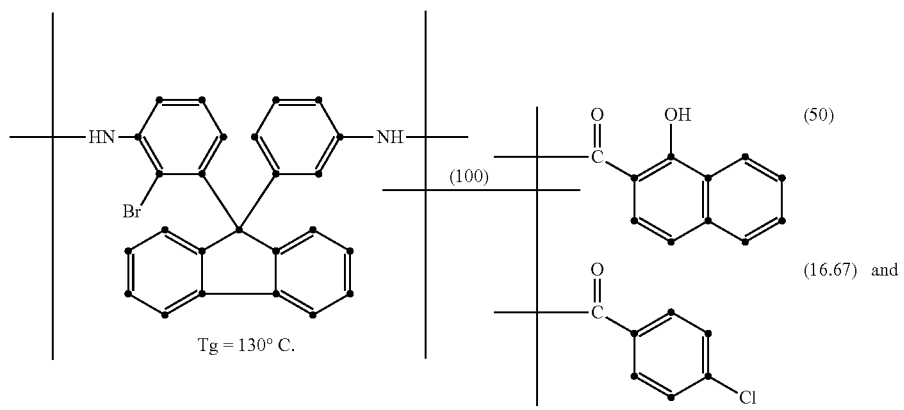
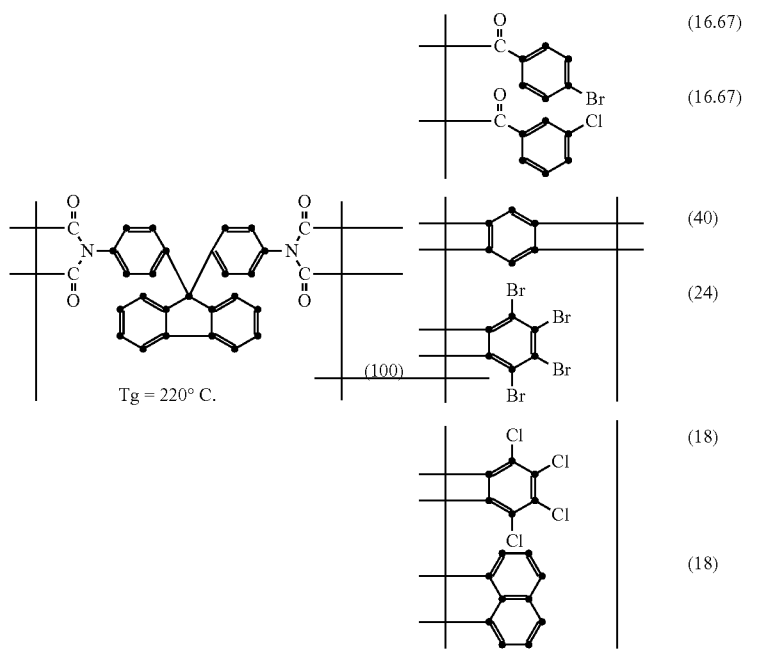

In yet another embodiment of the present invention, the non-electroluminescent molecular glass mixtures useful as the binders of the emitting layer compositions of this invention are homogeneous mixtures of at least two nonpolymeric, thermoplastic compounds, each compound in the mixture independently conforming to the structure:

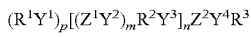

wherein m is zero or one;

n is the number of recurring units in the compound, and is zero up to, but not including, an integer at which said compound starts to become a polymer;

p is an integer of from one to eight;

each $R^1$ and $R^3$ is independently a monovalent aliphatic or cycloaliphatic hydrocarbon group having 1 to 20 carbon atoms, an aromatic group or a multicyclic aromatic nucleus;

$R^2$, $Z^1$ and $Z^2$ each independently represent multivalent aliphatic or cycloaliphatic hydrocarbon groups having 1 to 20 carbon atoms or an aromatic; and $Y^1$, $Y^2$, $Y^3$ and $Y^4$ each independently represents a triple bond, a double bond, or a single bond link; provided that the glass transition temperature ($T_g$) of the mixture is above 20° C. These non-electroluminescent molecular glass mixtures are made via coupling reactions as described in application U.S. 61/919,252 filed Mar. 25, 2014 by Molaire herein incorporated by reference in its entirety. Preferred coupling reactions include the Heck and Suzuki reactions.

1. The "Heck Reaction", a palladium-catalyzed C—C coupling between aryl halides or vinyl halides and activated alkenes in the presence of a base (Heck R. F. J Am Chem Soc, 90:5518, 1968).

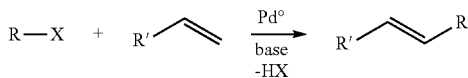

wherein R is chosen from the group consisting of alkenyl, aryl, allyl, alkynyl, and benzyl;

X is chosen from the group consisting of halide and triflate; and

R' is chosen from the group consisting of alkyl, alkenyl, aryl, $CO_2R$, and $SiR_3$.

2. The "Suzuki Reaction", the palladium (0) complex catalyzed reaction of an aryl- or vinyl-boronic acid with an aryl- or vinyl-halide in the presence of a base (Tanigaki N., Masuda H., and Kaeriyama K. Polymer, 38:1221, 1997; Remers M., Schulze M., and Wegner G. Macromol Rapid Commun, 17:239, 1996.)

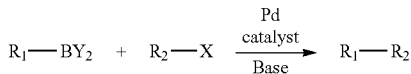

The halide or the boronate can be aryl or vinyl.

Electroluminescent Materials

The light emitting layer of the invention comprises an electroluminescent material dispersed in a nonelectroluminescent-nonpolymeric amorphous glass mixture. The electroluminescent materials of this invention are defined as materials that exhibit electroactive properties in electroluminescent applications, including the light emitting materials, the hole transport materials, and the electron transport materials. The electroluminescent materials can be combinations of the electroactive species. In a preferred embodiment of this invention, the electroluminescent material is a combination of a hole transport material, a light emitting material, and an electron transport material. Optionally, the electroluminescent material of this invention can be combinations of a hole transport material and a light emitting material or an electron transport material and a light emitting material. The electroluminescent material preferably constitutes about 20 to about 80 weight percent (wt. %) of the light emitting layer, and more preferably constitutes about 40 to about 60 wt. % of the light emitting layer. Lower levels of electroluminescent materials might not produce sufficiently intense electroluminescence, and higher levels can adversely impact the physical integrity of the resulting film.

Suitable electroluminescent materials include but are not limited to fluorescent compounds such as laser dyes as well as other active organic species, including distyrenyl derivatives such as those described in U.S. Pat. Nos. 5,503,910, 5,121,029 and 6,214,481 which are hereby incorporated by reference in their entirety into this specification.

The class of laser dyes includes but is not limited to Coumarin 6, Coumarin 334, Coumarin 343, Rhodamine B, Rhodamine 6G, Rhodamine 110, Fluorescein 548, 2',7'-dichlorofluorescein, cresyl violet perchlorate, Nile Blue AA perchlorate, p-terphenyl, p-quaterphenyl, Exalite (376, 384r, 389), Fluorol 555, Fluorescein Diacetate, Carbostyril 165, IR-140, Thionin, perylene, 9-amino acridine HCl and the like. Additional laser dyes include aromatic methylidine compounds of the general structure:

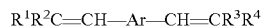

where $R^1$, $R^2$, $R^3$, and $R^4$ represent hydrogen, alkyl groups, alkoxy groups, aromatic groups including substituted aromatic groups, cycloaliphatic groups and the like; and Ar represents an aromatic structure including phenyl, biphenyl, terphenyl linked aromatic structures including various substituents on the aromatic group(s). The substituents can include alkyl, aryl, alkoxy, hydroxyl, halide, amino and the like. Such compositions are discussed in various patents issued to Idemitsu Kosan, including U.S. Pat. Nos. 5,503,910, 5,121,029 and 6,214,481.

Quinacridones such as 9,18-dihydro-9,18-dimethylbenzo[h]benzo[7,8]quino[2,3-b]acridine-7,16-dione; 7,16-dihydro-7,16-dimethylbenzo[a]benzo[5,6]quino[3,2-I]acridine-9,18-dione; N,N'-dimethyl-quinacridone can also be employed as light emitting materials in the electroluminescent materials of this invention.

Linked aromatic structures such as 9,10-di-(2-naphthyl) anthracene derivatives as described in U.S. Pat. No. 5,935,721 can also be suitable for use as the electroluminescent material of the present invention. Light emitting naphthalene derivatives, anthracene derivatives, phenanthrenes, perylenes, chrysenes, butadienes (such as tetraphenylbutadiene) and the like are also suitable, as are periflanthenes as described in U.S. Pat. No. 6,004,685 and tetravinylpyrazines as described in U.S. Pat. No. 5,416,213.

Oligomers of conjugated polymers with molecular weights of less than 2000 amu, such as oligophenylene vinylene, oligophenylenevinylene, oligothiophenes such as α-quaterthiophene and α-hexathiophene, oligo(p-phenylene) and oligofluorenes can be suitable light emitting materials for the electroluminescent materials of this invention.

The hole transport materials which constitute one of the classes of electroluminescent materials of this invention include but are not limited to aromatic tertiary amines, benzidine, pyrazoline derivatives along with other classes of known hole transport materials. Suitable arylamine and benzidine derivatives include, e.g., N,N'-bis(3-methylphenyl)-N,N'-bis(phenyl)-benzidine, N,N'-bis(4-methylphenyl)-N,N'-bis(phenyl)-benzidine, N,N'-di(naphthalene-2-yl)-N,N'-diphenylbenzidine, 1,3,-5-tris(3-methyldiphenylamino)benzene; 4,4'-Bis(carbazol-9-yl) biphenyl; 4,4',4''-Tris(carbazol-9yl)-triphenylamine (CAS #139092-78-7); N,N,N',N'-Tetrakis(3-methylphenyl)-benzidine; 4,4',4''-Tris(N-(2-naphthyl)-N-phenyl-amino)-triphenylamine; 4,4',4''-tris(N,N-diphenyl-amino)-triphenylamine. Suitable pyrazoline derivatives include, e.g., PYR-7 and PYR-9 disclosed by Takeshi Sano et al., J. Mater. Chem., 2000, 10 (1), 157-161:

as well as oligothiophenes such as α-quaterthiophene and α-hexathiophene, dibenzochrysene derivatives, oligophenylenevinylenes, oligofluorenes, phthalocyanines and carbazole derivatives.

The electron transport materials, which constitute one of the classes of electroluminescent materials of this invention, include but are not limited to oxadiazole, triazole, phenantroline, quinolinolato and benzoquinolinolato functional organics. Suitable examples of oxadiazole derivatives include, e.g., 2-(4-biphenylyl)-5-(p-tert-butylphenyl)-1,3,4-oxadiazole (PBD); 2,2'-(1,3-phenylene) bis[5-[4-(1,1-dimethylethyl)phenyl]]-1,3,4-oxadiazole (CAS#138372-67-5); and 1,3-Bis(4-(4-diphenylamino)-phenyl-1,3,4-oxidiazol-2-yl)-benzene (CAS#184101-39-1). Suitable examples of triazole derivatives (hole blocker—electron transporter) include, e.g., 3,4,5-triphenyl-1,2,4-triazole; 3,5-bis(4-tert-butyl-phenyl)-4-phenyl-1,2,4-triazole; and 3-(4-biphenylyl)-4-phenyl-5-tert-butylphenyl-1,2,4-triazole. Suitable examples of phenanthroline derivatives include, e.g, 2,9-dimethyl-4,7-diphenyl-1,10-phenanthroline (BCP; CAS #4733-39-5). Suitable examples of quinolinolato and benzoquinolinolato complexes include, e.g., tris(8-hydroxyquinolinolato) aluminum ($Alq_3$); bis(10-hydroxybenzo[h]quinolinolato) beryllium ($Bebq_2$); 2,2'2''-(1,3,5-benzenetriyl) tris-[1-phenyl-1H-benzimidazole] (TPBI); and cyano substituted oligophenylenevinylene derivatives.

Mixtures of two or more of the electroluminescent materials in the non--electroluminescent molecular glass mixture are contemplated to achieve specific colors or optionally to yield white light.

Other suitable light emitter materials include phosphorescent dopants or thermally activated delayed fluorescent (TADF) dopants.

Examples of phosphorescent dopants include:
(2,4-Pentanedionato)bis[2-(2-quinolinyl)phenyl]iridium (III), Bis[5-methyl-2-(2-pyridinyl-N)phenyl-C](2,4-pentanedionato-$O^2,O^4$)iridium(III), Bis[2-(2-benzothiazolyl-N3)phenolato-O]zinc, Bis[2-(4,6-difluorophenyl) pyridinato-C2,N](picolinato)iridium(III), Bis[2-(1-isoquinolinyl-N)phenyl-C](2,4-pentanedionato-$O^2,O^4$) iridium(III), Tris[2-(benzo[b]thiophen-2-yl)pyridinato-$C^3$, N]iridium(III), Bis[2-(1-isoquinolinyl-N)phenyl-C](2,4-pentanedionato-$O^2,O^4$)iridium(III), Bis[2-(2-pyridinyl-N) phenyl-C](2,4-pentanedionato-$O^2,O^4$)iridium(III), Dichlorotris(1,10-phenanthroline)ruthenium(II) hydrate, Bis (2-benzo[b]thiophen-2-ylpyridine)(acetylacetonate)iridium (III), Lithium tetra(2-methyl-8-hydroxyquinolinato)boron, ris(2,2'-bipyridyl)dichlororuthenium(II) hexahydrate, and other emitting materials capable of phosphorescence.

Examples of TADF dopants include:
2,5-bis(carbazol-9-yl)-1,4-dicyanobenzene (CzTPN described in Mater. Horiz., 2014, 1,264-269; the Organic Luminescent Compound With Delayed Fluorescence of US application 20140145149 to Lin; Chun et al; the delayed fluorescence material of US application 20140138669 to Nakagawa, and Tetsuya (Fukuoka, JP) Adachi, Chihaya (Fukuoka, JP) the benzothiophene or benzofuran fused to a carbazoles delayed fluorescent material of US application 20140145151 to Xia; Chuanjun; (Lawrenceville, N.J.); Lin; Chun and other emitting materials capable of delayed fluorescence.

Crosslinkable/Polymerizable Electroluminescent Layer

When a crosslinkable/polymerizable non-electroluminescent-molecular glass mixture is mixed with the electroluminescent materials, the layer can be rendered both insoluble and mechanically enhanced, after coating by thermal or actinic light processing. This option is important for applications involving multiple layers coated from solvent, or for FOLED applications.

E-beam or UV radiation can be used. For UV radiation a photoinitiatior is required. Any free-radical generating photoinitiator system can be used which initiates polymerization of the polymerizable/crosslinkable molecular glass mixture and does not subsequently terminate the polymerization. The free-radical generating photoinitiator system can comprise one or more compounds which directly furnish free radicals when activated by radiation. It can also comprise a plurality of compounds, one of which yields free radicals after having been caused to do so by a sensitizer which is activated by the radiation.

Representative useful examples of such photoinitiators include, for example, those described in British patent 1,507,704, including benzophenone, acetophenone, ethyl methyl ketone, cyclopentanone, benzil, caprone, benzoyl cyclobutanone, and dioctyl acetone, particularly when used in admixture with substituted benzophenones such as Michler's ketone.

Other photoinitiator is a mixture of a 3-ketocoumarin and an amine such as is described in U.S. Pat. No. 4,289,844 by Farid et al entitled "Photopolymerizable Compositions Featuring Novel Co-initiators". Representative amines include ethyl-p-dimethylaminobenzoate; other esters of p-dimethylaminobenzoic acid, e.g., n-butyl-p-dimethylaminobenzoate, phenethyl-p-dimethylaminobenzoate, 2-phthalimidoethyl-p-dimethylaminobenzoate, 2-methacryloylethyl-p-dimethylaminobenzoate, 1,5-pentyl di-(p-dimethylamino)benzoate; 4,4'-bis(dimethylamino)benzophenone; phenethyl and 1,5-pentyl esters of m-dimethylaminobenzoic acid; p-dimethylaminobenzaldehyde; 2-chloro-4-dimethylaminobenzaldehyde; p-dimethylaminoacetophenone; p-dimethylaminobenzyl alcohol; ethyl-(p-dimethylamino) benzoyl acetate; p-N-piperidinoacetophenone; 4-dimethylamino benzoin; N,N-dimethyl-p-toluidine; N,N-diethyl-m-phenetidine; tribenzyl amine; dibenzylphenyl amine; N-methyl-N-phenylbenzylamine; p-bromo-N,N-dimethylaniline; tridodecylamine; 4,4',4''-methylidyne(N,N-dimethylaniline) (crystal violet, leuco base); 3-indoleacetic acid; and N-phenylglycine.

The coumarin associated with the amine can be one or more of, e.g., the following: 3-(2-benzofuroyl)-7-diethylaminocoumarin; 3-(2-benzofuroyl)-7-(1-pyrrolidinyl)coumarin; 7-dimethylamino-3-thenoylcoumarin; 3-benzoyl-7-diethylaminocoumarin; 3-(o-methoxybenzoyl)-diethylaminocoumarin; 3-(m-fluorosulfonyl)benzoyl-diethylaminocoumarin; 3-(p-dimethylaminobenzoyl)-diethylaminocoumarin; 3,3'-carbonylbis(5,7-di-n-propoxy coumarin); 3,3'-carbonylbis(7-diethylamino coumarin); 3-benzoyl-7-methoxycoumarin; 3-(2-furoyl)-7-diethylaminocoumarin; 3-(p-dimethylaminobenzoyl)-7-diethylaminocoumarin; 3-(p-diethylaminostyrylcarbonyl)-diethylaminocoumarin; 3-(p-morpholinostyrylcarbonyl)- diethylaminocoumarin; 9-(7-diethylamino-3-coumarinoyl)-1,2,4,5-tetrahydro-3H, 6H,10H[1]benzopyrano[9,9a,1-gh]quinolazine-10-one which has the structure ##STR5##9-(7-n-propylamino-3-coumarinoyl)-2,4,5-tetrahydro 3H,6H,10H[1]benzopyrano[9,9a,1-gh]quinolazine-10-one.

The photoinitiator composition can be present in an amount from 0.05 to about 10 weight percent, and preferably from 0.10 to 5 weight percent.

Alternately thermal free radical initiators can be used. Examples of thermal initiators include
2,2'-Azobis(2-methylpropionitrile, 1,1'-Azobis(cyclohexanecarbonitrile, N-Bromosuccinimide, 2,2'-Azobis(2-methylpropionitrile), 1,1'-Azobis(cyclohexanecarbonitrile, 4,4'-Azobis(4-cyanovaleric acid, organic peroxides.

The free radical generator should not interfere with the function of the coating. For example any material that can constitute a trap for charge transport should be avoided. Any material that can interfere with photoluminescence of the coating should be avoided.

It is very important that the chosen free radical initiating system does not affect in any way the electroluminescent performance, and/or the stability and longevity of the electroluminescent device.

Alternatively other crosslinkable chemistries can be incorporated in the nonelectroluminescent-nonpolymeric molecular glass mixture of the invention. For example, epoxy, urethane chemistries.

Light Emitting Device Structure

The construction of light emitting devices of the invention can be greatly varied. For example, suitable light emitting devices can have a transparent anode placed on one side of an appropriate substrate. A hole injection/transport layer is placed on top of the transparent anode and can comprise both a hole injection layer and a hole transport layer. On top of the hole transport layer is the light emitting layer where holes and electrons combine to emit light. On top of the light emitting layer is the electron injection/transport layer and on top of this layer the cathode is positioned. The anode, light emitting and cathode layers are required. The hole injection, hole transport, electron injection and electron transport layers are optional. In specific cases where the hole transport or electron transport is too rapid, hole or electron blocking layers can be provided to assure maximum electron-hole combination in the light emitting layer.

Typically the substrate coated with the anode is glass. Transparent polymer sheets and films can also be employed. These include, e.g., Bisphenol A polycarbonate, PMMA, poly(ethylene terephthalate) film, polysulfone films, polypropylene films and the like.

The transparent anode is preferably indium-tin oxide (ITO), tin oxide or doped zinc oxide. Conductive polymeric materials can be used as the anode or as a coating on the anode to improve hole injection. These include but are not limited to poly(3,4-ethylenedioxythiophene) doped with poly(styrene sulfonic acid) or other appropriate dopants and sulfonated polyaniline derivatives or polyaniline variants doped with strong organic acids.

The hole transport layer includes but is not limited to polyvinylcarbazole, aromatic tertiary amines and phthalocyanines. In certain embodiments, the hole transport layer can be comprised of low molecular weight compounds noted above in the discussion of electroluminescent materials along with higher molecular weight versions of similar compounds.

The electron transport/injection layer can comprise low molecular weight compounds such as the metal complexes of 8-hydroxyquinoline, triazoles or higher molecular weight polymers comprising oxadiazole, quinoxaline or triazole groups. In certain embodiments, the electron transport layer can be comprised of low molecular weight compounds noted above in the discussion of electroluminescent materials along with higher molecular weight versions of similar compounds.

The metal cathode can comprise at least one member selected from the group consisting of calcium, magnesium, aluminum, silver and indium. When more than one of the group members is present, they can be mixed or layered. Alloys with other metals can be employed and alkali or alkaline earth metals such as Cs and Li (as CsF and LiF) can be employed in minor amounts. The light emitting layer of this invention is preferably positioned between the hole injection/transport layer and the electron injection/transport layer in the foregoing preferred embodiment.

Alternatively, a single multifunctional layer can substitute for at least two of the hole injection/transport layer, the electron injection/transport layer and the light emitting layer. In certain embodiments of this invention, the hole transport, electron transport and light emitting materials can all be combined with the nonpolymeric glass mixture in the light emitting layer to thereby provide a single layer (between the electrodes) device. This offers significant fabrication advantages over multilayer devices. This specific feature of this embodiment of the invention is quite important, because of the importance of balancing hole and electron transport in a light emitting device so that the recombination of holes and electrons occurs at the proper position in the device. The combination of hole transport, electron transport and light emitting materials in the nonpolymeric glass mixture of this invention can facilitate optimization of the light emitting device.

In production of the light emitting device, the hole injection layer of a transparent conducting polymer (e.g., polyethylenedioxythiophene or PEDOT) can be applied via spin coating, spray coating, meniscus coating, screen printing, ink jet printing or roll-to-roll processing. Low molecular weight hole injection materials can be applied using sputtering or evaporative coating techniques. The hole transport layer can be applied by vacuum deposition as well as the other methods noted for the hole injection layer. The light emitting layer comprising nonpolymeric glass mixtures with miscible low molecular weight electroluminescent materials can be applied from an appropriate solvent via spin coating, ink jet printing, screen printing or roll-to-roll printing processes. The electron transport/injection layer(s) can be applied via vacuum deposition or the methods noted for the light emitting layers. The cathode can be applied via sputtering or thermal vacuum evaporation/deposition techniques well known in the art as well as screen printing, ink-jet printing or roll-to-roll processing.

The specific construction of the light emitting device to deliver a multicolor display panel required for many potential applications involves pixel design such that red, green and blue light emitting pixels can be employed to provide a full color spectrum. should exhibit longer lifetimes without loss of luminescence or color definition.

A preferred OLED device of this invention is a flexible flat panel display. As used herein, the term "flexible" means that the flexible object (e.g., flat panel display) can be placed on a cylindrical curvature of a cylinder having a radius of 6 inches without fracture of the device and without loss of its ability to exhibit light emission as in the flat state.

For the OLED devices of this invention most of the compositions employed for the cathode materials will be sensitive to water and/or oxygen. Other layers and materials utilized in the construction could also be sensitive to water and oxygen exposure. For rigid devices, glass coatings on both sides with proper sealants to prevent water or oxygen diffusion into the device will suffice. For flexible devices, flexible barrier films will need to be employed. For the non-transparent side of the device, flexible barrier films such as metallized poly(ethylene terephthalate) could be employed. For the transparent side, flexible transparent barrier films could be utilized, such as in BARIX encapsulation coatings available from Vitex Corporation, and in U.S. Pat. No. 6,268,695 to Affinito.

In preparing light emitting devices of the invention, it is preferred to purify the non-electroactive polymer and the solvents employed in the solution utilized to prepare the light emitting layer of the light emitting device. The removal of ionic species (e.g., sodium ($Na^+$), lithium ($Li^+$), potassium ($K^+$), calcium ($Ca^{++}$), magnesium ($Mg^{++}$), copper ($Cu^+$, $Cu^{++}$), and the like) as well as the counterions (e.g. chlorine ($Cl^-$), bromine ($Br^-$), sulfate ($SO_4^-$), carbonate ($CO_3^-$), and the like.) is preferred to assure the efficiency of the device as well as assure quality control of the light emitting layer from device to device. Coagulation of the nonpolymeric glass mixture solution in a non-solvent followed by rinsing, extraction of ionic species using ion-exchange procedures, addition of chelation agents and the like are possible methods for reducing the contaminant levels to acceptable levels. The ionic contamination is a particular problem with many condensation polymers potentially employable in this invention.

Compatibilty and Miscibilty of Non-Electroluminescent Non-Crystallizable Molecular Glass Mixtures The light emitting layers of this invention are completely miscible in an intimate molecular scale and noncrystallizable. Such miscibility will only take place if the Gibbs Free Energy of mixing ($\Delta F$) is negative.

$$\Delta F = \Delta H - T\Delta S$$

wherein $\Delta H$ is the enthalpy of mixing and
$T\Delta S$ is the entropy of mixing.

For polymers the entropy term $T\Delta S$ is usually insignificant. Thus when a polymer binder is involved the enthalpy term $\Delta H$ needs to be influenced by stabilizing interactions between the polymer and the other molecule for spontaneous miscibility. The advantage of the non-electroluminescent molecular glass mixtures of this invention is their large entropy of mixing value as reported in Organic Monomeric Glasses: A Novel Class of Materials by Molaire et al. These glass mixtures are designed as compatible complex mixtures to accomplish the large entropy of mixing. The glass mixtures are made in a single pot reaction by reacting a multifunctional nucleus with a mixture of monofunctional groups. The number of distinct molecules in the mixtures is controlled by the number of functionalities of the multifunctional nucleus, the symmetry of the nucleus, and the number of monofunctional substituents. For example reacting a bisphenol with three monofunctional substituents provide a mixture of six distinct molecules. The reaction of a symmetrical trifunctional acid chloride, such as 1,3,5-benzene tricarbonyl chloride with four mono-alcohols provide a mixture of 20 distinct molecules while a reaction of the 1,2,3-benzene tricarbonyl chloride with the same four mono-alcohols provide a mixture of 40 distinct molecules; a reaction of the 1,2,4-benzene tricarbonyl chloride with the same four mono-alcohols provide a mixture of 64 distinct molecules. The resulting entropy of mixing values of these four mixtures are quite different, with the mixture with the larger number of components having the larger entropy of mixing value.

These design freedoms are used to match a nonpolymeric glass mixture to an electroluminescent dye and ensure complete compatibility and noncrystallizability. In U.S. Pat. No. 4,499,165 optical recording infrared (IR) dyes—nonpolymeric molecular glass mixtures were found compatible even at concentration as high as 70% dye without any occurrence of crystallization under several thermal and relative humidity conditions.

The conventional test of compatibility is evaluation of the thermal behavior of the mixture by thermal analysis techniques such as differential scanning calorimetry, DSC. A compatible electroluminescent dye—nonpolymeric amorphous-binder mixture has a single glass transition temperature without the presence of any crystallization transition both below and above the glass transition temperature of the mixture, over several heating cycles. Such a result is an indication that the material is thermodynamically stable and will not phase separate under the most stringent conditions, resulting in stable and long-lived OLED devices.

Although for the purpose of describing of this invention, the example of light emitting layers for OLED is used, this is not meant to be limiting. It is understood by those versed in the art that the invention is applicable for applications such as organic photovoltaic (OPV) devices, organic thin film transistors (OTFT), and other organic electronic devices where small organic molecules are used for sensitization, and the need to keep these small molecules from crystallizing is essential for promoting stability and longevity of the device.

For example solution-processed small-molecule solar cells used molecular donor 4,4'-[4,4-Bis(2-ethylhexyl)-4H-silolo[3,2-b:4,5-b]dithiophene-2,6-diyl]bis[7-(5'-hexyl-[2,2'-bithiophen]-5-yl)-[1,2,5]thiadiazolo[3,4-c]pyridine], 5,5'-Bis{[4-(7-hexylthiophen-2-yl)thiophen-2-yl]-[1,2,5]thiadiazolo[3,4-c]pyridine}-3,3'-di-2-ethylhexylsilylene-2,2'-bithiophene, $DTS(PTTh_2)_2$ in combinaition with the acceptor [6,6]-Phenyl $C_{71}$ butyric acid methyl ester, mixture of isomers, $PC_{70}BM$ (Yanming Sun, Gregory C. Welch, Wei Lin Leong, Christopher J. Takacs, Guillermo C. Bazan & Alan J. Heeger, Nature Materials 11, 44-48 (2012)). In order to minimize domain formation, the solvent 1,8-diiodooctane is added to the coating solution. The use of the non-electroluminescent non-crystallizable molecular glass mixture of this invention will stabilize this system and provide a stable photovoltaic cell.

EXAMPLES

The following examples illustrate the preparation of the mixtures of the invention. Glass transition temperatures are determined by differential scanning calorimetric analysis at a heating rate of 10° Celsius per minute (° C./min) or 20° C./min as specified. Characterization of the components composition is determined by high performance liquid chromatography (HPLC) analysis. Photophysical and electrophysical properties may be measured using various techniques well known to those skilled in the art, including photoluminescence, fluorescence and phosphorescence spectra, cyclic voltammetry, and time of flight mobility measurements.

General Procedure

An important object of this invention is to provide a method of providing amorphous, non-electroluminescent, nonpolymeric molecular glass mixtures that can be easily purified by simple and economic processes. Truly amorphous materials by definition cannot be recrystallized. Thus because of that it is very difficult, or perhaps potentially costly to purify amorphous molecular glass mixtures containing high level of impurities and other compositions.

Accordingly, this invention only uses reactions that
1) are quantitative, i.e above 99% completion;
2) with either no byproducts;
3) or with byproducts that can be easily solubilized in water and extracted efficiently.

Furthermore the procedure of this invention calls for pre purification of all starting materials by either recrystallization or distillation to purity level required for poly-condensation reactions. This procedure eliminates the transport of unwanted impurities from any of the starting materials to the produced amorphous molecular glass mixtures.

The reactions used by the present invention include:
1 reactions of purified acid chloride with purified alcohol to produce ester glass mixtures or with purified amines to produce amide glass mixtures, where the by product is hydrochloric acid that can be either volatilized from the reaction mixture, neutralized by base to water soluble salts extractable by water and other aqueous solvents, or volatilized and neutralized;
2 reactions of purified isocyanates with purified alcohol to produce urethane glass mixtures, or with purified amines to produce urea glass mixtures; these reactions are quantitative and have no appreciable byproducts; and
3 reactions of purified anhydrides and amines to produce imide glass mixtures; these reactions are quantitative with water as the byproduct.

The following are examples of reaction procedures.

1. Preparation of Non-Electroluminescent, Non-Crystallizable Molecular Glass Mixtures To a 1 liter (L) three-necked round-bottomed flask, fitted with a condenser are added the proper volume of anhydrous n-methylpyrrolidone (NMP) solvent. A mixture of three recrystallized monoamines (one molar equivalent) was mixed with one molar equivalent of recrystallized tetracarboxylic dianhydride, and two molar equivalents of isoquinoline (catalyst) are added to the flask.

The mixture is gently heated to 70° C. under stirring for 2 hours, followed by refluxing for 5 hours. Thereafter, the reaction solution is poured into a mixture of methanol and dilute hydrochloric acid under vigorous stirring, yielding a molecular glass powder. The molecular glass is filtered, re-dissolved in NMP and re-precipitated into a mixture of methanol and distilled water twice. The final precipitate is filtered, washed with methanol and dried under vacuum. The isolated material is characterized, using differential scanning calorimetry (DSC) for glass transition temperature, and liquid chromatography for composition. The "Component Equations" of Molaire are used to calculate the expecting composition based on the functionality of the multifunctional hole-transport material and the number of monovalent moiety. (*Organic Monomeric Glasses: A Novel Class of Materials*, M. F. Molaire et al, J of Polymer Science, Part A, Polymer Chemistry, Vol. 27, 2569-2592 (1989)).

The following is a representative but not exhaustive listing of specific examples of non-electroluminescent, non-polymeric molecular glass mixtures that can be prepared by the procedure above:

1. Non-electroluminescent, Non-crystallizable Glass Mixture 1: A glass mixture from the reaction of benzophenone-3,3', 4,4' tetracarboxylic dianhydride and three monoamines. The six components of this mixture are shown below

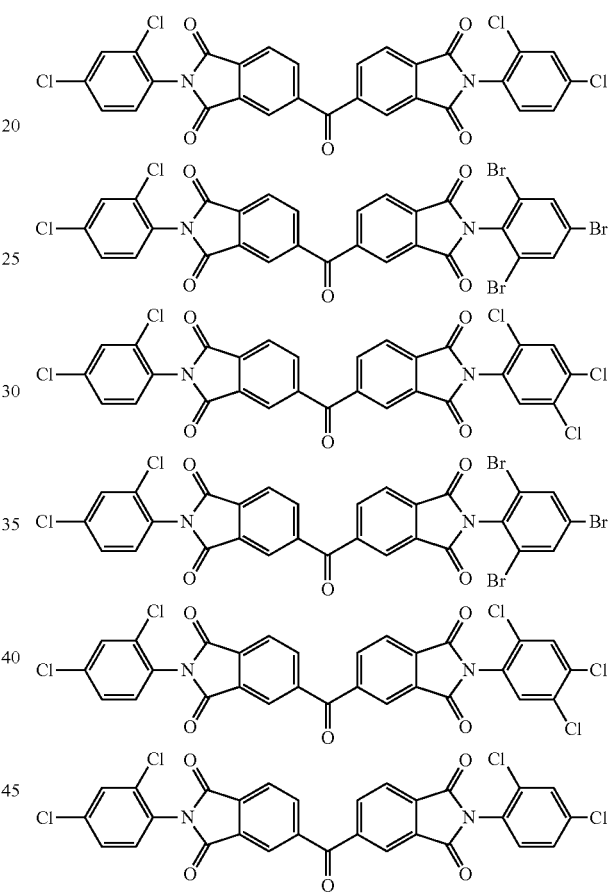

2. Non-electroluminescent, Non-crystallizable Glass Mixture 2: A glass mixture from the reaction of 4,4'(4,4'-Isopropylidenediphenoxy)bis(phtalic anhydride), and four monoamines. The ten components of this mixture are shown below:

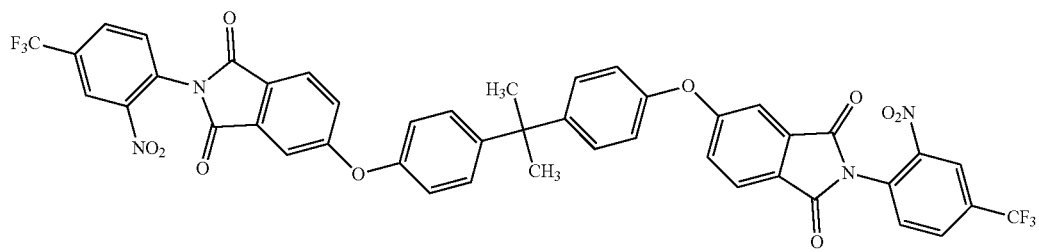

-continued
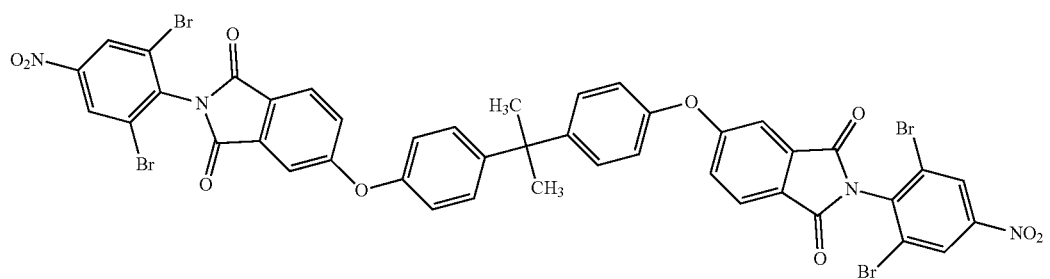
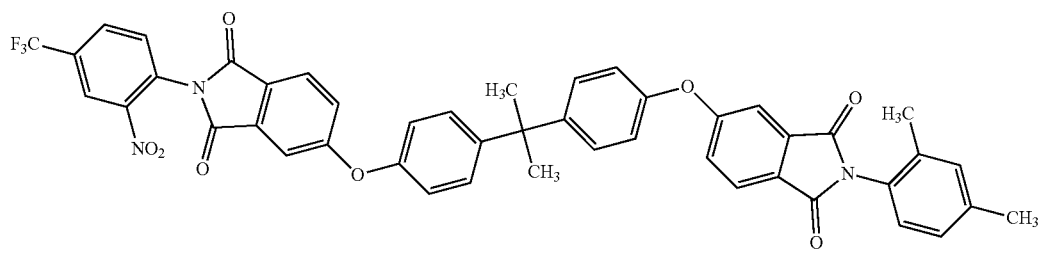
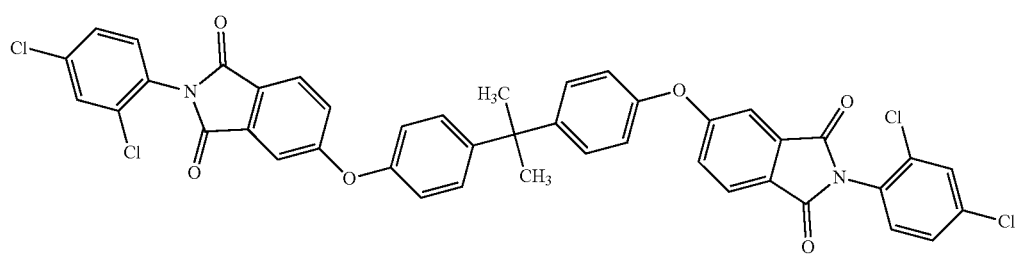
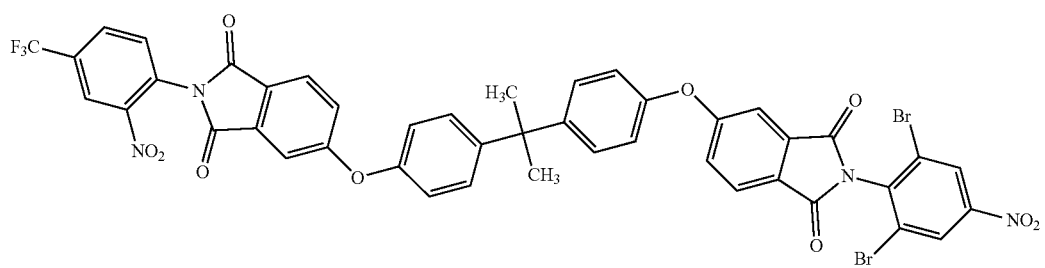
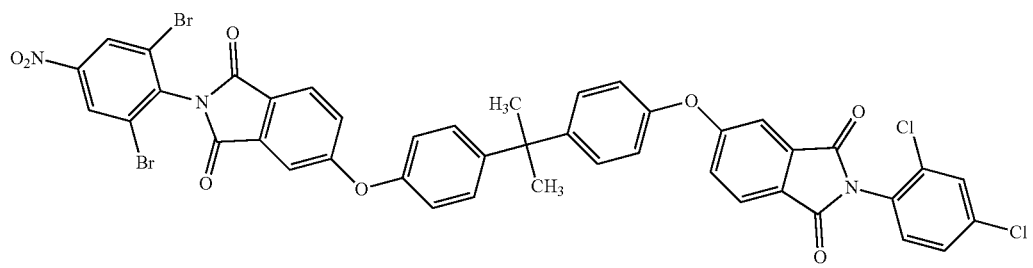
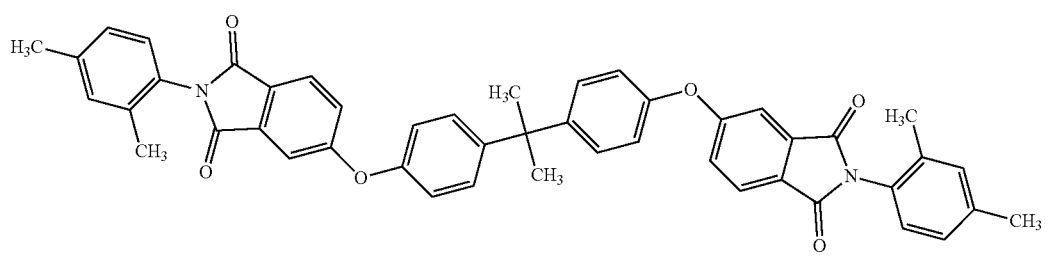

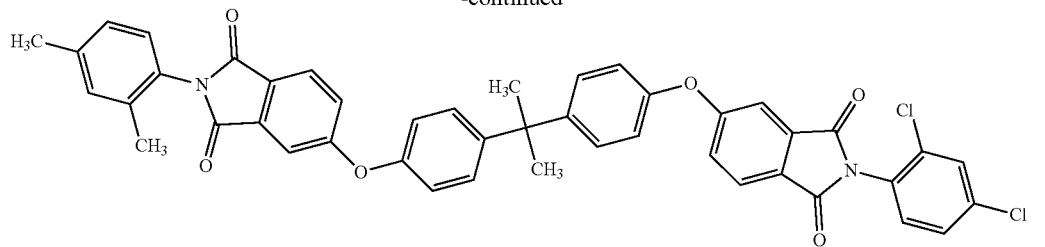
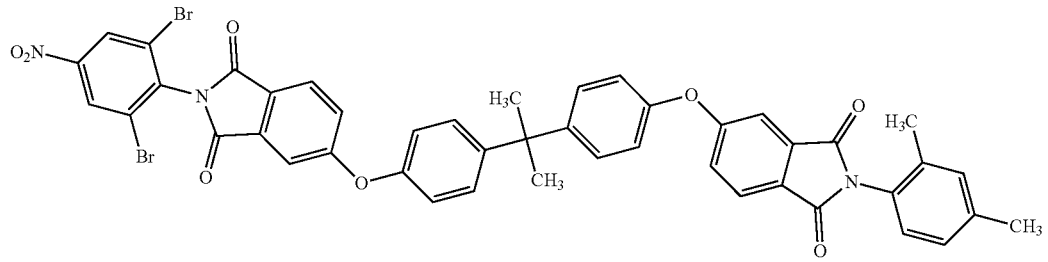
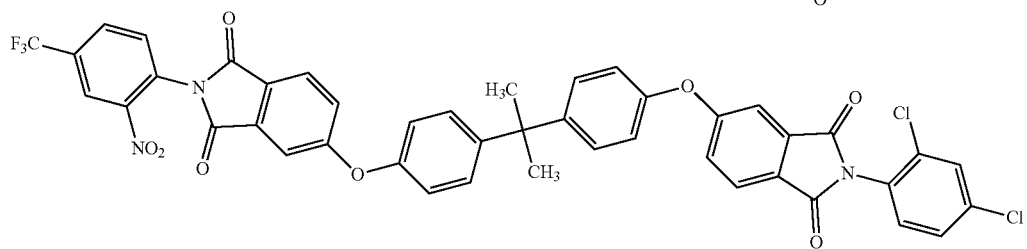
3. Non-electroluminescent, Non-crystallizable Glass Mixture 3: A glass mixture from the reaction of 4,4' (Hexafluoroisopropylidene) diphthalic anhydride) and five monoamines. The fifteen (15) components of this mixture are shown below:
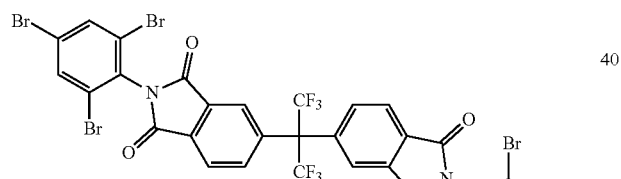
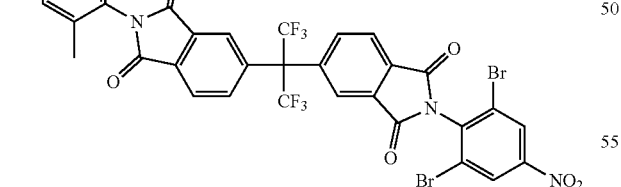
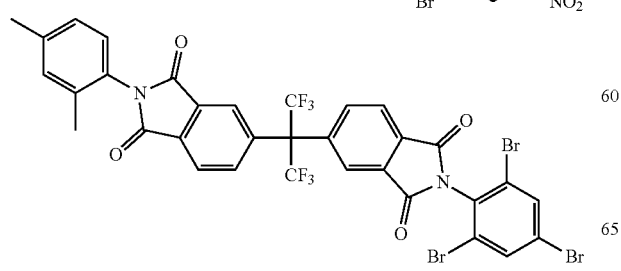
-continued
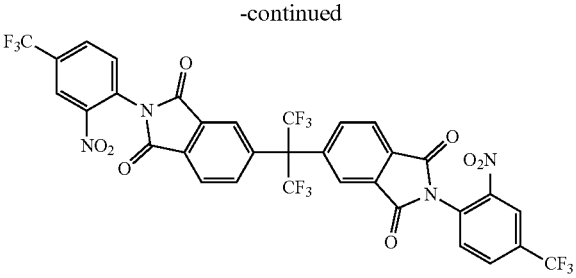
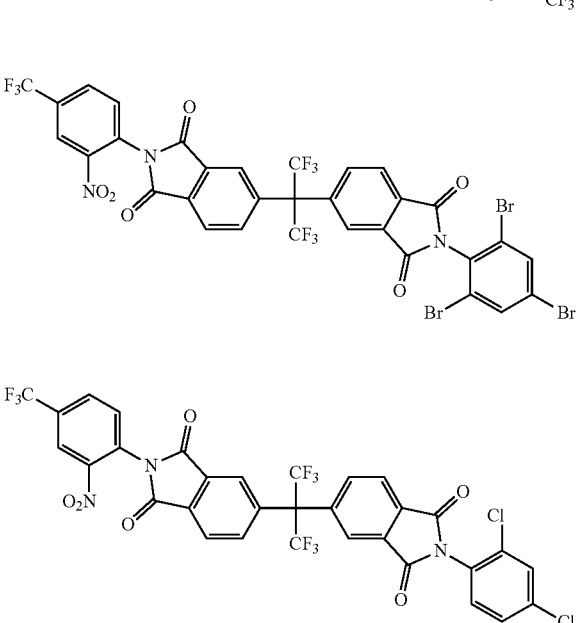

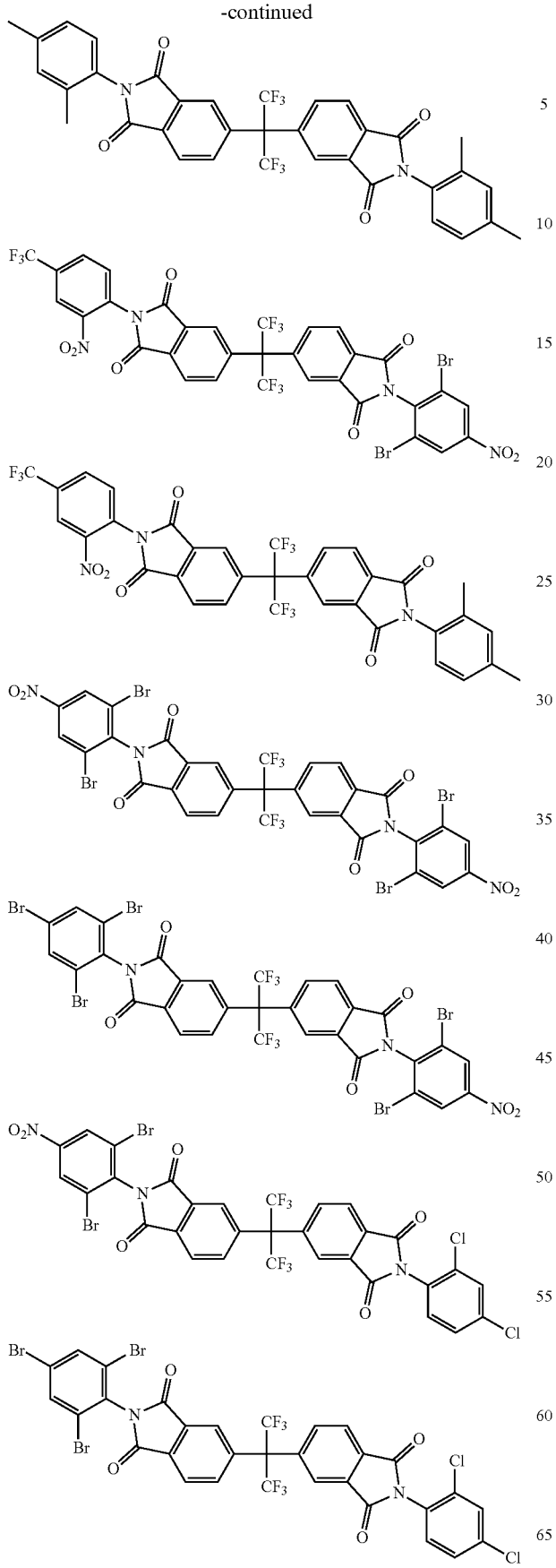
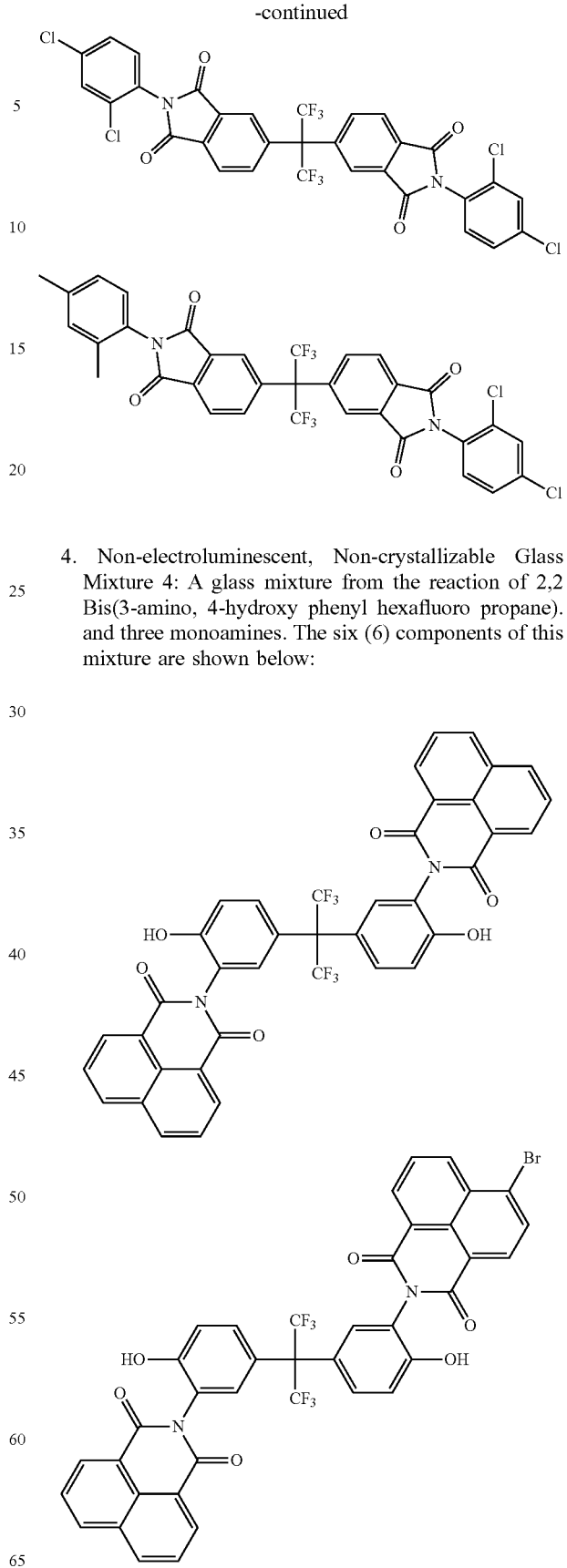
4. Non-electroluminescent, Non-crystallizable Glass Mixture 4: A glass mixture from the reaction of 2,2 Bis(3-amino, 4-hydroxy phenyl hexafluoro propane). and three monoamines. The six (6) components of this mixture are shown below:

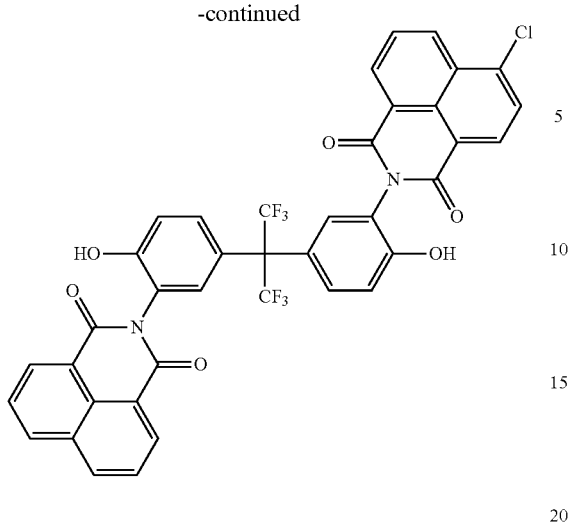
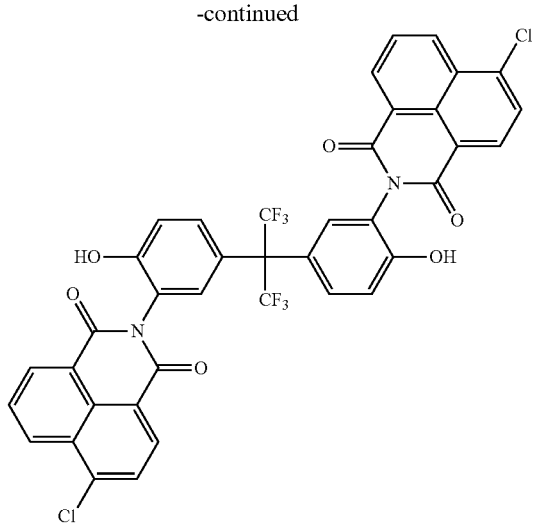

Procedure for the Preparation of Crosslinkable/Polymerizable-Non-Electroluminescent, Non-Crystallizable Molecular Glass: Molecular Glass Mixture 5

In a 500 milliliter (ml) three-necked round-bottomed flask, fitted with a condenser are added 300 ml of anhydrous NMP solvent. One equivalent of Glass Mixture 4 (described above) is added to the solvent in the flask along with 2.1 equivalent of triethylamine. Two equivalents of distilled acryloyl chloride are dissolved in NMP and added dropwise to the mixture in the flask. After complete addition the reaction mixture is handled as in example 4 above. The six (6) components of the crosslinkable/polymerizable molecular glass mixture are shown below:

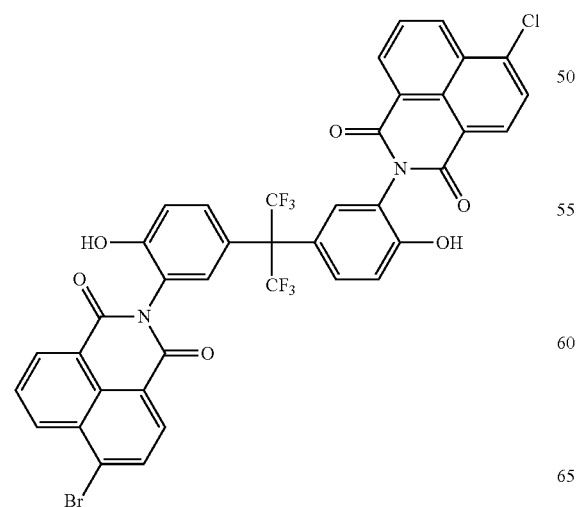
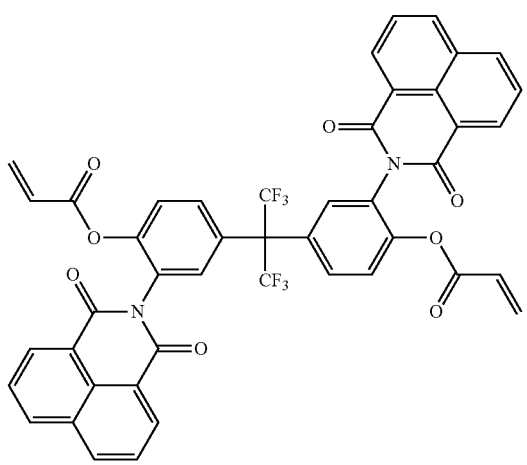

-continued

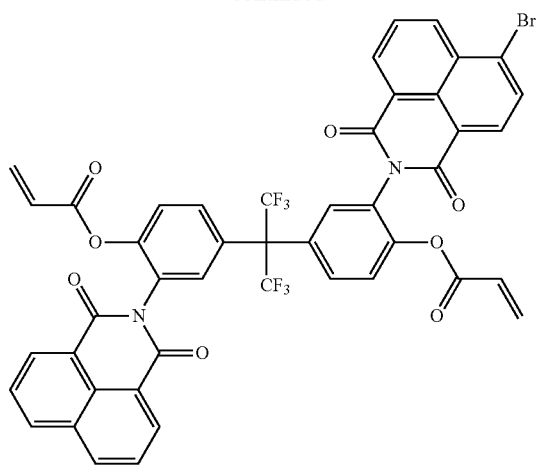

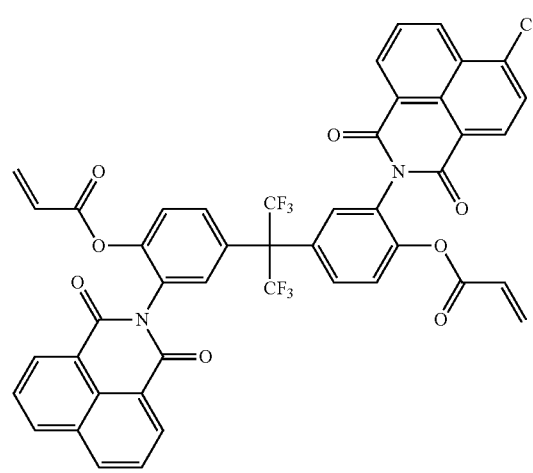

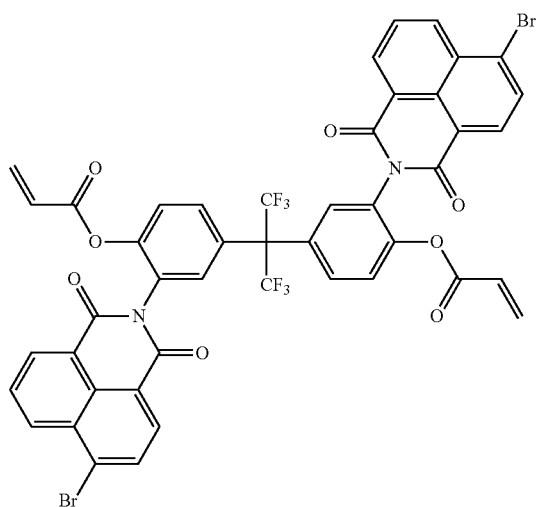

-continued

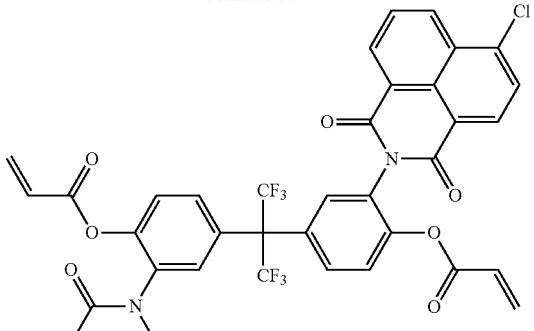

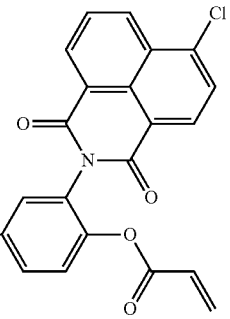

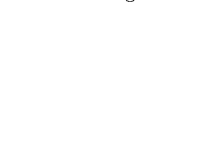

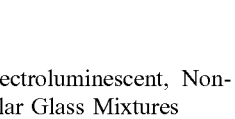

Reaction Procedure for Non-Electroluminescent, Non-Crystallizable Amide/Ester Molecular Glass Mixtures In a 500 milliliter three-necked round-bottomed flask, fitted with a condenser are added 300 ml of anhydrous NMP solvent. Then one molar equivalent of a mixture of recrystallized mono amines and a slight excess of tri-ethylamine with stirring, under a nitrogen positive atmosphere are added.

Then a molar equivalent of recrystallized aromatic multicabonyl chloride 1,3,5-benzenetricarbonyl trichloride dissolved in 50 ml of anhydrous NMP are added to the reaction mixture very slowly from an addition funnel. After complete addition the mixture is stirred at room temperature for three hours. Afterward the solution is drowned into one liter of deionized water. The solid is filtered and re-dissolved into dichloromethane (about 200 ml) and subjected to the following extraction sequence: two dilute sodium hydroxide solution washes (2% cold);

two dilute hydrochloric acid solution washes; then
two distilled-water washes.

The dichloromethane solution is then dried over magnesium sulfate. The solvent is stripped off under vacuum at approximately 90° C. Complete removal of the dichloromethane is very important. A mixture of alcohol and an aprotic water-miscible solvent such as THF, acetone is chosen to dissolve the dried amorphous mixture. The resulting solution is precipitated into a large volume of water. The filtered solid is dried at a temperature about 20° C. below the glass transition temperature of the final molecular glass mixture, in an air-circulating oven.

6. Non-Electroluminescent, Non-Crystallizable Glass Mixture 6: A glass mixture from the reaction of 1,3,5-Benzenetricarbonyl trichloride and three monoamines. The nine (9) components of this mixture are shown below

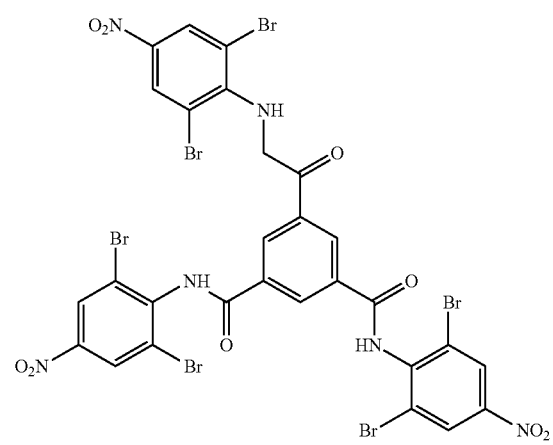

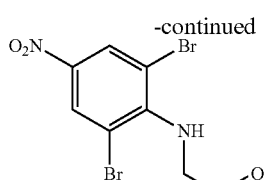
-continued
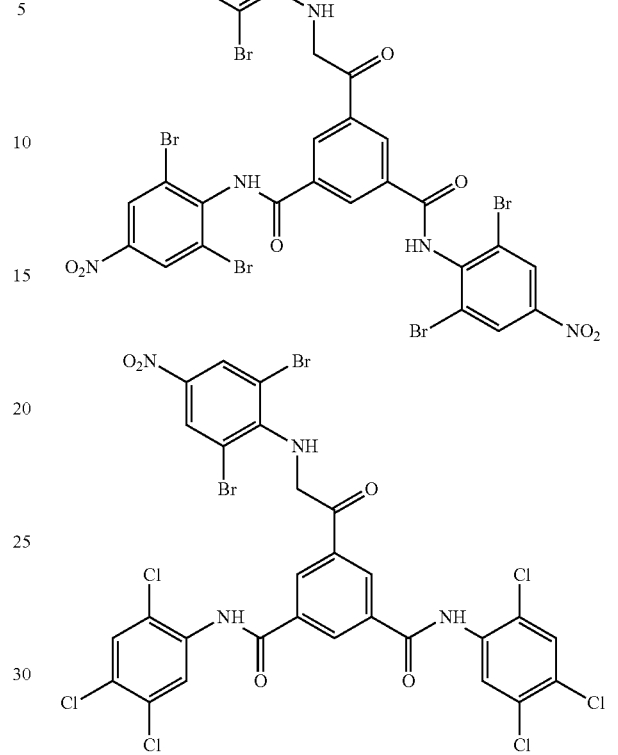

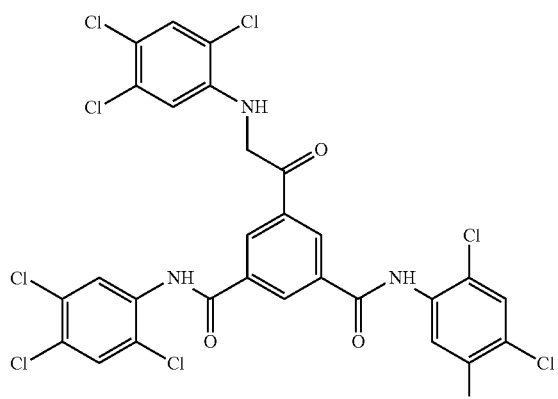

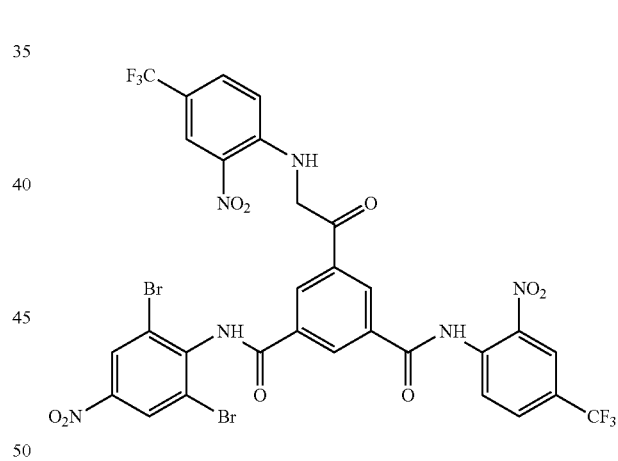

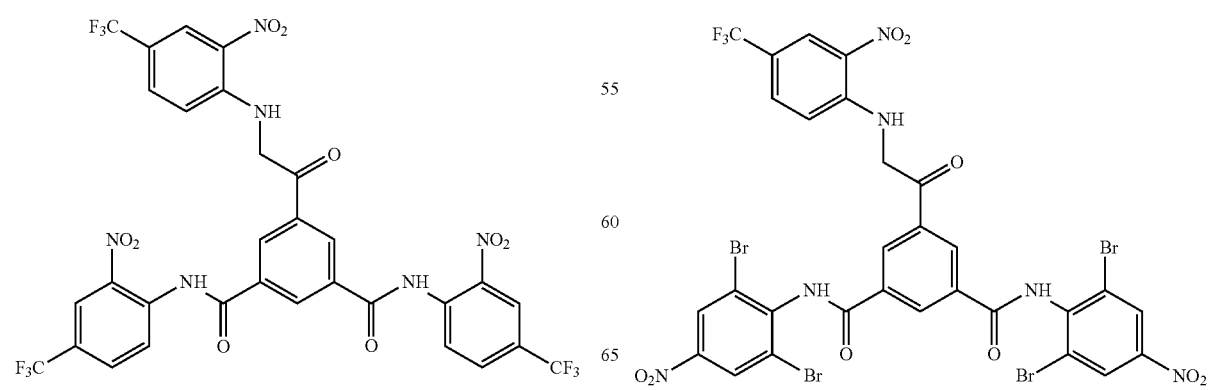

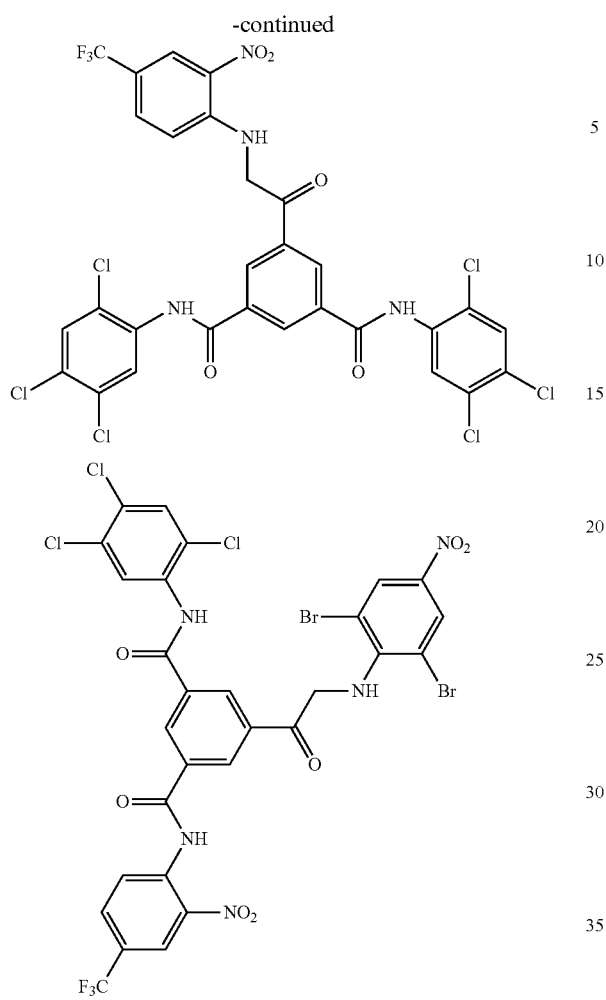

Reaction Procedure for Non-Electroluminescent, Non-Crystallizable Glass Mixtures Via Coupling Reactions:

One equivalent of a halogen multi-substituted aromatic compound is mixed with one equivalent of a mixture of at least two boronate ester mono-substituted charge transporting, luminescent, or charge transporting luminescent compounds, and 3 mole % of tetrakis(dimethylamino)diboron (XPhos Pd G2) catalyst are added to a Schlenk flask, which is then purged under nitrogen. Dry THF and degassed 0.5M $K_3PO_4$ are added to the reaction flask under nitrogen. The flask is sealed, heated to 40° C., and stirred overnight. Three extracts of diethyl ether are collected and filtered twice through silica gel. The solution is evaporated with a rotovap and the resulting oil is dissolved in a small amount of dichloromethane and crashed out of an appropriate volume of heptane. This reaction can also be carried out where the multifunctional compound is a multi boronate (or boronic acids) and the monofunctional compounds are mono-halogenated. Examples of Non-electroluminescent, Non-polymeric Glass Mixtures made using this procedure are shown below in examples 7 through 10 described directly below.

7. Non-Electroluminescent, Non-Crystallizable Molecular Glass Mixture 7: A glass mixture from the reaction of 1,3-dibromoadamantane and three isomeric biphenylboronic acids. The six (6) components of this mixture are shown below:

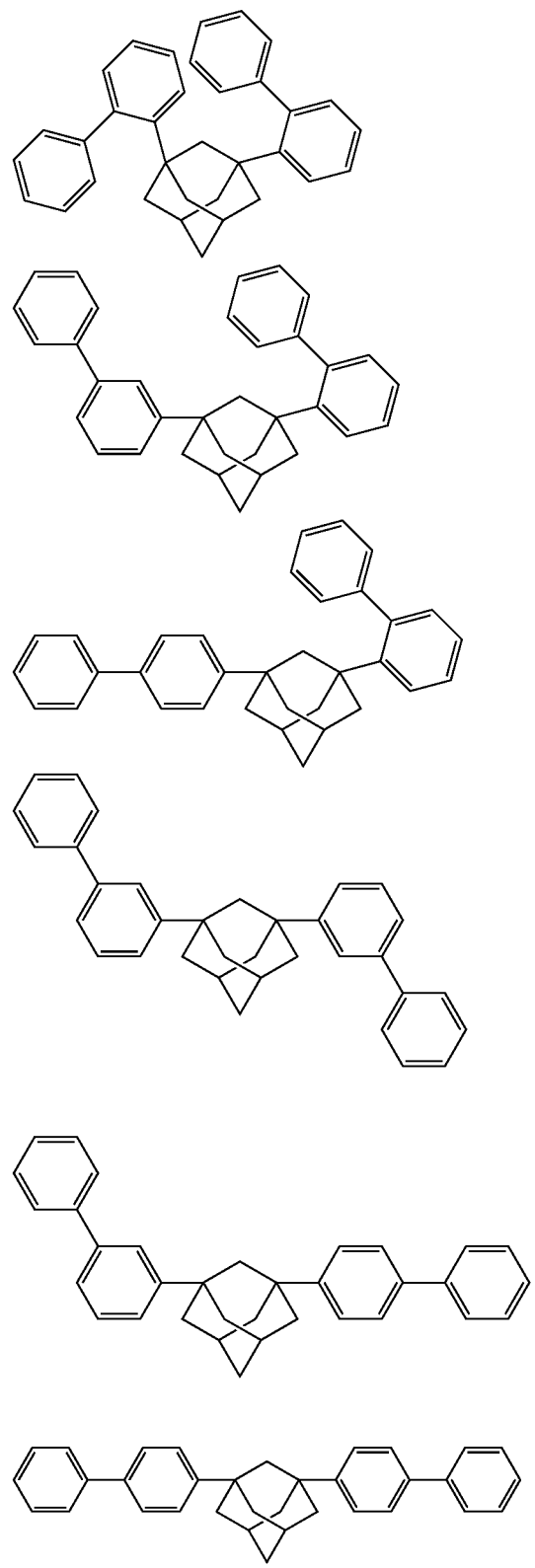

8. Non-Electroluminescent, Non-Crystallizable Glass Mixture 8: A glass mixture from the reaction of 1,3-dibromoadamantane and three substituted phenylboronic acids The six (6) components of this mixture are shown below:

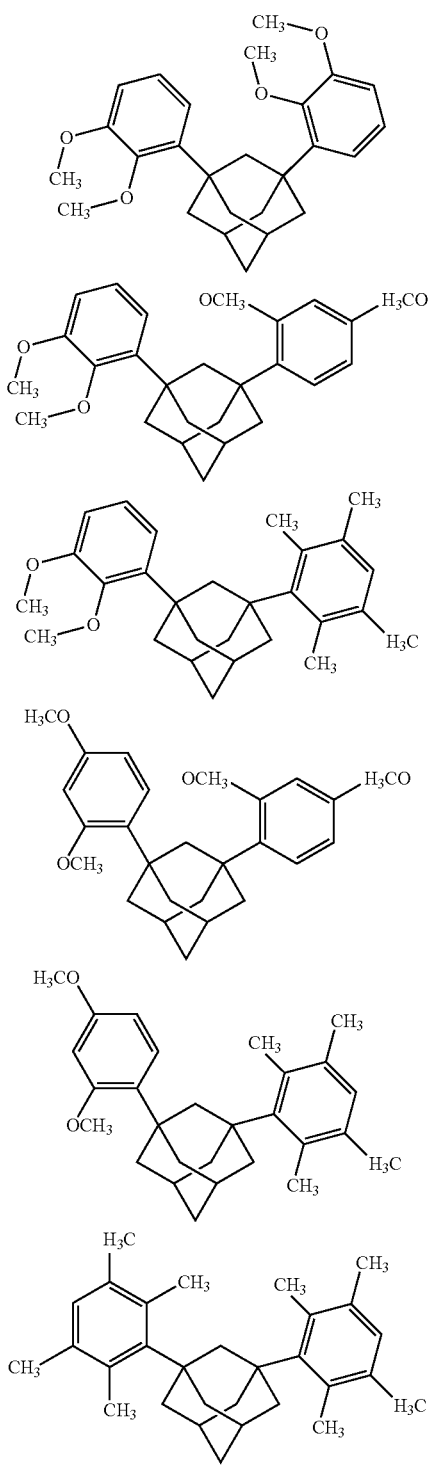

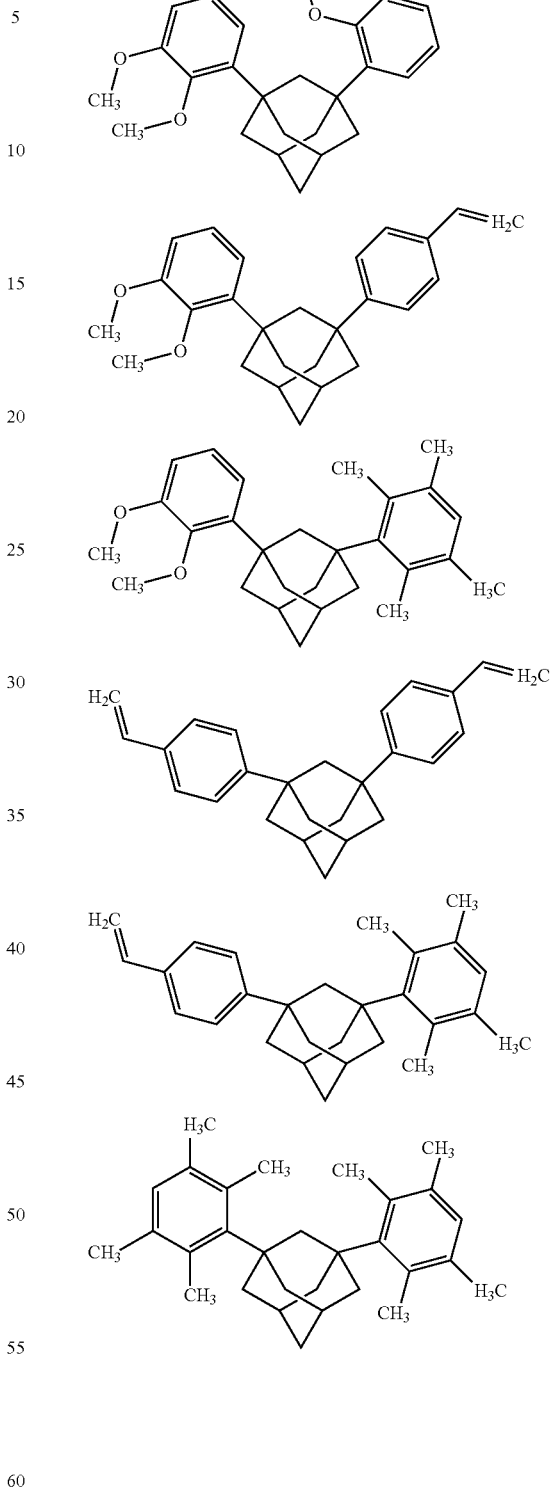

9. Non-Electroluminescent, Non-Crystallizable Glass Mixture 9: A glass mixture from the reaction of 1,3-dibromoadamantane, three substituted phenylboronic acids, and styrene boronic acid. The six (6) components of this mixture are shown below:

10. Non-Electroluminescent, Non-Crystallizable Glass Mixture 10: A glass mixture from the reaction of tetrabromobisphenol A dimethyl ether and two substituted phenylboronic acids. The seven (7) components of this mixture are shown below:

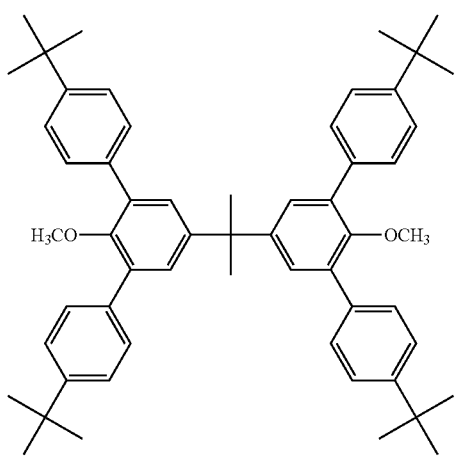
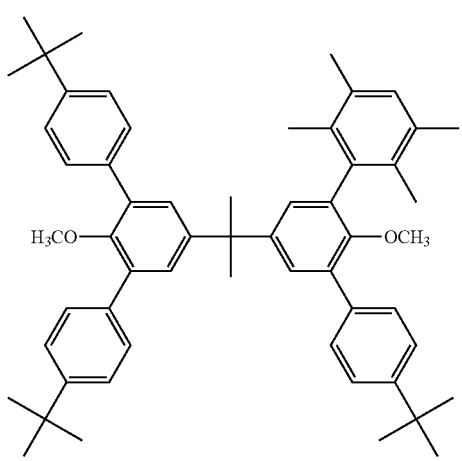
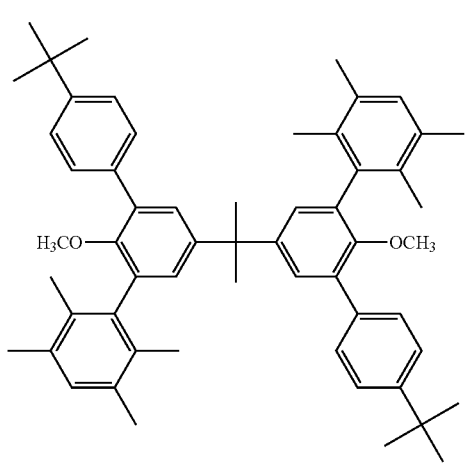
-continued
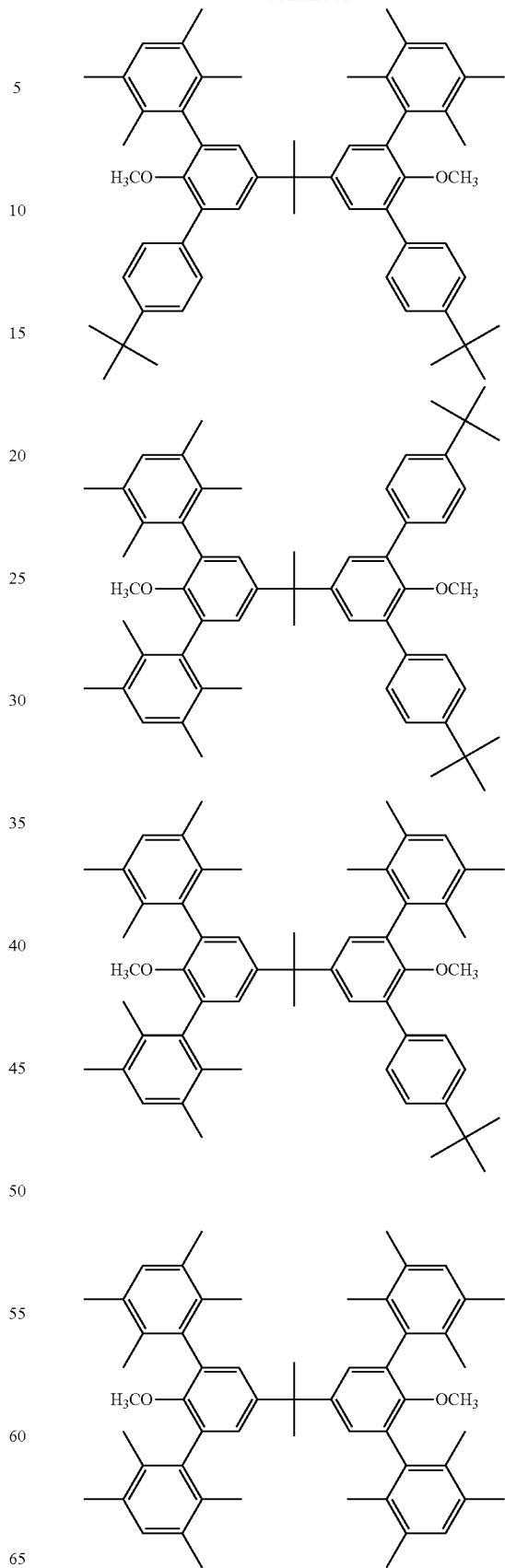

EXAMPLES OF THE INVENTION

Example 1: Preparation of the Glass Mixture
Example 1

Recystallized 3',3",5', 5"-tetrabromobisphenol A 178.3894 g (0.328 mole), distilled isobutyryl chloride 13.98 g (0.1312 mole), distilled benzoyl chloride 18.44 (0.1312 mole), and distilled 4-bromobenzoyl chloride 14.397 g (0.0656 mole), all are dissolved in approximately 1 liter of 1,2-dichloroethane, in a three-neck, round-bottomed flask. A condenser fitted with a drying tube and a positive-pressure nitrogen system is used to keep moisture out of the reactor vessel.

Triethylamine 70.5 g (0.697 mole) dissolved in 100 ml of 1,2-dichloroethane is added dropwise to the stirred solution in the reaction flask. After complete addition of the triethylamine, the reaction is allowed to continue for three additional hours at which time the precipitated salt is filtered off. The solution is subjected to the following extraction sequence:

a) two dilute sodium hydroxide solution washes (2% cold);

b) two dilute hydrochloric acid solution washes (4%); then c) two distilled water washes.

The dichloroethane solution is then dried over magnesium sulfate and the solvent removed by evaporation at 90° C. under vacuum. To the dried amorphous glass 100 ml of tetrahydrofuran (THF) is added. The solution obtained is stirred into 4 liters of distilled water in a Waring blender to precipitate the product. The product is collected by filtration as very fine particles and dried. This is a modified Schotten-Bauman procedure, designed to increase the probability of mixed ester formation. The conventional Schotten-Bauman procedure involves dissolving the acid acceptor and the bisphenol in the flask and adding the acid chloride to the mixture. By having the bisphenol and the acid chlorides present in the complete stoichiometry and adding the acid acceptor to the mixture, we increase the probability of unsymmetrical ester formation and at the same time decrease the formation of symmetrical esters. This allows us to control the "noncrystallizability" of the finished mixture. The six components of the mixture are shown below:

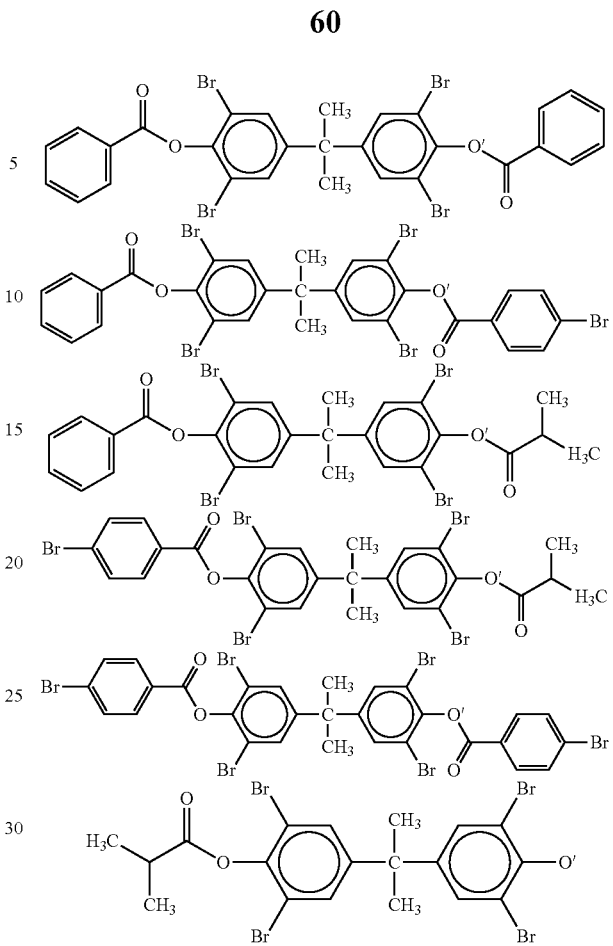

Example 2: Preparation of the Glass Mixture
Example 2

In a 500 milliliter three-necked round-bottomed flask, fitted with a condenser were added 400 ml of anhydrous NMP solvent. Then 15.56 g (0.030 mole) of recrystallized 2,2-Bis[(4-aminophenoxy)phenyl]hexafluoropropane (HF-BAPP) (Akron Polymer Systems) and 17.65 g (0.060) mole) of diphenyl-2,3,3',4'-tetracarboxylic dianhydride (a-BPDA)) (Akron Polymer Systems), and 8.52 (0.066 mole) of isoquinoline (catalyst) were added. The mixture was gently heated to 70° C. under stirring for 2 hours. The intermediate mixture is shown below

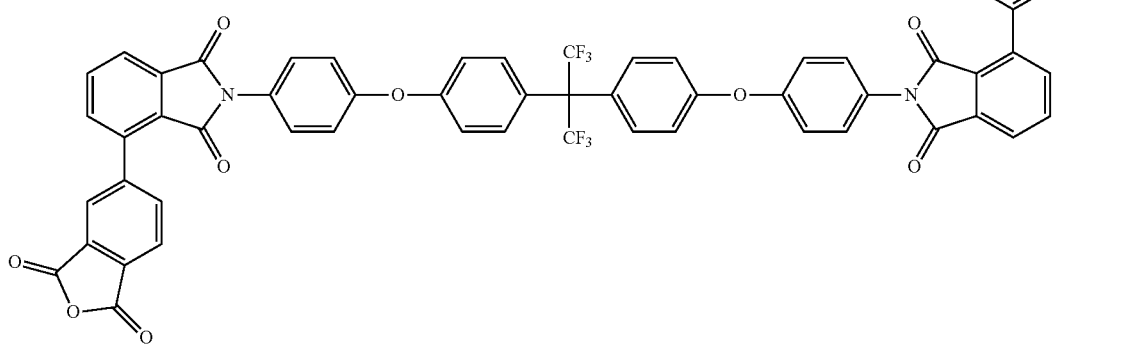

-continued

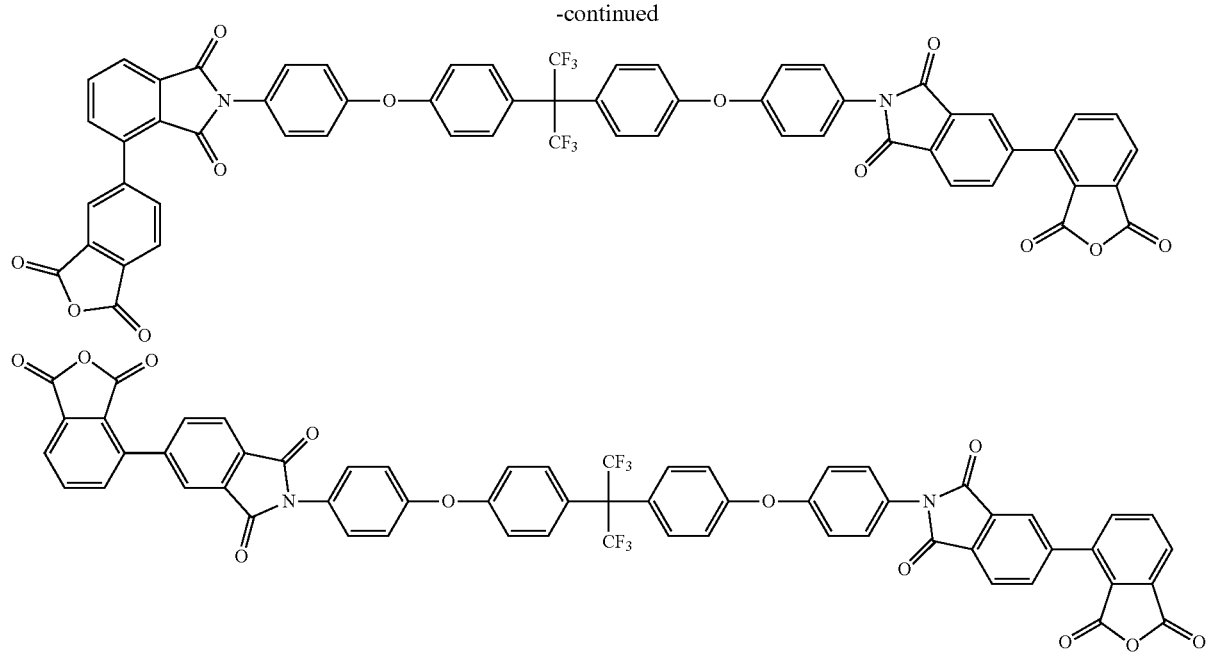

Plus Minor Concentration of Oligomers

Then 5.08 g (0.03 mole) of recrystallized 2-aminobiphenyl (Aldrich), and 8.43 g (0.03 mole) of recrystallized 2,5-dibromonitrobenzene (Aldrich) were added to the reaction vessel. The mixture was gently heated to 70° C. under stirring for another 2 hours, followed by refluxing for 5 hours. Thereafter, the mixture was poured into a mixture of methanol and dilute hydrochloric acid under vigorous stirring to give a molecular glass powder. The molecular glass was filtered, re-dissolved in NMP and re-precipitated into a mixture of methanol and distilled water twice filtered and dried. Finally the precipitate was dissolved into dichloromethane and precipitated into adequate volume of heptane with vigorous stirring, washed with fresh heptane and dried under vacuum. The 10 components of the molecular glass mixtures are shown below.

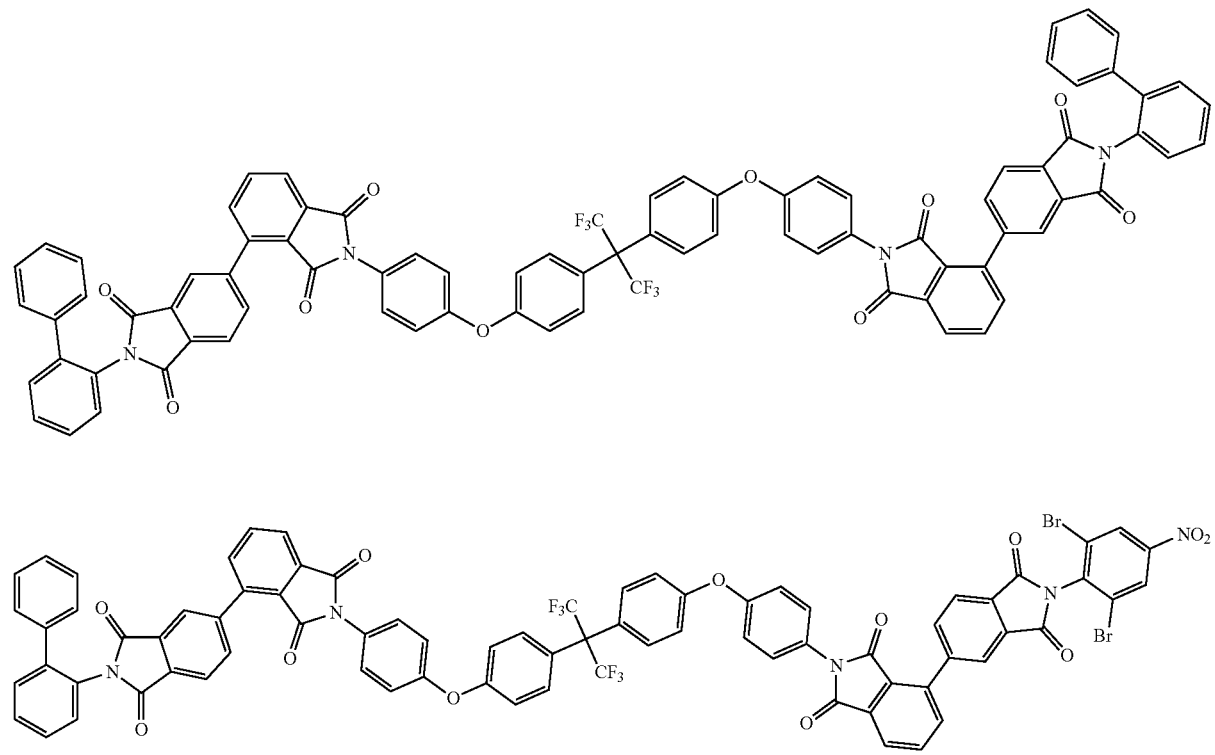

-continued
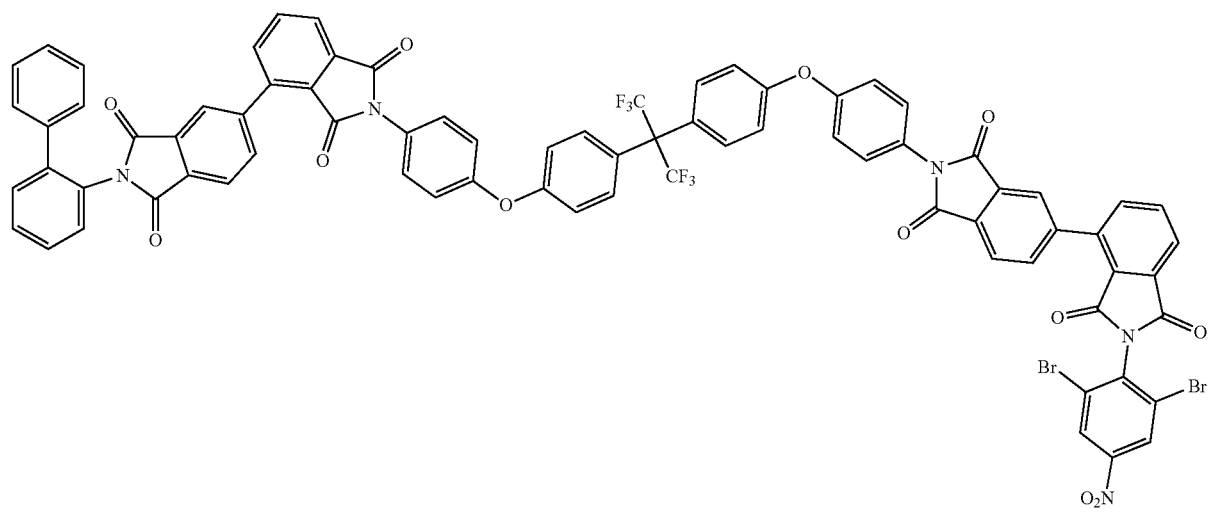
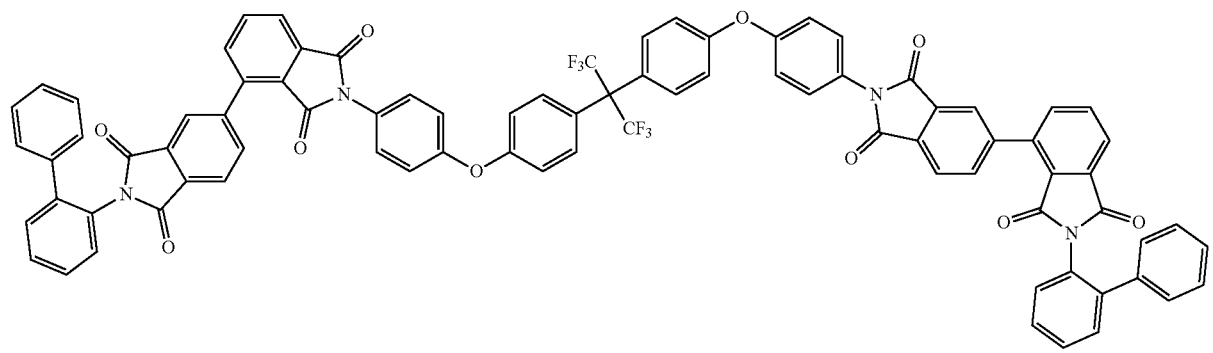
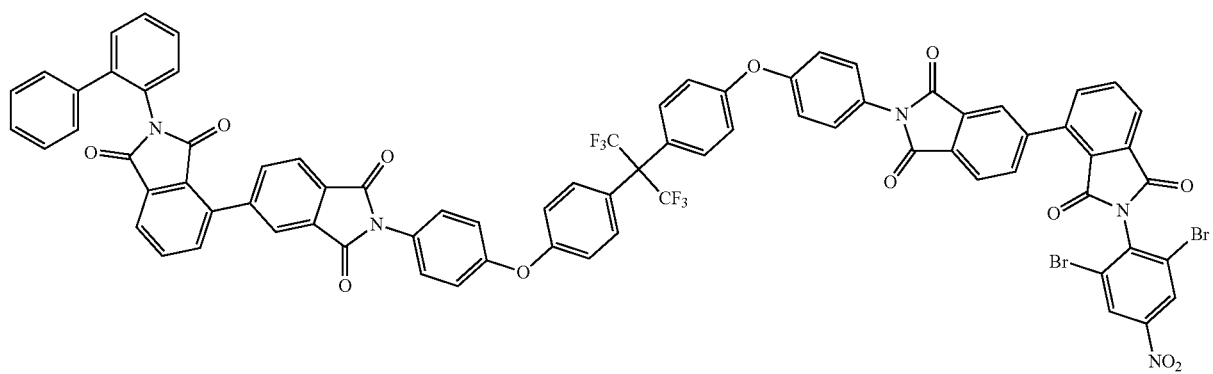

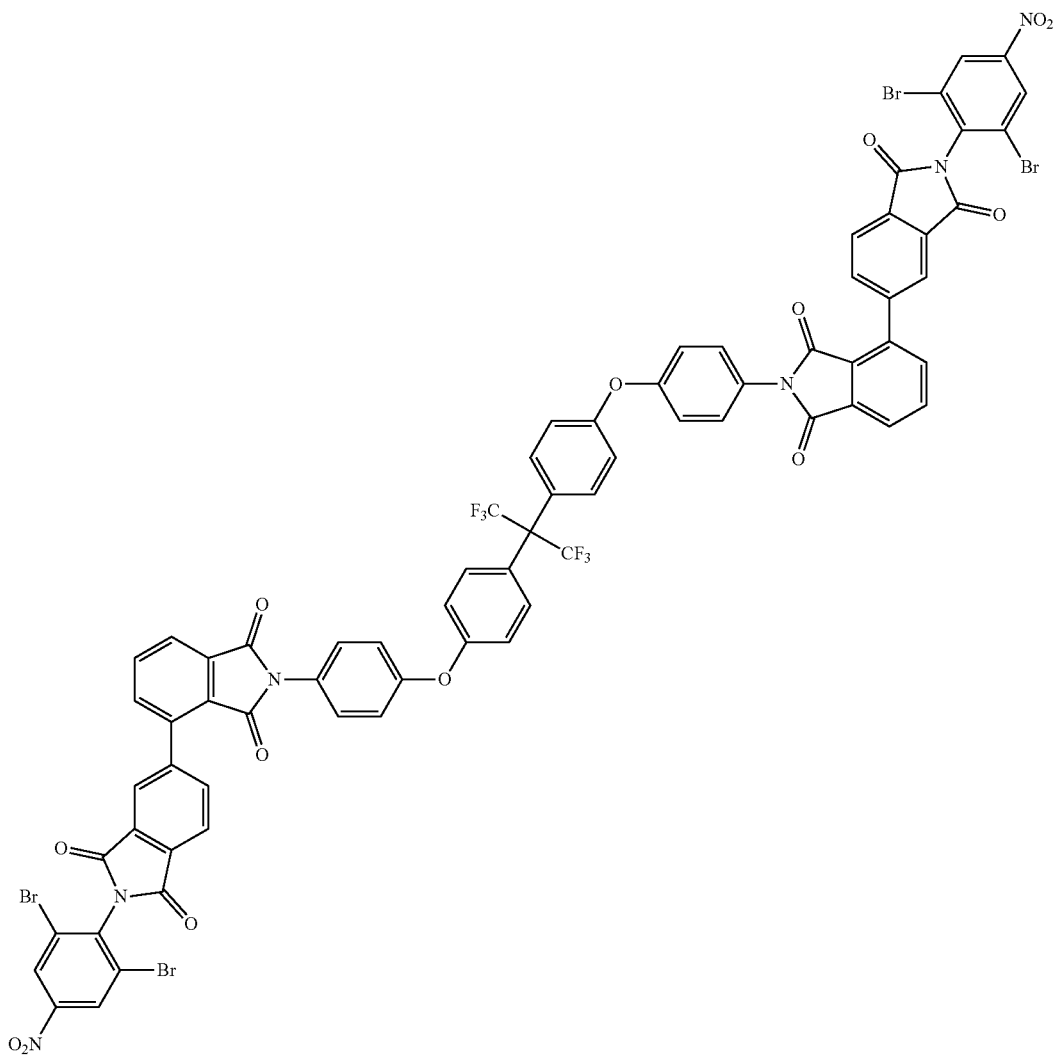

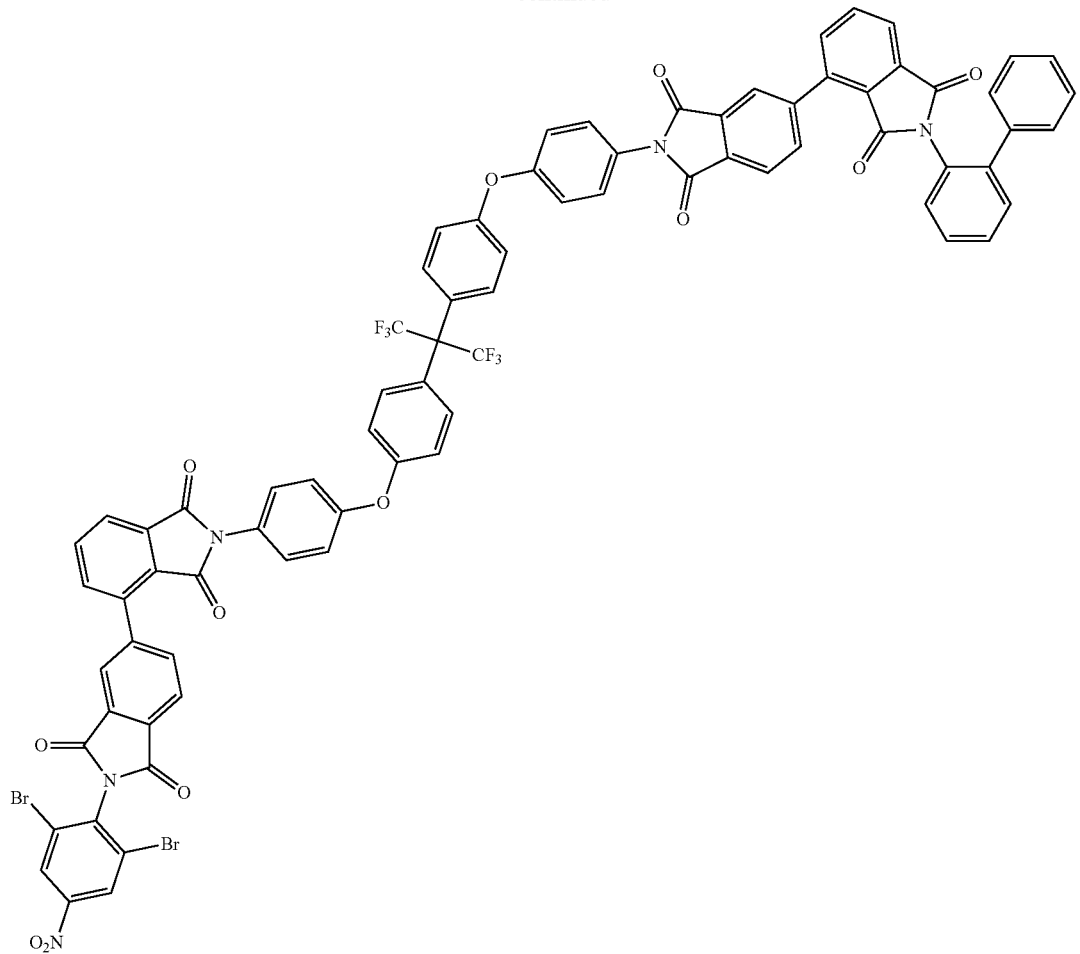
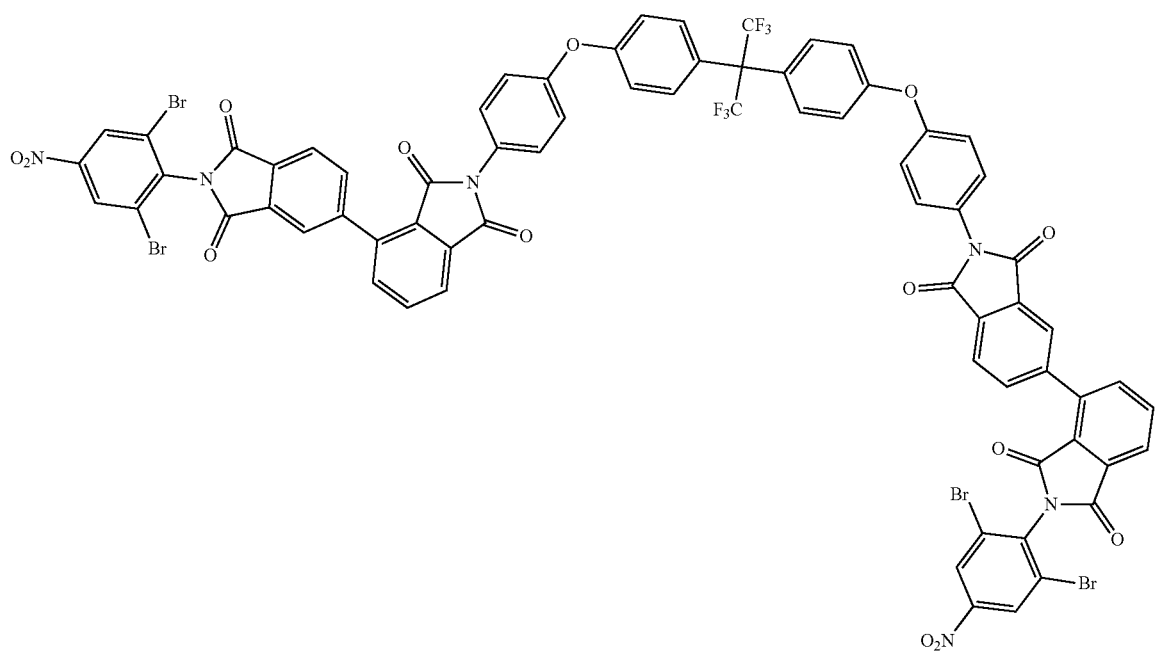

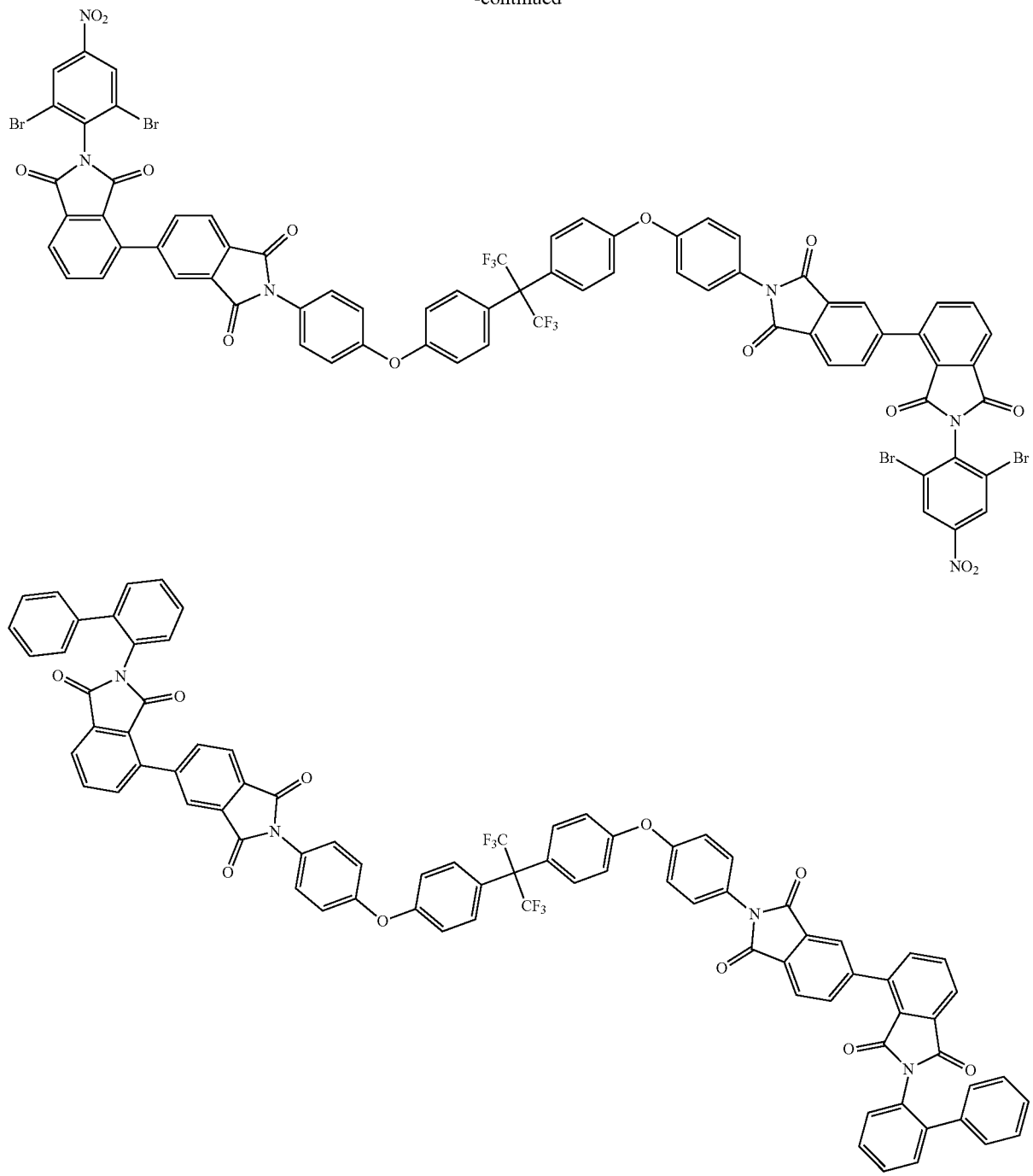

Plus a Minor Concentration of Oligomers

Example 3 Compatibility of 2-(4-tert-Butylphenyl)-5-(4-biphenylyl)-1,3,4-oxadiazole, "ButylPBD" and Molecular Glass Mixture Example 1

Figure 4:
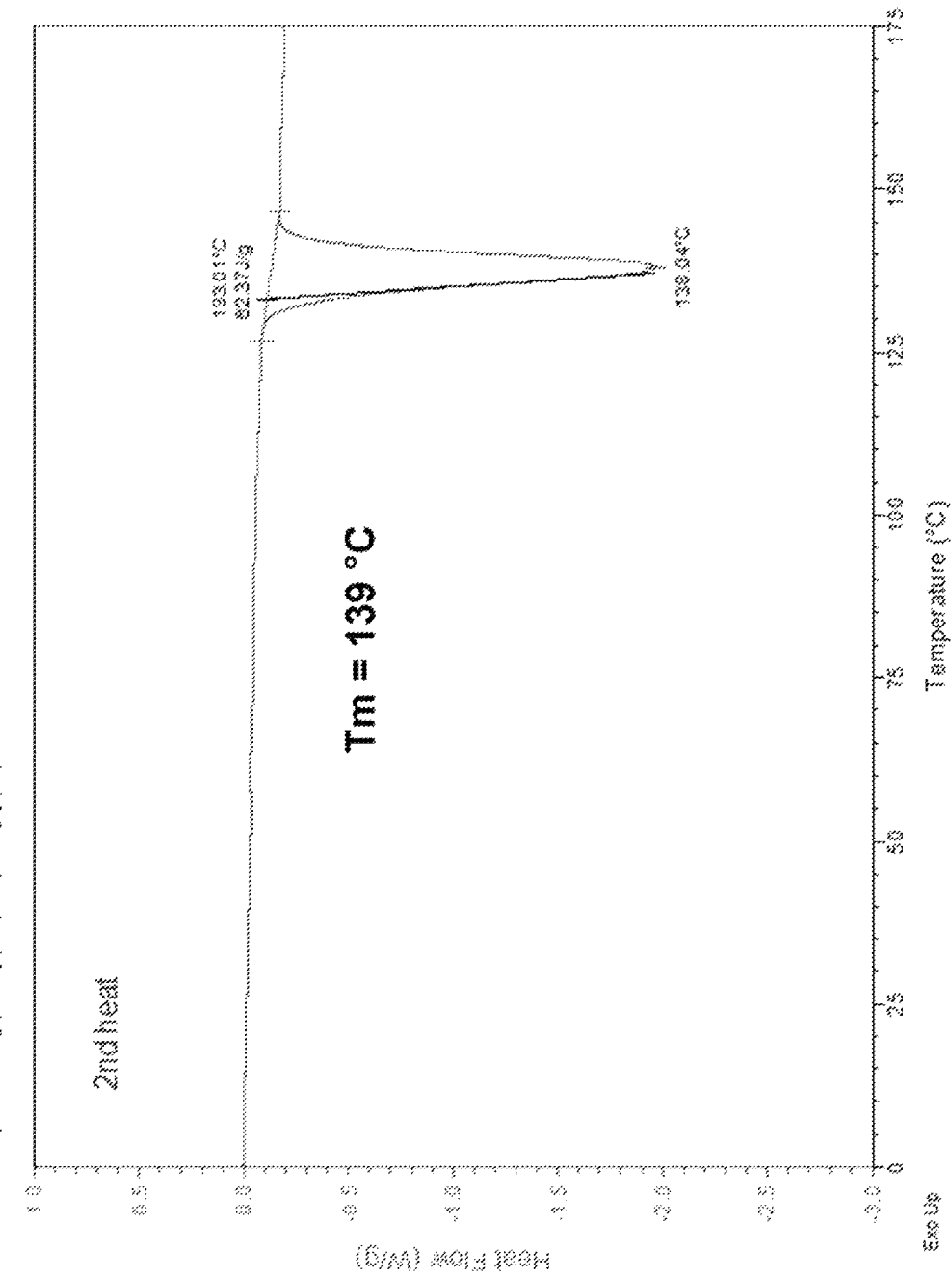
FIG. 4 shows the second DSC heat for neat 2-(4-tert-Butylphenyl)-5-(4-biphenylyl)-1,3,4-oxadiazole (ButylPBD)

Compatibility was assessed by differential scanning calorimetry (DSC) of mixtures of the two materials at a rate of 10° C./min under nitrogen at a flow rate of 50 cc/min. The two components were first weighed separately and then blended in the proper ratio by weight. The blend was then manually mixed, pulverized and remixed several times by hand in a glass petri dish. FIG. 4 shows the DSC scan ($2^{nd}$ heat) for neat ButylPBD. No glass transition temperature ($T_g$) is measured, even after all four runs. A sharp melting is seen at 138° C. These results are tabulated in Table 3. Also on Table 3 the results for Molecular glass mixture example 1 are show: no crystallization ($T_a$) and melting peaks (melt temperature ($T_m$)) after all four runs; only a $T_g$ is measured at 59° C.

Figure 5:
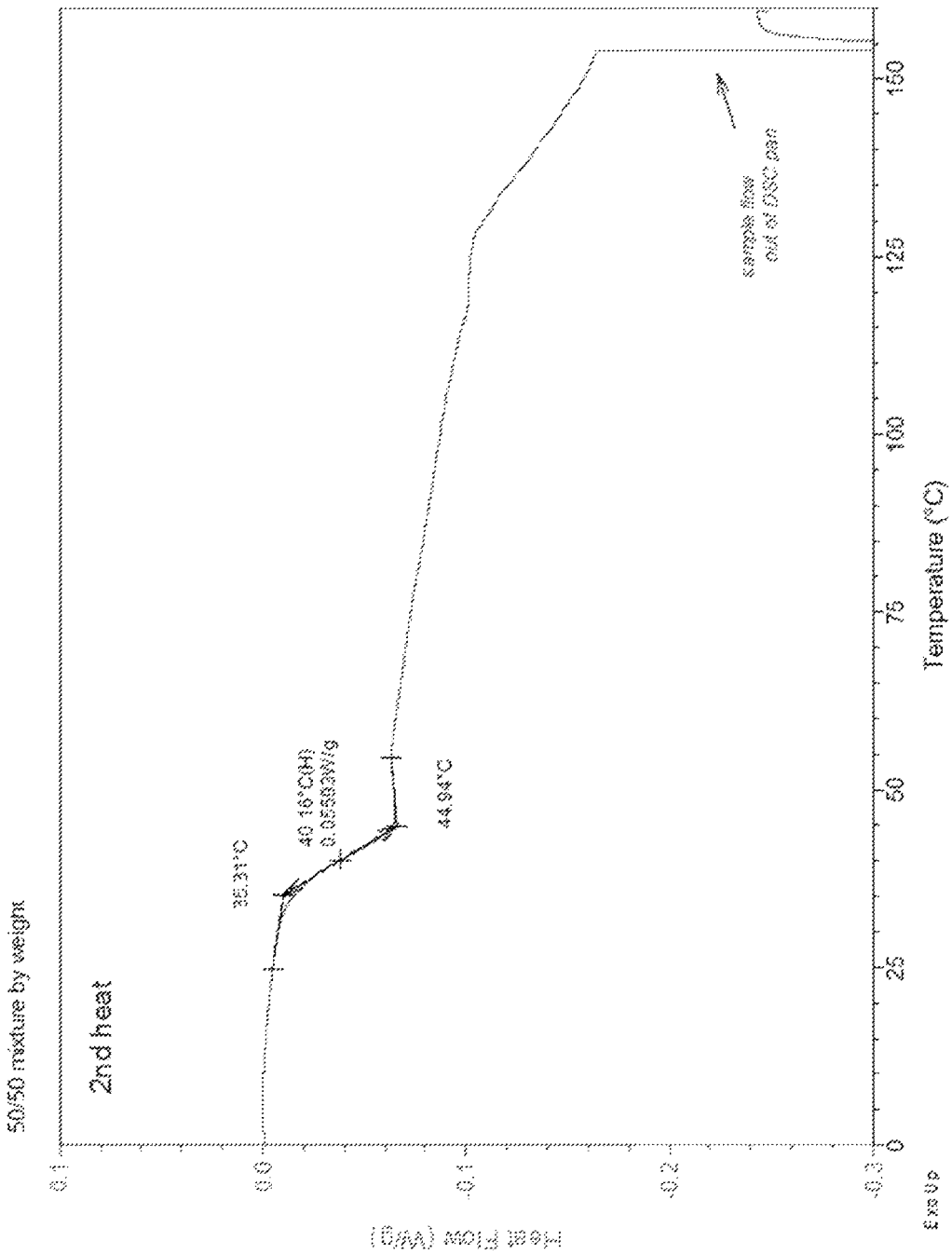
FIG. 5 shows the second DSC heat for 50/50 Weight/Weight (Wt/Wt) Glass Mixture Example 1 and ButylPBD.

The second DSC heat for the 50/50 mixture of molecular glass mixture example 1 and ButylPBD is shown on FIG. 5. Only a $T_g$ is measured at 60.2° C., no $T_m$, no $T_c$. Aa $T_g$ is measured at 62° C. in the third heat. These two compounds are fully compatible at 50/50 Wt/Wt. The Kwei equation (Anshvang A. Lin, T. K. Kwei, Arnost Reiser *Macromolecules,* 1989, 22 (10), pp 4112-4119) can be used to calculate Tg of the mixture (assuming compatibility):

$$1/Tg = \frac{Tg1}{wt1} + \frac{Tg2}{wt2} + \frac{Tg3}{wt3} + \ldots \quad (1)$$

wherein Tg is the glass transition temperature of the mixture, Tg1 is the Tg of component 1, Tg2 is the Tg of component 2, Tg3 is the Tg of component 3, Tgn is the Tg of component n, wt1 is the wt fraction of component 1 wt2 is the wt fraction of component 2, wt3 is the wt fraction of component 3, wt1 is the wt fraction of component 1, wtn is the wt fraction of component n.

TABLE 3

| Binder | Fluorescent Material | % Binder | $T_g$ °C. | Calculated $T_g$ °C. | $T_c$ °C. | $T_m$ °C. |
|---|---|---|---|---|---|---|
| Glass Mixture Example 1 | none | 100% | 59 | | none | none |
| none | ButylPBD | 0% | | | 61 | 138 |
| Glass Mixture Example 1 | ButylPBD | 50% | 42 | 42[a] | none | none |

Example 4 Compatibility of 4,4'-Cyclohexylidenebis[N,N-bis(4-methylphenyl)benzenamine, "TAPC" and Molecular Glass Mixture Example 1

Figure 6:
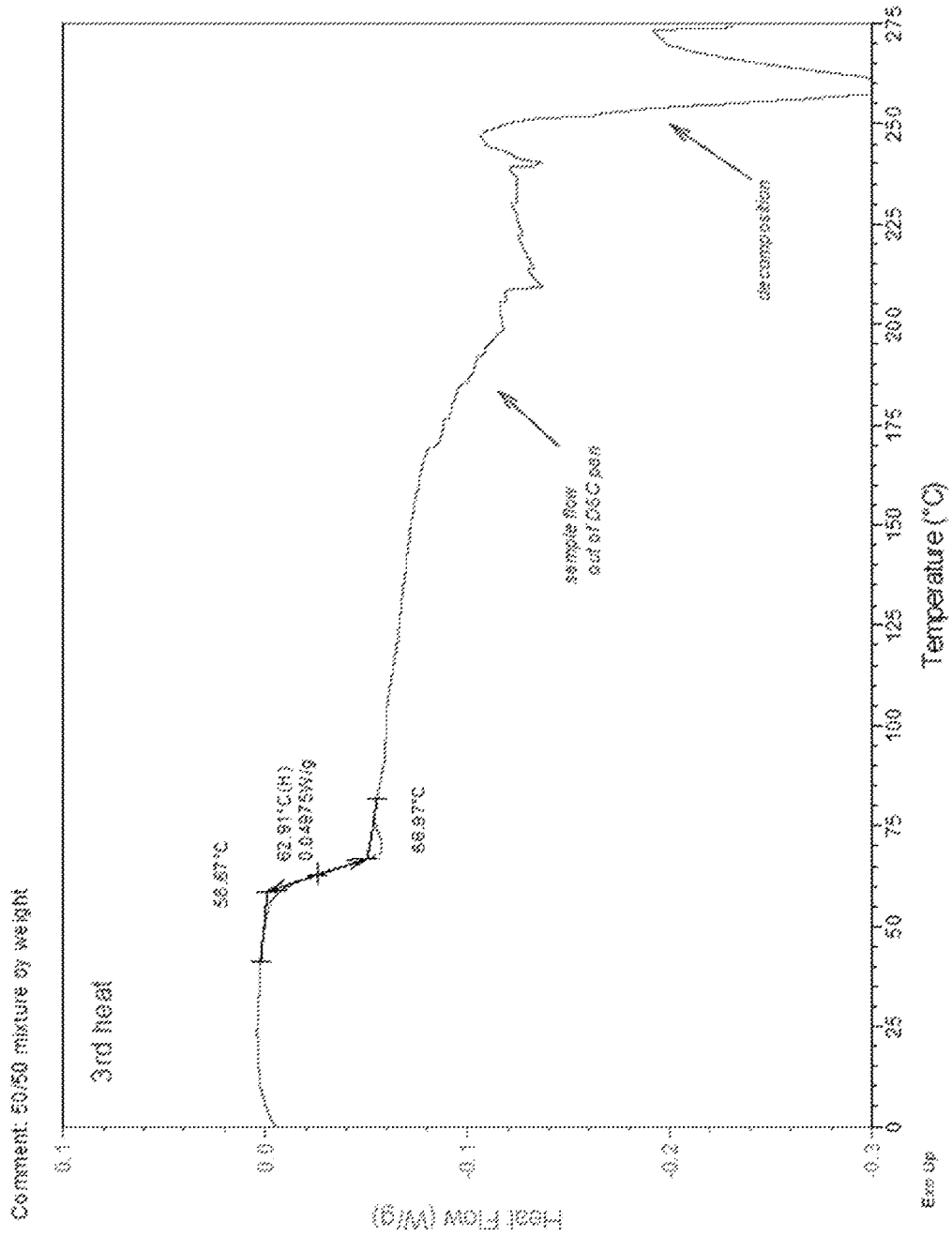
FIG. 6 shows the second DSC heat for 4,4'-Cyclohexylidenebis[N,N-bis(4-methylphenyl)benzenamine], (TAPC)

The DSC results for neat TAPC are shown in Table 4. A $T_m$ is seen on the first heat only. The $T_g$ is measured at 70° C. The same procedure as example 2 was used to assess compatibility. As shown in FIG. 6 and Table 4. Molecular glass mixture example 1 and TAPC are fully compatible at 50/50 Wt/Wt.

It is worthwhile noting that for both examples 3 and 4, both compatible 50/50 mixtures have relatively low $T_g$'s 42° C. and 63° C. respectively. No crystallization was seen even though the two mixtures were exposed to temperature well above their $T_9$'s. This demonstrates that as taught in the art, high glass transition temperature is not required to prevent crystallization, as long as the amorphous material is in thermodynamic equilibrium, what is the amorphous material is truly non-crystallizable. High glass transition temperature is required only for "kinetic glass", that is a non-equilibrium glass with a low crystallization rate below $T_g$.

Additionally, TAPC has a triplet energy of 2.95 electron-Volt (eV) which is higher than the phosphorescent blue emitter iridium(III)bis[(4,6-difluorophenyl)-pyridinato-N,C [sup 2']picolinate(Flrpic), Bis[2-(4,6-difluorophenyl)pyridinato-C$^2$,N](picolinato)iridium(III) (2.65 eV) by 0.3 eV. Thus the noncrystallizable mixture of TAPC and molecular glass mixture example 1 should be a good host for the blue emitter Flrpic. For enhanced thermal stability the Tg of molecular glass mixture 1 can be raised by picking appropriate monofunctional substituents.

TABLE 4

| Binder | Fluorescent Material | % Binder | $T_g$ °C. | Calculated $T_g$ °C. | $T_c$ °C. | $T_m$ °C. |
|---|---|---|---|---|---|---|
| Glass Mixture Example 1 | none | 100% | 59 | | none | none |
| none | TAPC | 0% | 78 | | | 184.8[1] |
| Glass Mixture Example 1 | TAPC | 50% | 63 | 68 | none | none |

[1]Seen at first heat only

Example 5: Compatibility of Coumarinn 6 "C6" and Molecular Glass Mixture Example 1

Figure 7:
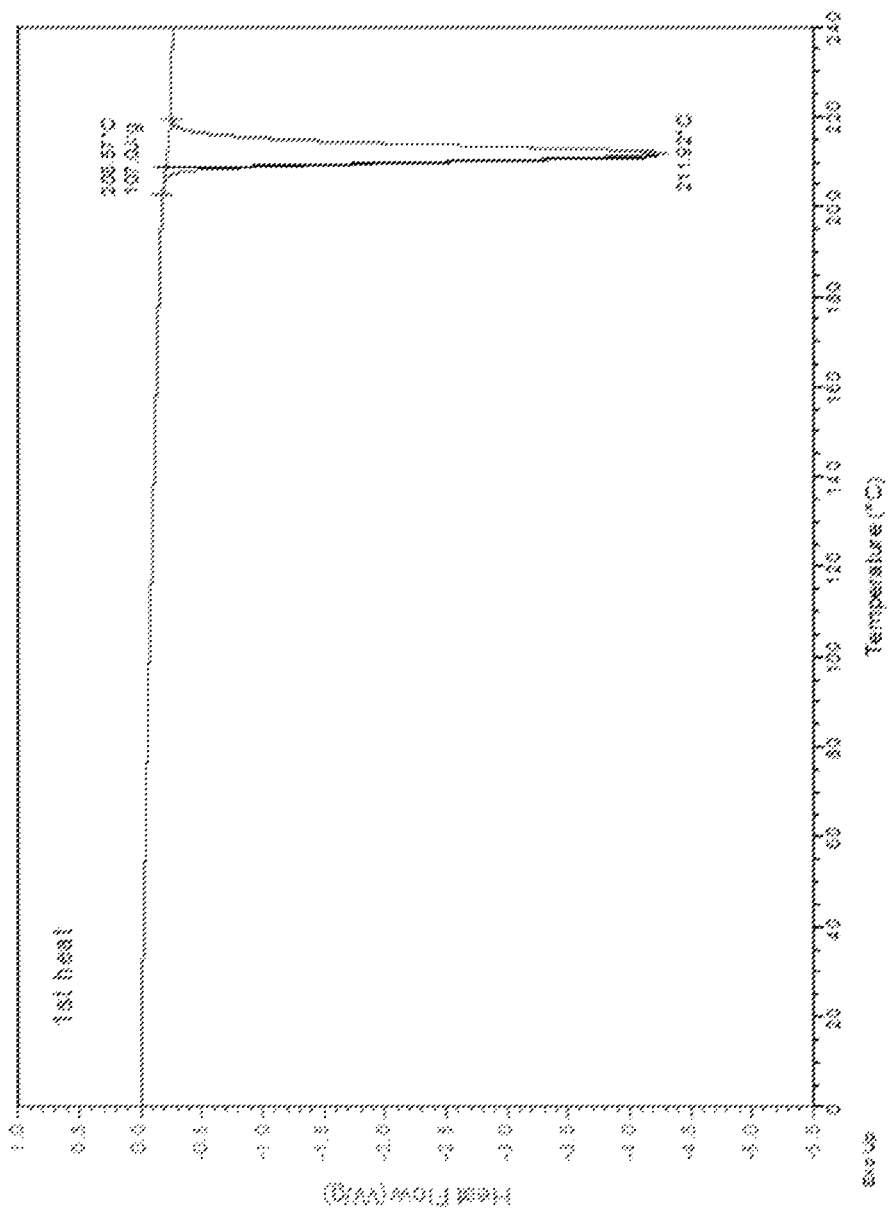
FIG. 7 shows the first DSC heat for Coumarin 6 (C6)
Figure 8:
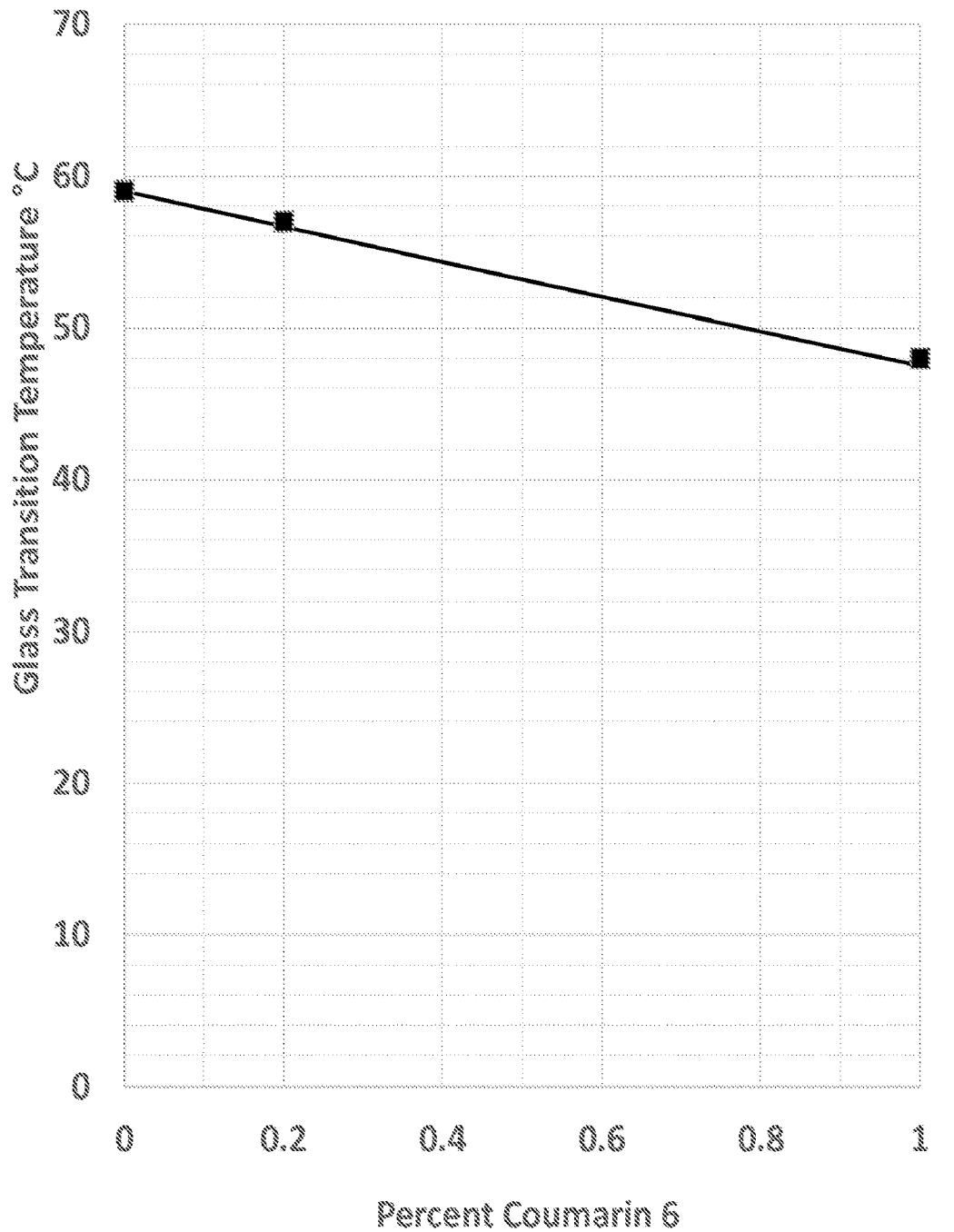
FIG. 8 shows the predicted compatibility curve for Coumarin 6 and Glass Mixture Example 1.

The first DSC heat for neat coumarin 6 is shown in FIG. 7. Only a $T_m$ is seen at 211.9° C. A calculated Tg of 47.5° C. is shown on Table 6 for coumarin 6 from previous mixture studies. Compatibility tests were run at 50/50 and 70/30 Wt/Wt glass mixture example 1/coumarin 6, using the procedure of example 3. The results of Table 5 show that the same Tg at about 57° C. was seen for both mixtures. In both instances, the presence of crystalline coumarin 6 is seen with $T_c$·s and $T_m$s. The common $T_g$ at both conditions suggest the same compatible amorphous composition of glass mixture example 1 and coumarin 6. FIG. 8 shows the predicted compatibility curve for glass mixture example 1 and coumarin six. The $T_9$ 57° C. is predicted at 20 wt percent coumarin 6. Thus glass mixture example 1 and coumarin 6 are fully compatible at 80/20 Wt/Wt composition.

TABLE 5

| Binder | Fluorescent Material | % Binder | $T_g$ °C. | Calculated $T_g$ °C. | $T_c$ °C. | $T_m$ °C. |
|---|---|---|---|---|---|---|
| Binder Mixture Example 1 | none | 100% | 59 | N/A | none | none |
| None | Coumarin 6 | 0% | | 47.5[a] | | 211.9 |
| Binder Mixture Example 1 | Coumarin 6 | 50% | 56.6 | 53 | 113.4 | 186.5 |
| Binder Mixture Example 1 | Coumarin 6 | 70% | 57.4 | 56 | 100.5 | 198.6 |

[a]Estimated from blend studies

Example 6: Compatibility of 2-(4-tert-Butylphenyl)-5-(4-biphenylyl)-1,3,4-oxadiazole, "ButylPBD" and Molecular Glass Mixture Example 2

Compatibility Tests were Run at 50/50 and 60/40 Wt/Wt Glass Mixture Example

Figure 9:
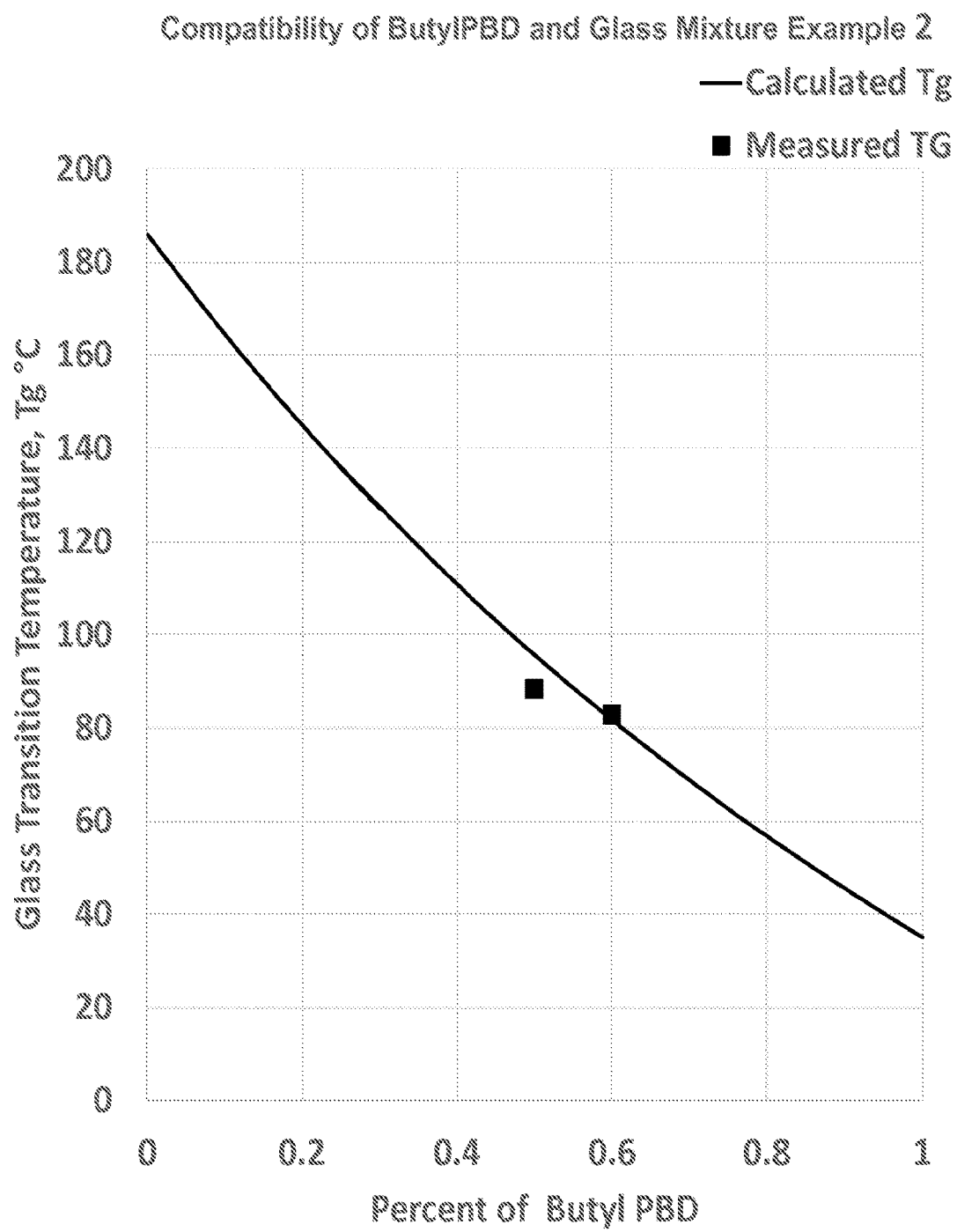
FIG. 9 shows the predicted compatibility curve for ButylPBD and Glass Mixture Example 2.

2/ButylPBD, using the procedure of example 3. Table 6 shows complete compatibility for both compositions with no $T_c$ and no $T_m$ for at all DSC runs (except heat run where the ButylPPD is still in the crystalline phase. FIG. 9 compares the measured $T_g$s and the predicted compatibility curve.

TABLE 6

| Binder | Fluorescent Material | % Binder | $T_g$ °C. | Calculated $T_g$ °C. | $T_c$ °C. | $T_m$ °C. |
|---|---|---|---|---|---|---|
| Binder Mixture Example 2 | none | 100% | 186.3 | N/A | none | none |
| Binder Mixture Example 2 | ButylPBD | 50% | 98.3 | 88.3 | none | none |
| Binder Mixture Example 2 | ButylPBD | 40% | 82.9 | 83 | none | none |

Example 7: Compatibility of Coumarin 6 "C6" and Molecular Glass Mixture Example 2

The compatibility of glass mixture example 2 was tested at 80/20 Wt/Wt composition using the procedure of example 3. The results show on Table 7 complete compatibility at that concentration.

TABLE 7

| Binder | Fluorescent Material | % Binder | $T_g$ °C. | Calculated $T_g$ °C. | $T_c$ °C. | $T_m$ °C. |
|---|---|---|---|---|---|---|
| Binder Mixture Example 2 | none | 100% | 186.3 | N/A | none | none |
| none | Coumarin 6 | 0% | | 47.5<sup>a</sup> | | 211.9 |
| Binder Mixture Example 2 | Coumarin 6 | 80% | 148.5 | 150 | none | none |

<sup>a</sup>Estimated from blend studies

Example 8: Compatibility of N,N'-Di(1-naphthyl)-N,N'-diphenyl-(1,1'-biphenyl)-4,4'-diamine (NPB) and Molecular Glass Mixture Example 2

Figure 2:
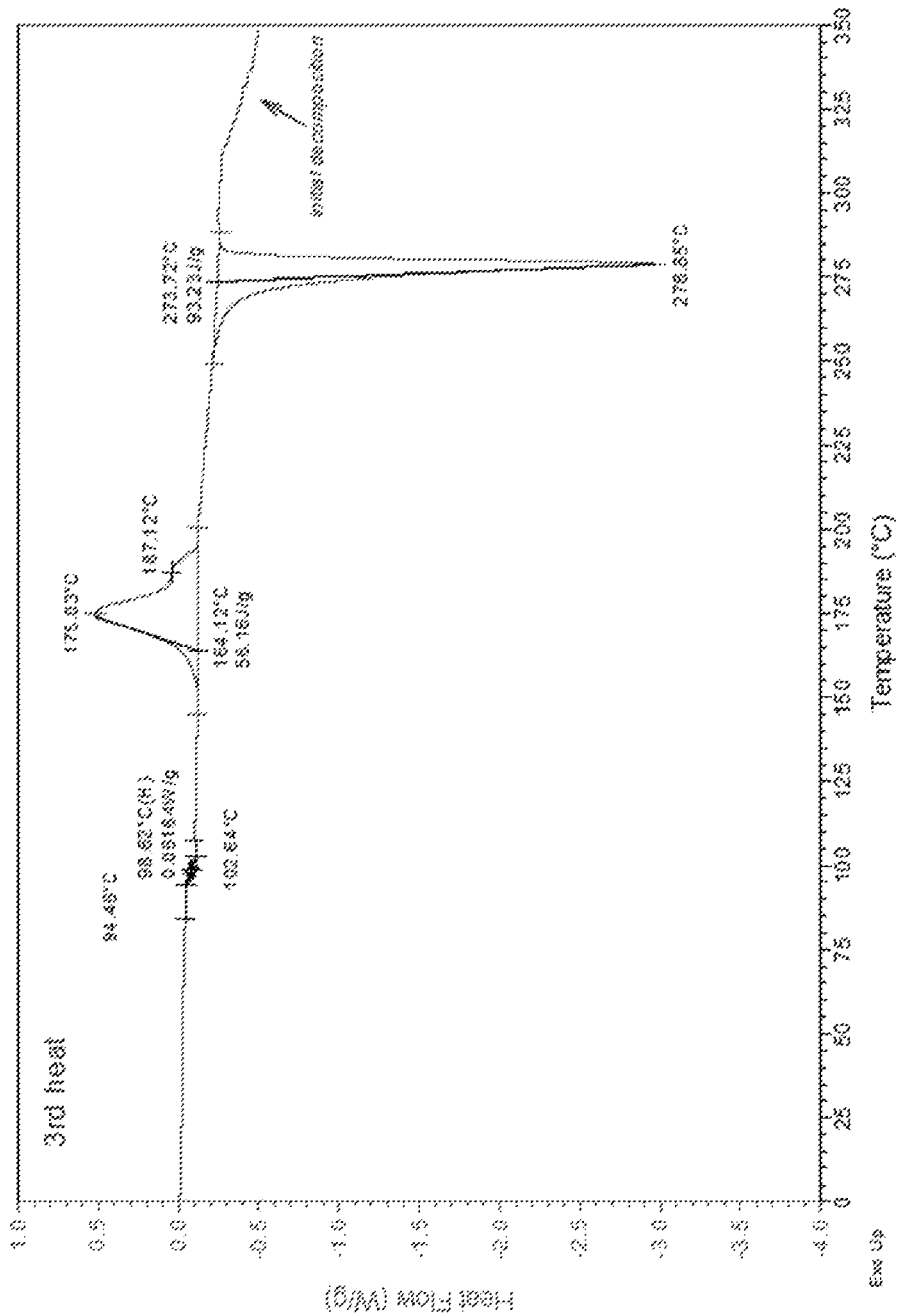
FIG. 2 shows the third DSC heat for neat N,N'-diphenyl-(1,1'-biphenyl)-4,4'-diamine, (NPB)
Figure 3:
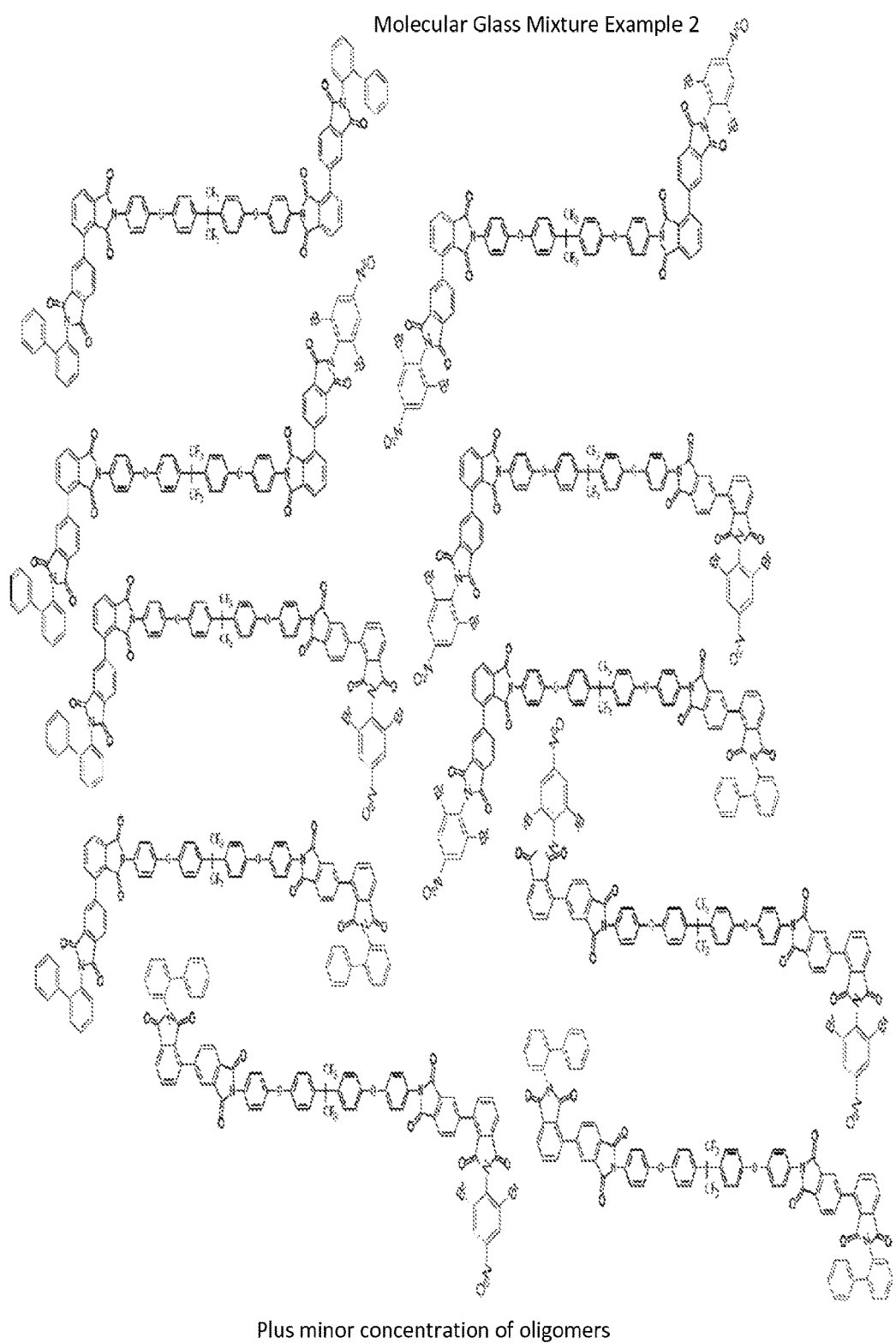
FIG. 3 shows the chemical structures of the components of Molecular Glass Example 2.

The compatibility of glass mixture example 2 was tested at 50/50 Wt/Wt composition using the procedure of example 3. The third DSC heat for the neat NPB is shown in FIG. 2. The results show on Table 8 a $T_g$ at 130.5° C. The calculated Tg for this composition is 137° C.; however crystallization is seen at 222.1° C. and melting at 271° C. Thus the amorphous glass mixture ($T_g$ at 130.5° C.) is a non-equilibrium glass. A mixture containing 20 wt % NPB, 20 wt % Coumarin 6, and 60% binder mixture example 2 shows a $T_g$ at 127.7° C. with no crystallization and no melting at temperatures as high as 350° C. (FIG. 1). In other words the mixture is truly noncrystallizable. Table 8 additionally shows the calculated $T_g$ (106.7° C.) for a mixture containing 20 wt % NPB, 20 wt % Coumarin 6, 20 wt % ButylPBD, and 40% binder mixture example 2. Knowing from Table 6 that ButylPBD is fully compatible with molecular glass mixture example 2 even at 50/50 wt ratio, we can safely predict that NPB/Coumarin 6/ButylPBD/molecular glass mixture example 2 will be fully compatible. Those two examples of Table 8 are truly non-crystallizable compositions of the invention useful for OLED and other organic electronic applications

TABLE 8

| Binder | Fluorescent Material 1 | Fluorescent Material 2 | Fluorescent Material 3 | $T_g$ °C. | Calculated $T_g$ °C. | $T_c$ °C. | $T_m$ °C. |
|---|---|---|---|---|---|---|---|
| Binder Mixture Example 2 | none | none | none | 186.3 | N/A | none | none |
| none | NPB | none | none | 98.7 | N/A | 175 | 278.9 |
| none | none | Coumarin 6 | none | none | 47.5<sup>a</sup> | none | 211.9 |
| Binder Mixture Example 2 | NPB | none | none | 130.5 | 137.3 | 222.1 | 271 |
| Binder Mixture Example 2 (60%) | NPB (20%) | Coumarin 6 (20%) | none | 127.7 | 131.8 | none | none |
| Binder Mixture Example 2 (40%) | NPB (20%) | Coumarin 6 (20%) | ButylPBD (20%) | | 106.7 | none | none |

The invention has been described in detail with particular reference to preferred embodiment thereof, but it will be understood that variations and modifications can be effected within the spirit and scope of the invention.

What is claimed is:
1. A light emitting device comprising:
   a light emitting layer comprising an electroluminescent organic material dispersed in a matrix,
   wherein:
      the electroluminescent organic material has a molecular weight less than about 2000 amu;
      the matrix comprises a non-electroluminescent non-crystallizable molecular glass mixture comprising at least nine (9) distinct molecules, and a transition glass temperature ($T_g$) of from 50° C. to 120° C.;
      each of the non-electroluminescent non-crystallizable molecular glass mixture and the electroluminescent organic material constitutes at least about 20 percent by weight of the light emitting layer; and
   at least two electrodes in electrical communication with the light emitting layer and configured to conduct an electric charge through the light emitting layer such that the light emitting layer emits light.

2. The light emitting device of claim 1, wherein the non-electroluminescent non-crystallizable molecular glass mixture is an homogeneous mixture of at least 9 nonpolymeric, thermoplastic compounds, each compound in the mixture independently conforming to the structure:

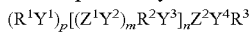

wherein m is zero or one;

n is the number of recurring units in the compound, and is zero up to, but not including, an integer at which said compound starts to become a polymer;

p is an integer of from one to eight;

each $R^1$ and $R^3$ is independently a monovalent aliphatic or cycloaliphatic hydrocarbon group having 1 to 20 carbon atoms, an aromatic group or a multicyclic aromatic nucleus;

$R^2$, $Z^1$ and $Z^2$ each independently represent multivalent aliphatic or cycloaliphatic hydrocarbon groups having 1 to 20 carbon atoms or an aromatic group; and $Y^1$, $Y^2$, $Y^3$ and $Y^4$ each independently represents one or more linking groups such as esters (—COO—), amides (—CONH—), urethanes (—NHCOO—), imides

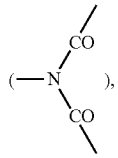

nitrilomethyleneoxys

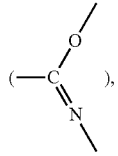

nitrilomethyleneiminos

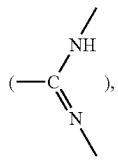

nitrilomethylenethios

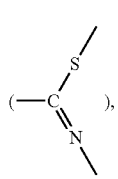

1,3,4-triazol-2,5-ylenes

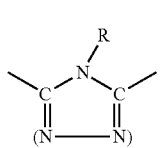

wherein $R^1$ represents alkyl of 1-6 carbon atoms, hydroxyl, amino or aryl such as phenyl and 1,3,4-oxadiazol-2,5-ylenes

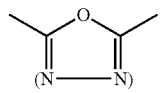

provided that at least one of $R^1$, $Z^1$, $R^2$, $R^3$ and $Z^2$ is an aromatic group.

3. The light emitting device of claim 1, wherein the non-electroluminescent non-crystallizable molecular glass mixture is an homogeneous mixture of at least nine nonpolymeric, thermoplastic compounds, each compound in the mixture independently conforming to the structure:

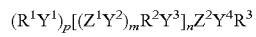

wherein m is zero or one;

n is the number of recurring units in the compound, and is zero up to, but not including, an integer at which said compound starts to become a polymer;

p is an integer of from one to eight;

each $R^1$ and $R^3$ is independently a monovalent aliphatic or cycloaliphatic hydrocarbon group having 1 to 20 carbon atoms, an aromatic group or a multicyclic aromatic nucleus;

$R^2$, $Z^1$ and $Z^2$ each independently represent multivalent aliphatic or cycloaliphatic hydrocarbon groups having 1 to 20 carbon atoms or an aromatic group; and $Y^1$, $Y^2$, $Y^3$ and $Y^4$ each independently represents a triple bond, a double bond, or a single bond link; provided that the glass transition temperature ($T_g$) of the mixture is above 20° C.

4. The light emitting device of claim 1, wherein the non-electroluminescent non-crystallizable molecular glass mixture is an homogeneous mixture of at least ten (10) nonpolymeric, thermoplastic compounds.

5. The light emitting device of claim 1, wherein the non-electroluminescent non-crystallizable molecular glass mixture is an homogeneous mixture of at least fifteen (15) nonpolymeric, thermoplastic compounds.

6. The light emitting device of claim 1, wherein the non-electroluminescent non-crystallizable molecular glass mixture is an homogeneous mixture of at least twenty (20) nonpolymeric, thermoplastic compounds.

7. The light emitting device of claim 1, wherein the non-electroluminescent non-crystallizable molecular glass mixture is an homogeneous mixture of at least forty (40) nonpolymeric, thermoplastic compounds.

8. The light emitting device of claim 1, wherein the non-electroluminescent non-crystallizable molecular glass mixture is an homogeneous mixture of at least sixty four (64) nonpolymeric, thermoplastic compounds.

9. The light emitting device of claim 1, wherein the non-electroluminescent non-crystallizable molecular glass mixture is crosslinkable, polymerizable, or crosslinkable and polymerizable.

10. The light emitting device of claim 1, wherein the light emitter is fluorescent.

11. The light emitting device of claim 1, wherein the light emitter is phosphorescent.

12. The light emitting device of claim 1, wherein the light emitter is thermally activated delayed fluorescent (TADF).

13. The light emitting device of claim 1, wherein the electroluminescent material is chosen from the group consisting of coumarin 6, coumarin 334, coumarin 343, Rhodamine 6G, Rhodamine 6G, Alq3, TAPC, NPB, TPD, PBD, ButylPBD, TBBi, and BCP, 9,10-di(2-naphthyl)anthracene.

14. The light emitting device of claim 1, wherein the non-electroluminescent non-crystallizable molecular glass mixture is chosen from the group consisting of Glass Mixture 1, Glass Mixture 2, Glass Mixture 3, Glass Mixture 4, Glass Mixture 5, Glass Mixture 6, Glass Mixture 7, Glass Mixture 8, Glass Mixture 8, Glass Mixture 10, Glass Mixture Example 1, and Glass Mixture Example 2.

15. The light emitting device of claim 1, wherein the fabrication process is solution based.

16. The light emitting device of claim 1, wherein the fabrication process is roll to roll coating.

17. The light emitting device of claim 1, wherein the fabrication process is inkjet printing.

18. A light emitting device comprising:
a light emitting layer comprising an electroluminescent organic material dispersed in a matrix and at least two electrodes in electrical communication with the light emitting layer and configured to conduct an electric charge through the light emitting layer such that the light emitting layer emits light;
wherein
each of the non-electroluminescent non-crystallizable molecular glass mixture and the electroluminescent organic material constitutes at least about 20 percent by weight of the light emitting layer;
the electroluminescent organic material has a molecular weight less than about 2000 amu; and
the matrix comprises a non-electroluminescent non-crystallizable molecular glass mixture chosen from the group consisting of:

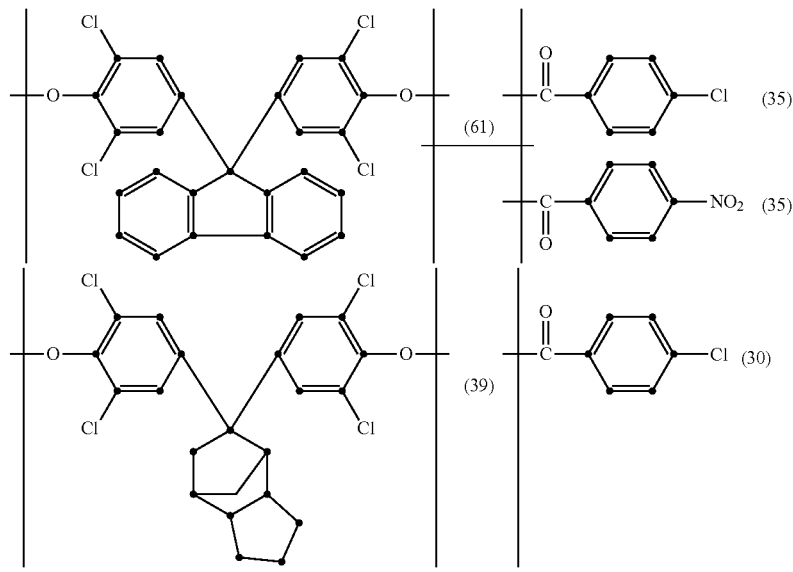

$T_g$ 101° C. (20°/min by DSC)

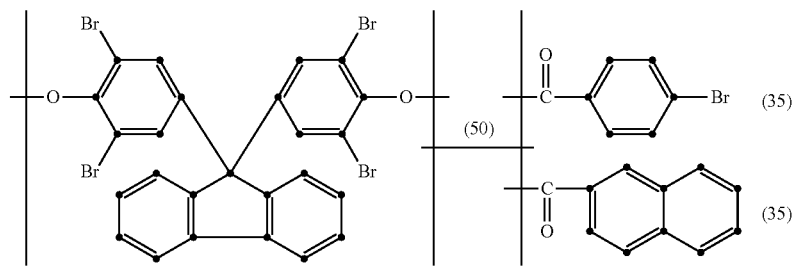

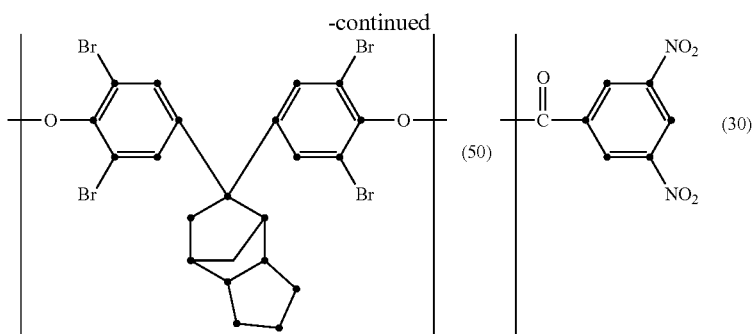
$T_g$ 128° C. (20°/min by DSC)
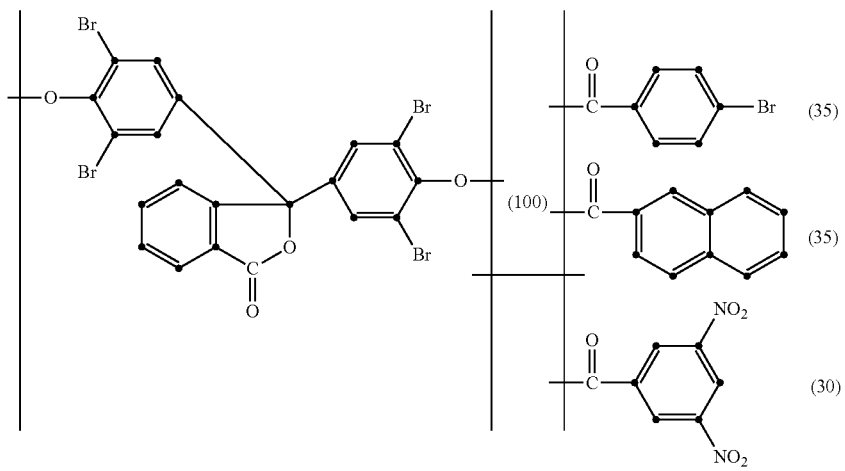
$T_g$ 138° C. (20°/min by DSC)
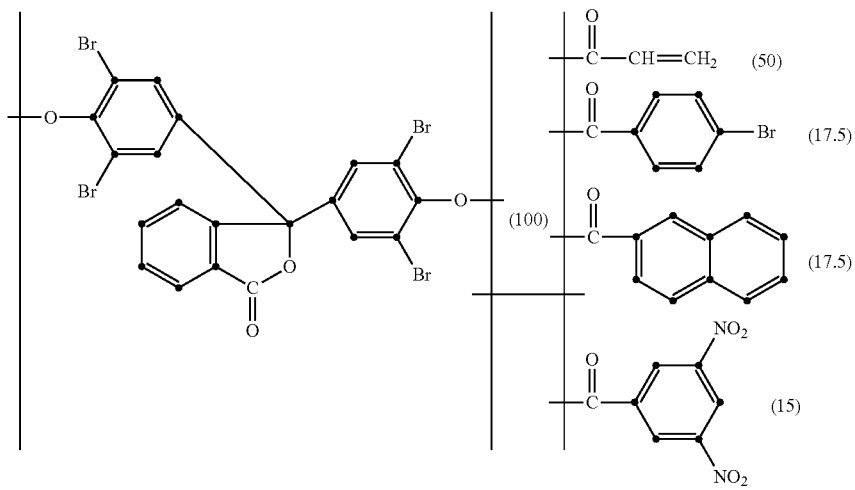
$T_g$ 115° C. (20°/min by DSC)

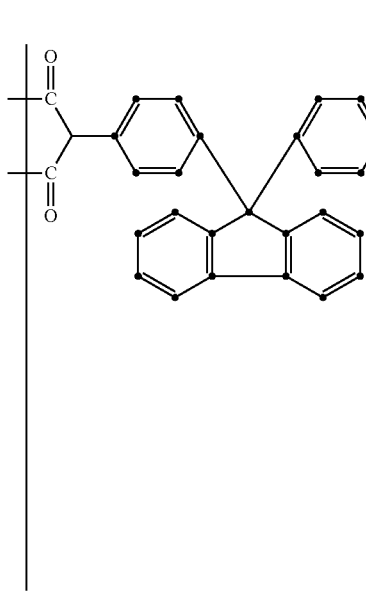
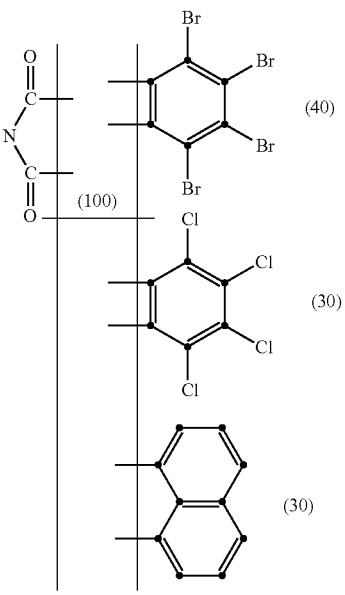
$T_g$ 190° C. (20°/min by DSC)
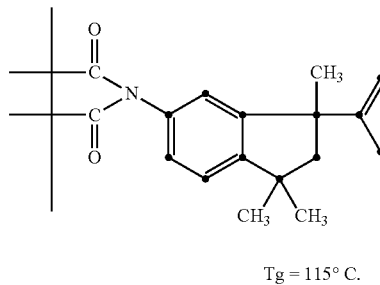
Tg = 115° C.
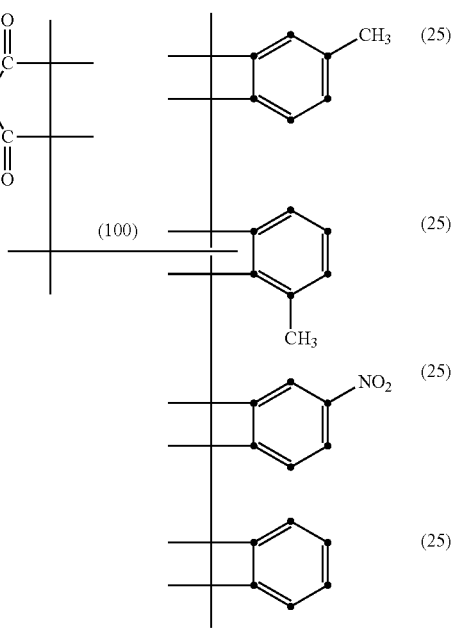

-continued
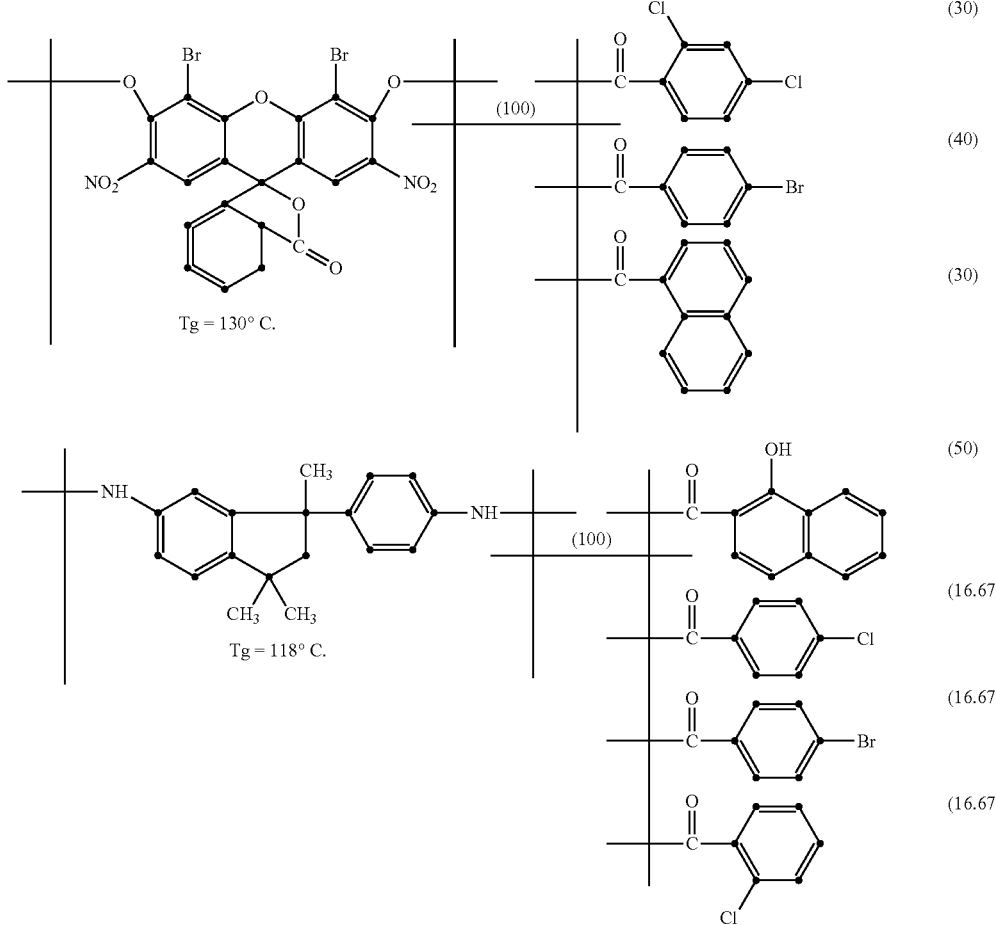
$T_g$ 128° C. (20°/min by DSC)
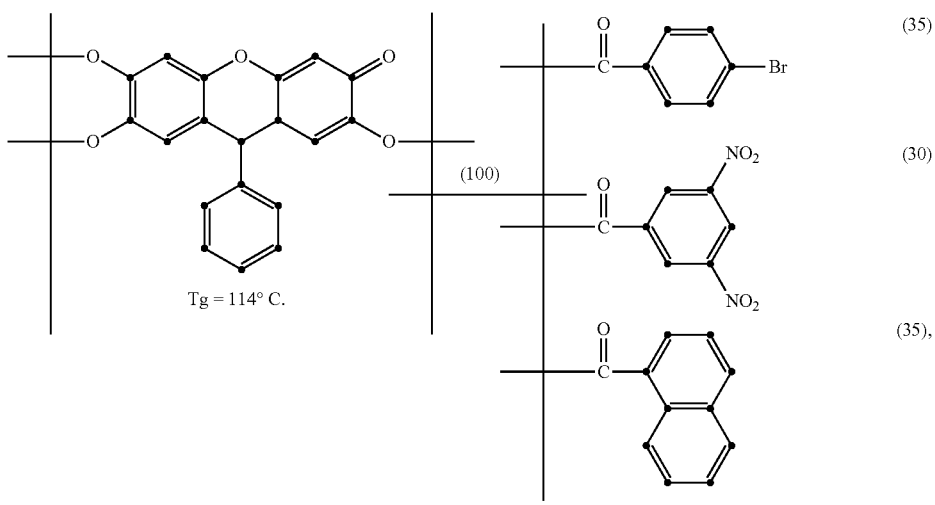

-continued
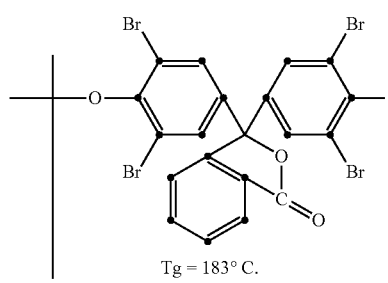
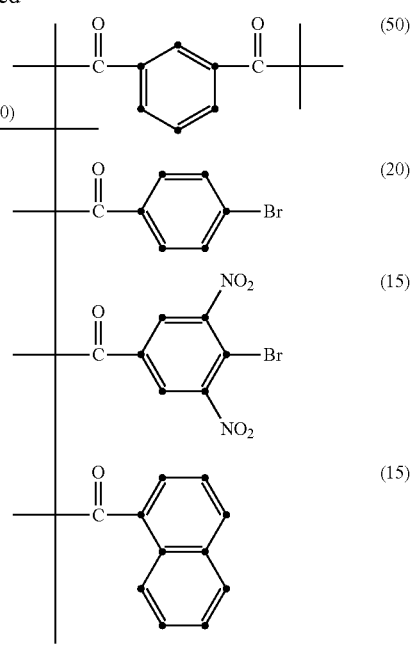
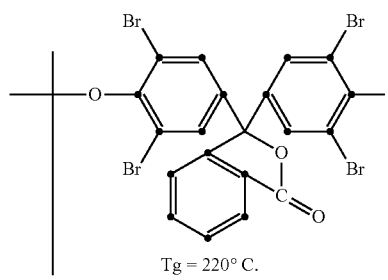
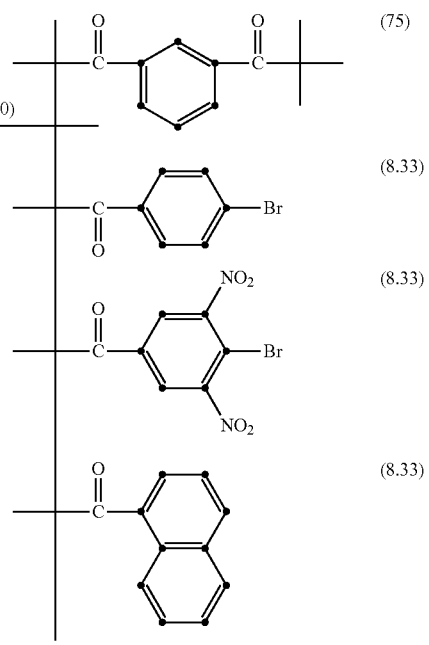

-continued
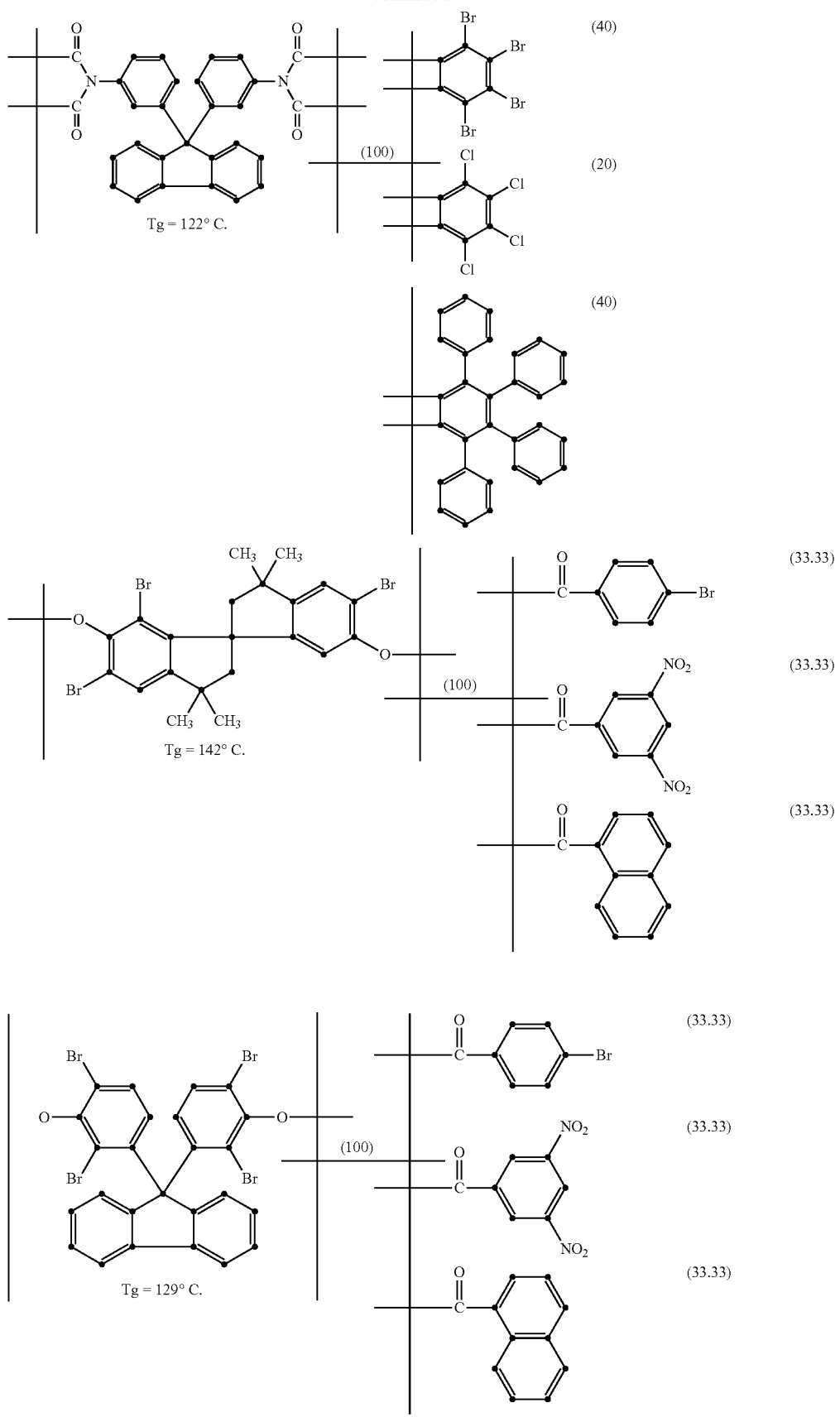

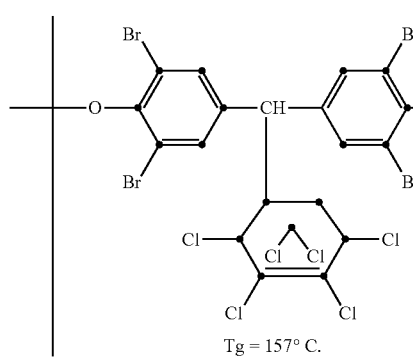
Tg = 157° C.
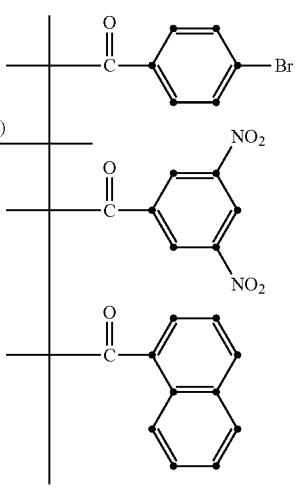
(33.33)
(33.33)
(33.33)
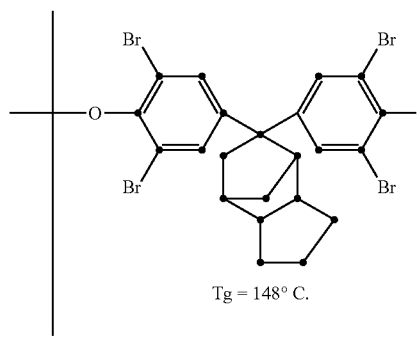
Tg = 148° C.
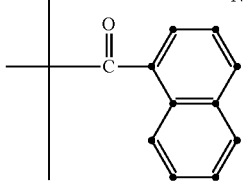
(33.33)
(33.33)
(33.33)
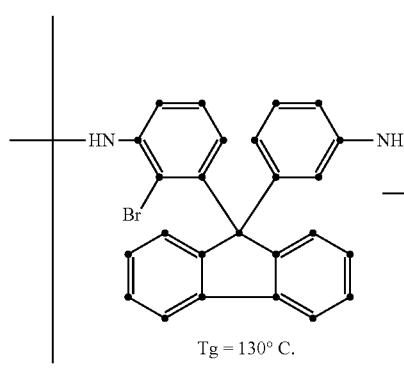
Tg = 130° C.
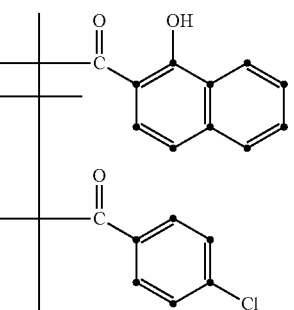
(50)
(16.67) and -continued
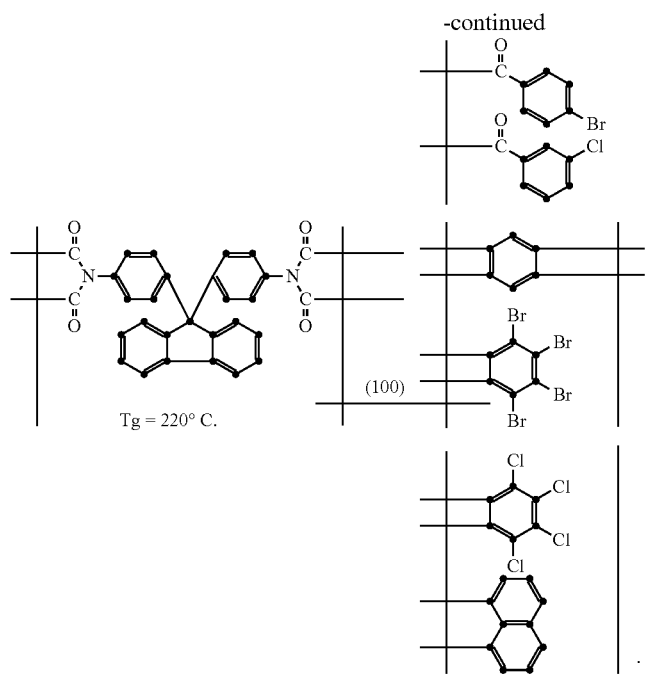
* * * * *